US011815475B2

(12) United States Patent
Fujita et al.

(10) Patent No.: US 11,815,475 B2
(45) Date of Patent: Nov. 14, 2023

(54) METHOD FOR IDENTIFYING MOLECULAR STRUCTURE

(71) Applicant: THE UNIVERSITY OF TOKYO, Tokyo (JP)

(72) Inventors: Makoto Fujita, Tokyo (JP); Daishi Fujita, Tokyo (JP); Yuya Domoto, Tokyo (JP); Hiroki Takezawa, Tokyo (JP)

(73) Assignee: THE UNIVERSITY OF TOKYO, Tokyo (JP)

( * ) Notice: Subject to any disclaimer, the term of this patent is extended or adjusted under 35 U.S.C. 154(b) by 897 days.

(21) Appl. No.: 16/490,710

(22) PCT Filed: Feb. 28, 2018

(86) PCT No.: PCT/JP2018/007550
§ 371 (c)(1),
(2) Date: Nov. 20, 2019

(87) PCT Pub. No.: WO2018/159692
PCT Pub. Date: Sep. 7, 2018

(65) Prior Publication Data
US 2020/0096461 A1 Mar. 26, 2020

(30) Foreign Application Priority Data
Mar. 1, 2017 (JP) ................... 2017-038739

(51) Int. Cl.
*G01N 23/20* (2018.01)
*G01N 23/205* (2018.01)
(Continued)

(52) U.S. Cl.
CPC .......... *G01N 23/2055* (2013.01); *C30B 7/04* (2013.01); *C40B 30/10* (2013.01); *C40B 40/16* (2013.01);
(Continued)

(58) Field of Classification Search
CPC ............ G01N 23/20; G01N 23/20091; G01N 23/201; G01N 23/202; G01N 23/203;
(Continued)

(56) References Cited

U.S. PATENT DOCUMENTS 7,372,941 B2 * 5/2008 Ivanisevic .......... G01N 23/2055
378/70
8,105,553 B2 * 1/2012 Grossman ............... C30B 29/58
422/50

(Continued)

FOREIGN PATENT DOCUMENTS

EP 1 666 646 A1 6/2006
EP 3269849 A1 1/2018
(Continued)

OTHER PUBLICATIONS

Fujita et al., "Self-assembly of ten molecules into nanometre-sized organic host frameworks," Nature, vol. 378, Nov. 30, 1995, pp. 469-471, cited in the specification.
(Continued)

*Primary Examiner* — Allen C. Ho
(74) *Attorney, Agent, or Firm* — WHDA, LLP

(57) ABSTRACT

The present invention provides a novel method for identifying a molecular structure by a single crystal X-ray analysis. A single crystal that gives an X-ray diffraction spectrum sufficient for determining a structure of a molecule can be efficiently obtained by including a test molecule in a metal complex, and then crystallizing the test-molecule included in the metal complex. By analyzing this single crystal by an X-ray analysis, it is possible to determine a structure of the test molecule without obtaining a single crystal of the test molecule. With the novel method according to the present invention, the structure of a test molecule in a trace amount of a sample can also be determined.

20 Claims, 33 Drawing Sheets

Cortisone acetate.

(51) Int. Cl.
　　　*G01N 23/2055* (2018.01)
　　　*G01N 23/207* (2018.01)
　　　*G01N 23/20008* (2018.01)
　　　*C30B 7/04* (2006.01)
　　　*C40B 30/10* (2006.01)
　　　*C40B 50/08* (2006.01)
　　　*C40B 40/16* (2006.01)
　　　*G01N 23/20091* (2018.01)

(52) U.S. Cl.
　　　CPC ............ *C40B 50/08* (2013.01); *G01N 23/20* (2013.01); *G01N 23/205* (2013.01); *G01N 23/207* (2013.01); *G01N 23/20008* (2013.01); *G01N 23/2073* (2013.01); *G01N 23/20091* (2013.01); *G01N 2223/056* (2013.01); *G01N 2223/106* (2013.01); *G01N 2223/1016* (2013.01); *G01N 2223/602* (2013.01)

(58) Field of Classification Search
　　　CPC ............ G01N 23/204; G01N 23/205; G01N 23/2055; G01N 23/207; G01N 23/2073
　　　USPC ..................................................... 378/70–78
　　　See application file for complete search history.

(56) References Cited

U.S. PATENT DOCUMENTS

| | | | | |
|---|---|---|---|---|
| 8,367,412 | B2* | 2/2013 | Yamaguchi | B01D 9/0077 436/87 |
| 10,190,952 | B2* | 1/2019 | Fujita | G01N 1/28 |
| 10,309,035 | B2* | 6/2019 | Fujita | C30B 29/54 |
| 10,487,420 | B2* | 11/2019 | Fujita | G01N 21/21 |
| 10,618,920 | B2* | 4/2020 | Chen | C07F 7/1804 |
| 2005/0214173 | A1 | 9/2005 | Facer et al. | |
| 2008/0119642 | A1 | 5/2008 | Hall | |
| 2010/0095749 | A1 | 4/2010 | Yamaguchi et al. | |
| 2015/0219533 | A1 | 8/2015 | Fujita et al. | |
| 2017/0016138 | A1 | 1/2017 | Fujita et al. | |

FOREIGN PATENT DOCUMENTS

| | | |
|---|---|---|
| JP | 4317919 B2 | 8/2009 |
| JP | 2016-160256 A | 9/2016 |
| JP | 2017-36919 A | 2/2017 |
| JP | 2017-83172 A | 5/2017 |
| WO | 2005/116608 A1 | 12/2005 |
| WO | 2008/141183 A2 | 11/2008 |
| WO | 2014/038220 A1 | 3/2014 |
| WO | 2015/137246 A1 | 9/2015 |
| WO | 2015/137288 A1 | 9/2015 |
| WO | 2016/143872 A1 | 9/2016 |

OTHER PUBLICATIONS

International Search Report dated May 29, 2018, issued in counterpart International Application No. PCT/JP2018/007550 (2 pages).
Extended Search Report dated Feb. 8, 2021, issued in counterpart EP Application No. 18760809.6 (11 pages).
Carter, Charles W. et al., "Statistical Design of Experiments for Protein Crystal Growth and the Use of a Precrystallization Assay", Journal of Crystal Growth, vol. 90, No. 1, Jul. 1988, pp. 60-73; Cited in EESR dated Feb. 8, 2021.
Nokuma, Yasuhide et al., "Preparation and guest-uptake protocol for a porous complex useful for 'crystal-free' crystallography", Nature Protocols, vol. 9, No. 2, Jan. 9, 2014, pp. 246-252; Cited in EESR dated Feb. 8, 2021.
Inokuma, Yasuhide et al., "X-ray analysis on the nanogram to microgram scale using porous complexes", Nature, vol. 495, Mar. 28, 2013, pp. 461-466; Cited in EESR dated Feb. 8, 2021.
Fujita et al., "Self-assembly of ten molecules into nanometer-sized organic host frameworks," Nature, vol. 378, Nov. 30, 1995, pp. 469-471, cited in the specification.
Fujita et al., "Self-Assembly of Nanometer_Sized Macrotricyclic Complexes from Ten Small Component Molecules," Angew. Chem. Int. Ed. 37, No. 15, 1998, pp. 2082-2085, cited in the specification.
Yoshizawa et al., "Side chain-directed assembly of triangular molecular panels into a tetrahedron vs. open cone," Chem. Commun. 2003, pp. 1808-1809, cited in the specification.
Fujita et al., "A Porphyrin Prism: Structural Switching Triggered Guest Inclusion," Angew, Chem , Int. Ed., 40, No. 9, 2001 pp. 1718-1721, ciited in the specification.
Yoshizawa et al., "Discrete Stacking of Large Aromatic Molecules within Organic-Pillared Coordination Cages," Angew. Chem, 117, 2005, pp. 117, 1844-1847, cited in the specification.
Toshiro et al., "PdII-Directed Dynamic Assembly of a Dodecapyridine Ligand into End-Capped and Open Tubes: The Importance of Kinetic Control in Self-Assembly," Anger. Chem. Int. Ed., 42, 2003, pp. 3267-3270, cited in the specification.
Yamaguchi et al., "A 3.5-nm Coordination Nanotube," J. Am. Chem. Soc., 126, 2004, pp. 10818-10819, cited in the specification.
Aoyagi et al., "Quantitative Formation of Coordination Nanotubes Templated by Rodlike Guesta," J, Am. Chem. Soc. 121, 1991 pp. 7457-7458, cited in the specification.
Kumazawa et al., "A Palladium (II)-Clipped Aromatic Sandwich," Angew. Chem. Int. Ed. 43, 2004, pp. 5936-5940, cited in the specification.
International Preliminary Report on Patentability (Chapter I) dated Sep. 12, 2019, issued in International Application No. PCT/JP2018/007550.
English Translation of Written Opinion of the International Searching Authority dated May 29, 2018, issued in International Application No. PCT/JP2018/007550.

* cited by examiner

[Fig.1]
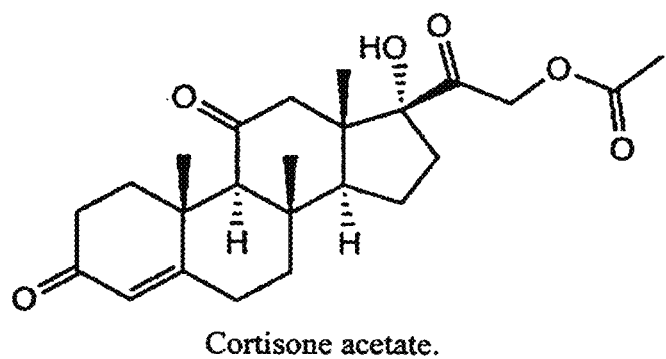
Cortisone acetate.
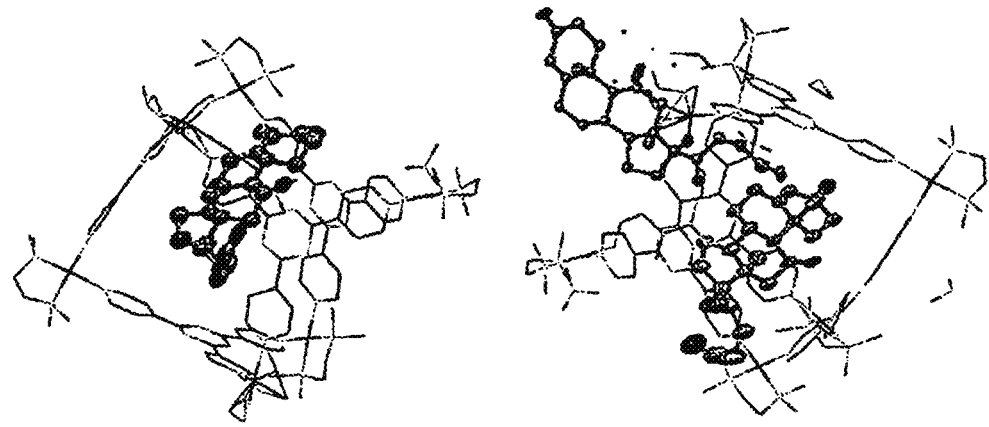

[Fig.2]
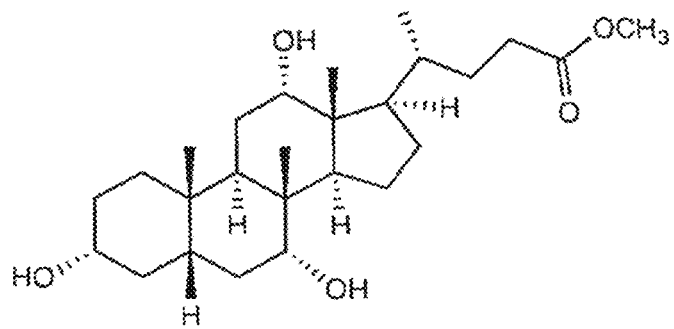
Methyl cholate
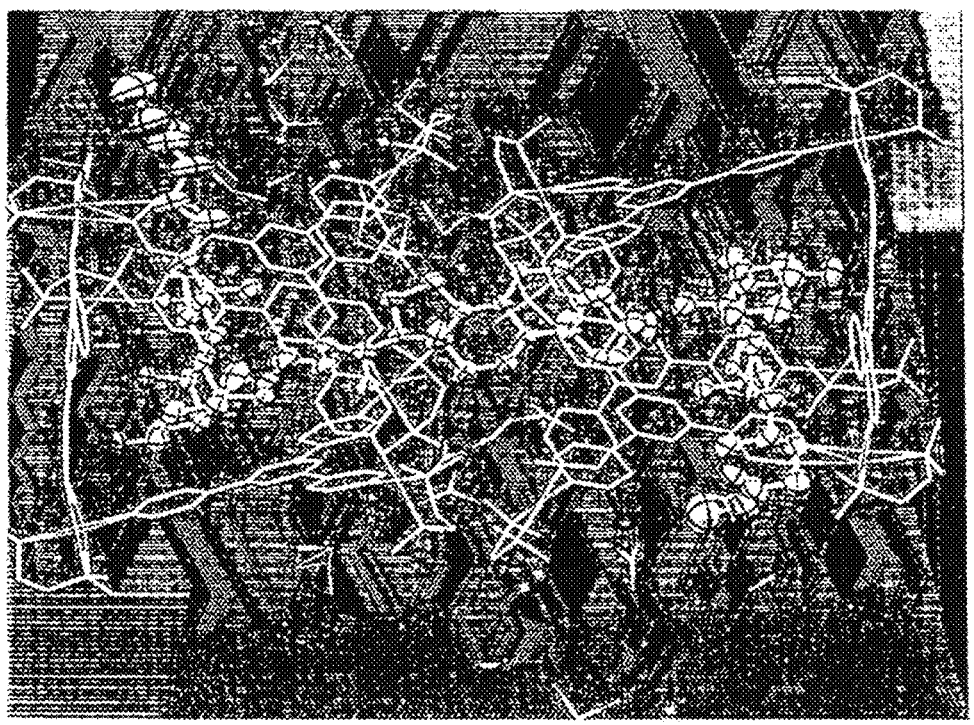

Figure 5
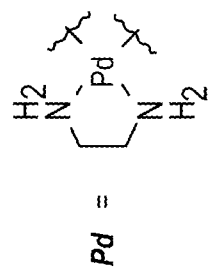
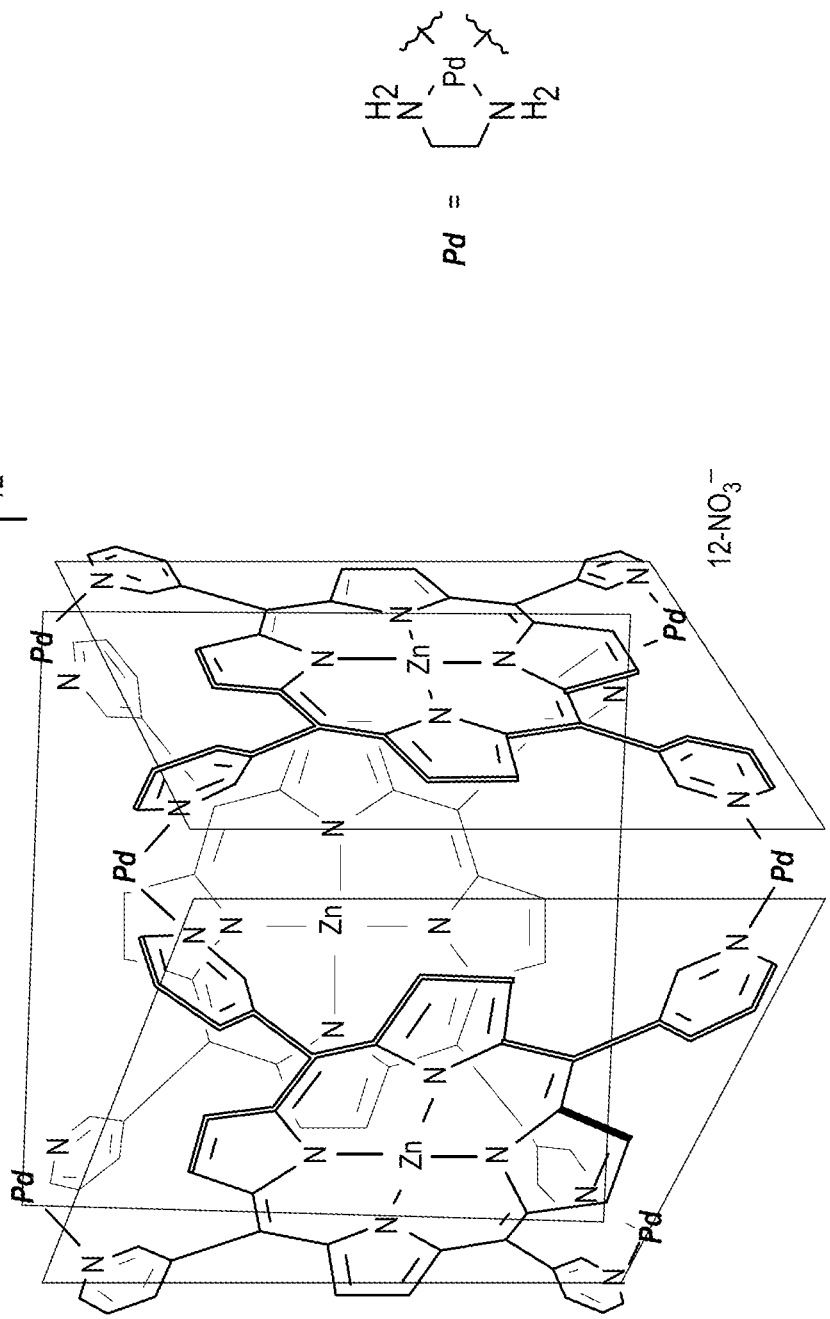
Porphyrin prism-type metal complex

Pillar-type metal complex

Quadruple arm (monomer)-type metal complex

Quadruple arm (dimer)-type metal complex

Tube-type metal complex (palladium)

Sandwich (monomer)-type metal complex

Sandwich (dimer)-type metal complex

Octahedral metal complex

Bowl-type metal complex

Open cone-type metal complex

Triangular pyramid-type metal complex

Porphyrin prism-type metal complex

Quadruple arm (monomer)-type metal complex

Quadruple arm (dimer)-type metal complex

Tube-type metal complex

Sandwich (monomer)-type metal complex

Sandwich (dimer)-type metal complex

Octahedral metal complex

Porphyrin prism-type metal complex

Bowl-type metal complex

Figure 29
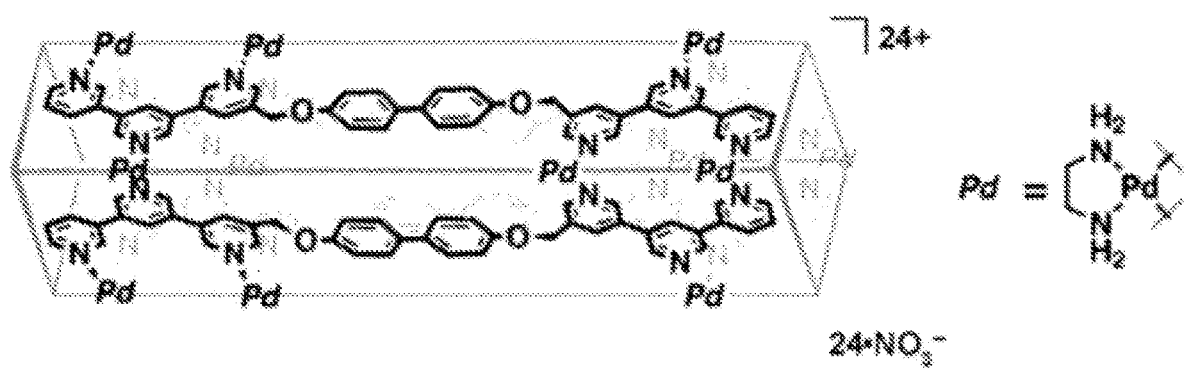
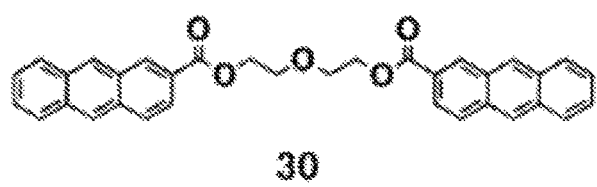
30

Octahedral metal complex

METHOD FOR IDENTIFYING MOLECULAR STRUCTURE

TECHNICAL FIELD

The present invention relates to a method for identifying molecular structure by single crystal X-ray analysis.

BACKGROUND ART

Elemental analysis, mass spectrometry, nuclear magnetic resonance (NMR), powder X-ray analysis, and so on are used as methods for identifying molecular structure; however, structural determination by these methods involves repeated trials and errors and thus requires larger amounts of samples and longer analysis time, and the methods may fail in structural determination for some structures of compounds. Single crystal X-ray analysis allows more direct structural determination than those analysis methods. Since various factors (e.g., solvent, temperature, and concentrations) affect crystallization of molecules, however, it is difficult to predict suitable crystallization conditions. And completely different examinations on crystallization conditions are generally needed for different molecules.

In view of such circumstances, the present inventors developed what is called a crystalline sponge method and reported it previously (Patent Literature 1). With the crystalline sponge method, an X-ray diffraction spectrum can be acquired, without crystallizing a molecule by allowing the molecule to permeate into a single crystal of a metal complex formed in advance.

CITATION LIST

Patent Literature

Patent Literature 1: International Publication No. WO 2014/038220

SUMMARY OF INVENTION

Advantageous Effects of Invention

According to the present invention, X-ray analysis of a test molecule that is difficult to crystallize can be performed conveniently and efficiently.

Solution to Problem

The present inventors have found that crystallization of a molecule included in advance in a metal complex, in contrast to the crystalline sponge method, can efficiently provide single crystals of a molecular-including metal complex that give X-ray diffraction spectra enough for structural determination of the molecule, thus completing the present invention.

The present invention provides, for example, the following items.

(Item 1)

A method for structural analysis of a test molecule with an X-ray or a neutron beam, the method comprising the steps of:

(A) mixing together a sample containing the test molecule and a metal complex capable of including the test molecule to generate a test molecule-metal complex inclusion compound;

(B) dispensing an inclusion solution containing the inclusion compound to prepare a plurality of independent crystallization solutions at least including a first crystallization solution and a second crystallization solution;

(C) generating a plurality of crystals in the plurality of independent crystallization solutions under similar or different crystallization conditions;

(D) screening the plurality of crystals generated in the step (C) to select a targeted crystal;

(E) irradiating the targeted crystal with an X-ray or a neutron beam to acquire diffraction data; and (F) analyzing the diffraction data to determine the structure of the test molecule.

(Item 2)

A method for structural analysis of a test molecule with an X-ray or a neutron beam, the method comprising the steps of:

(A) mixing together a sample containing the test molecule and an insertion molecule and a metal complex capable of including the test molecule to generate a test molecule/insertion molecule-metal complex inclusion compound;

(B) generating a crystal in a crystallization solution containing the inclusion compound;

(C) irradiating the crystal with an X-ray or a neutron beam to acquire diffraction data; and (D) analyzing the diffraction data to determine the structure of the test molecule, wherein the insertion molecule is a molecule capable of being included in the metal complex by itself, and the chemical structure of the test molecule is unchanged through the steps (A) to (D).

(Item 3)

The method according to item 1 or 2, wherein the volumes of the first crystallization solution and the second crystallization solution are each 100 nL to 10 μL.

(Item 4)

The method according to item 1 or 2, wherein the volumes of the first crystallization solution and the second crystallization solution are each 200 nL to 2 μL.

(Item 5)

The method according to any one of items 1 to 4, wherein the weight of the test molecule contained in the sample in the step (A) is 1 ng to 1 mg.

(Item 6)

The method according to item 5, wherein the weight of the test molecule contained in the sample in the step (A) is 5 ng to 1 mg.

(Item 7)

The method according to item 1 or 2, wherein the screening is automatically performed.

(Item 8)

The method according to any one of items 1 to 7, further comprising a step of preparing the metal complex by contacting a metal molecule with a ligand to prepare the metal complex.

(Item 9)

The method according to any one of items 1 to 8, further comprising adjusting the evaporation rate of the crystallization solution in the step (B).

(Item 10)

The method according to item 9, wherein the adjusting is performed through a vapor transport method.

(Item 11)

The method according to any one of items 1 to 10, wherein the metal complex has a hydrophilic moiety.

(Item 12)
The method according to any one of items 1 to 11, wherein the test molecule has a hydrophilic moiety.
(Item 13)
The method according to any one of items 1 to 12, wherein a solvent of each of the crystallization solutions is an aqueous solvent.
(Item 14)
The method according to any one of items 1 to 13, wherein at least a partial structure of the structure of the test molecule is unknown or uncertain, and at least a partial structure in the at least partial structure is determined.
(Item 14-1)
The method according to any one of items 1 to 14, wherein in the step (A), a sample containing the test molecule and an insertion molecule and a metal complex capable of including the test molecule are mixed together to generate a test molecule/insertion molecule-metal complex inclusion compound.
(Item 14-2)
The method according to item 14-1, wherein in the step (A), change in color of a solution containing a mixture of the test molecule, the insertion molecule, and the metal complex is used as an index of generation of the inclusion compound.
(Item 15)
A kit for structural analysis of a test molecule with an X-ray or a neutron beam, the kit comprising:
  a metal complex capable of including the test molecule; and
  a crystallization solvent.
(Item 16)
A kit for determining the chemical structure of a test molecule with an X-ray or a neutron beam, the kit comprising:
  a metal molecule;
  a ligand capable of forming a metal complex with the metal molecule; and
  a crystallization solvent,
wherein the metal complex is capable of including the test molecule.
(Item 17)
The kit according to item 15 or 16, wherein the crystallization solvent is an aqueous solvent.
(Item 18)
The kit according to any one of items 15 to 17, wherein the metal complex has a hydrophilic moiety.
(Item 18-1)
The kit according to any one of the preceding items, comprising at least two types of metal complexes.
(Item 18-2)
The kit according to any one of the preceding items, further comprising an insertion molecule.
(Item 18-3)
The kit according to any one of the preceding items, comprising at least two types of insertion molecules.
(Item 18-4)
The kit according to any one of the preceding items, comprising a first crystallization solvent containing the metal complex or metal complexes dissolved therein and a second crystallization solvent containing the metal complex or metal complexes in a concentration or concentrations different from that or those in the first crystallization solvent.
(Item 19)
A composition for structural analysis of a test molecule with an X-ray or a neutron beam, the composition comprising a metal complex, wherein the metal complex is capable of including the test molecule and has a hydrophilic moiety.

(Item 20)
A system for structural analysis of a test molecule with an X-ray or a neutron beam, the system comprising:
  (a) a region for contacting the test molecule with a metal complex to generate a test molecule-metal complex inclusion compound;
  (b) a unit for dispensing the inclusion compound to generate crystallization solutions each containing the inclusion compound;
  (c) an evaporation rate adjustment unit for adjusting the evaporation rate of the crystallization solutions; and
  (d) an X-ray or neutron beam source.
(Item 21)
A system for generating a crystal for structural analysis of a test molecule with an X-ray or a neutron beam, the system comprising:
  (a) a region for contacting the test molecule with a metal complex to generate a test molecule-metal complex inclusion compound;
  (b) a unit for dispensing the inclusion compound to generate crystallization solutions each containing the inclusion compound; and
  (c) an evaporation rate adjustment unit for adjusting the evaporation rate of the crystallization solutions.

BRIEF DESCRIPTION OF DRAWINGS

FIG. 1 shows the structural formula of cortisone acetate, and results of structural analysis of cortisone acetate in Example 3.
FIG. 2 shows the structural formula of methyl cholate, and results of structural analysis of methyl cholate in Example 4.
FIG. 5 shows an embodiment of a metal complex $[M_6L_3]$.

FIG. 29 shows a [M$_{12}$L$_4$] (double arm ligand dimer nanotube-type) metal complex).

DESCRIPTION OF EMBODIMENTS

Hereinafter, the present invention will be described by using exemplary Examples with reference to the appended drawings, as necessary. It should be understood that throughout the present specification, expression in the singular form includes the concept of the plural form, unless otherwise stated; and that terms used herein each have the meaning commonly used in the art. Accordingly, every technical term and engineering and scientific term used herein has the same meaning as those skilled in the art to which the present invention belongs commonly understand, unless otherwise defined. If any contradiction occurs, priority is given to the present specification (including definitions).

Definitions

As used herein, "structural determination" refers to identifying at least part of the structure of a molecule.

As used herein, a "molecule" refers not only to an atomic group linked together as a series via covalent bonds, but to an atomic group integrated via any interaction such as coordinate bonds, ion bonds, and intermolecular forces. Thus, the term "molecule" encompasses salts, complexes, protein complexes, and so on. The "structure" of a molecule encompasses the "three-dimensional structure" of a molecule and the "chemical structure" of a molecule. The "test molecule" herein refers to a molecule that is a target for the structural analysis of the present invention.

The "three-dimensional structure" of a molecule refers to structure specified with the element type and electronic state of each atom in a molecule, and three-dimensional coordinates of each atom in the three-dimensional space. The "chemical structure" of a molecule refers to structure specified with the element type of each atom and interatomic bonding relations (e.g., bonding relations between atoms and bonding states such as single bonds and double bonds) and steric configuration (cis-trans isomerization relating to double bonds, R and S absolute configurations relating to asymmetric atoms, cis-trans isomerization for planar backbones) in a molecule.

Herein, when the structure of a molecule or part of the structure of a molecule is referred to be "uncertain", this means that the structure of the molecule is deemed not to be completely identified for some reasons such that the structure of the molecule or part of the structure of the molecule has not been determined through crystal X-ray structural analysis, that the precision of crystal X-ray diffraction data previously acquired was insufficient for identifying the structure of the molecule or part of the structure of the molecule, that the conditions under which crystal X-ray diffraction data were acquired for the molecule are suspected to be inappropriate, or that sufficient follow-up examination has not been made.

Figure 33:
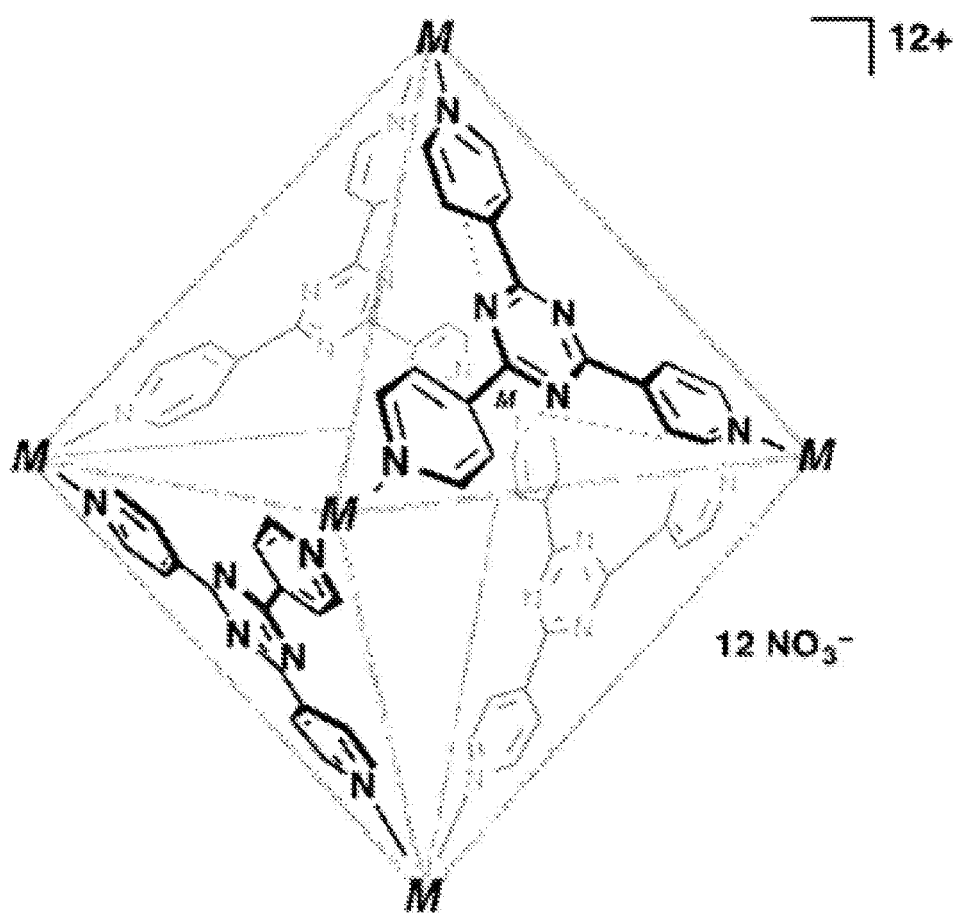
FIG. 33 shows an octahedral [M$_6$L$_4$] metal complex.

As used herein, a "meal complex" refers to a complex molecule including a ligand and a metal atom with a space that allows inclusion of another molecule in the inside. Metal complexes exist as positively-charged, free atomic groups in solution. When a molecule is referred to be "included", this refers to a situation that at least part of the molecule is present in the inside of a metal complex. The "inside of a metal complex" refers to a space in the inside of a convex polyhedron, without any concave, including the centers of all the atoms constituting the metal complex in the inside and having the minimum volume. As used herein, the "three-dimensional shape of a metal complex" refers to a three-dimensional geometrical shape specified when the planar structure of each ligand molecule constituting the metal complex is regarded as a face, and a metal complex is occasionally referred to as a "-hedral" or "-type" metal complex, where the word indicates such three-dimensional shape. Not all of the parts corresponding to faces of a three-dimensional shape specified as described by ligand molecules need to possess a ligand molecule, and for example, for the octahedral [M$_6$L$_4$] metal complex as shown in FIG. 33.

A molecule in which a metal complex is including a test molecule is referred to as a test molecule-metal complex inclusion compound (also referred to as an "inclusion compound", simply).

The metal complex of the present invention includes a ligand and a metal molecule. The metal molecule can be a complex containing a metal atom and a compound coordinating to the metal atom, and the compound coordinating to the metal atom is herein referred to as a "ligand". Every ligand has a coordination site. Every metal molecule binds to a ligand molecule.

A "coordination site" refers to an atom or atomic group in a ligand with an unshared electron pair capable of forming a coordinate bonding to a metal molecule. Examples thereof include a heteroatom including a nitrogen atom, an oxygen atom, a sulfur atom, and a phosphorous atom; an atomic group including a nitro group (—NO$_2$), amino groups (including primary, secondary, and tertiary amino groups), a cyano group (—CN), and a carboxyl group (—COOH, —COO$^-$); a hydroxyl ion (OH$^-$), a thiocyanate ion (SCN$^-$), an isothiocyanate ion (NCS$^-$), ammonia (NH$_3$), a halide ion (F$^-$, Cl$^-$, Br$^-$, I$^-$), and H$_2$O and the like.

As used herein, the "pore size of a metal complex" refers to the maximum diameter of a sphere capable of intruding from the outside to the inside of a metal complex without coming into contact with any of the centers of the atoms constituting the metal complex. As used herein, the "inner diameter of a metal complex" refers to the maximum diameter of a sphere present in a metal complex without being in contact with any of the centers of the atoms constituting the metal complex.

A molecule that is different from the test molecule with a known structure, and not a ligand, a metal molecule, or a solvent may be present in the inside of a metal complex. And such a molecule is herein referred to as an "insertion molecule". Herein, the situation that a test molecule (at least one molecule, for example, one molecule, two molecules, three molecules, or four molecules) and an insertion molecule (at least one molecule, for example, one molecule, two molecules, three molecules, or four molecules) are together included in a metal complex is referred to as "pair inclusion". And a combination of a test molecule and an insertion molecule that allows the occurrence of pair inclusion is referred to as an "inclusion pair". A molecule in which a metal complex is including a test molecule and an insertion molecule is referred to as a test molecule/insertion molecule-metal complex inclusion compound (also referred to as a "pair inclusion compound", simply).

As used herein, an "aqueous solvent" refers to a solvent containing water or a solvent containing a solvent component having compatibility with water. Examples of solvent components having compatibility with water include, but are not limited to, methanol, ethanol, propanol, isopropyl alcohol, tert-butyl alcohol, 1,2-dimethoxyethane, tetrahydrofuran, 1,4-dioxane, acetone, acetonitrile, dimethylformamide, and dimethyl sulfoxide. The amount of water or a solvent component having compatibility with water contained in an aqueous solvent can be 100% by weight, 99% by weight or more, 98% by weight or more, 97% by weight or more, 96% by weight or more, 95% by weight or more, 90% by weight or more, 80% by weight or more, 70% by weight or more, 60% by weight or more, or 50% by weight or more based on the total weight of the solvent.

The terms "fluid" and "liquid" are interchangeably used, and refer to liquids and supercritical fluids including liquids of single substance, mixtures of a plurality of liquids, solutions containing a solute dissolved therein, suspensions, emulsions, and supercritical fluids containing a solute dissolved therein.

As used herein, the term "inclusion solution" means a liquid to be used in allowing a metal complex to include a test molecule. An inclusion solution contains a metal complex, a test molecule, and an inclusion solvent.

As used herein, the term "crystallization solution" refers to a liquid to be used in generating a crystal containing an inclusion compound in at least part of the crystal after the step of including a test molecule. And examples thereof include a liquid to be used in generating a crystal of an inclusion compound, and a liquid to be used in generating a crystal of a mixture of an inclusion compound and the metal complex. The crystallization solution contains an inclusion compound and a crystallization solvent, and can further contain a molecule of the metal complex and/or test molecule not forming an inclusion compound.

Unless otherwise specified, an "alkyl group" as used herein as a single entity or a part of another group refers to a linear or branched saturated hydrocarbyl group having a carbon atom. Alkyl groups can typically have one to eight carbon atoms, and in some embodiments alkyl groups can have one to six carbon atoms. In some embodiments, alkyl groups can have one to four carbon atoms. In some embodiments, alkyl groups can have one to three carbon atoms. Examples of $C_{1-3}$ alkyl groups include a methyl group, an ethyl group, a propyl group, and an isopropyl group. Examples of $C_{1-4}$ alkyl groups include the aforementioned $C_{1-3}$ alkyl groups, and a butyl group, an isobutyl group, a sec-butyl group, and a tert-butyl group. Examples of $C_{1-6}$ alkyl groups include the aforementioned $C_{1-4}$ alkyl groups, and a pentyl group, an isopentyl group, a neopentyl group, and a hexyl group. Additional examples of alkyl groups include a heptyl group and an octyl group.

As used herein, an "alkylene group" is a divalent group formed by additionally removing a hydrogen from an "alkyl group". Specific examples of alkylene groups include, but are not limited to, —CH$_2$—, —CH$_2$CH$_2$—, —(CH$_2$)$_3$—, —CH$_2$CH(CH$_3$)—, —(CH$_2$)$_4$—, —CH$_2$CH$_2$CH(CH$_3$)—, —CH$_2$CH(CH$_3$)CH$_2$—, —(CH$_2$)$_5$—, —CH$_2$CH$_2$CH$_2$CH(CH$_3$)—, —CH$_2$CH$_2$CH(CH$_3$)CH$_2$—, —(CH$_2$)$_6$—, —(CH$_2$)$_7$—, —(CH$_2$)$_8$—, —(CH$_2$)$_9$—, and —(CH$_2$)$_{10}$—.

Unless otherwise specified, an "alkenyl group" as used herein as a single entity or a part of another group refers to a linear or branched hydrocarbyl group having carbon atoms and one or more carbon-carbon double bonds. Alkenyl groups can typically have two to eight carbon atoms, and in some embodiments alkenyl groups can have two to six carbon atoms. In some embodiments, alkenyl groups have two to four carbon atoms. The one or more carbon-carbon double bonds may be present inside (e.g., a double bond in 2-butenyl) or at an end (e.g., a double bond in 1-butenyl). Examples of $C_{2-4}$ alkenyl groups include an ethenyl group (a vinyl group), a 1-propenyl group, a 2-propenyl group, a 1-butenyl group, a 2-butenyl group, and a butadienyl group. Examples of $C_{2-6}$ alkenyl groups include the aforementioned $C_{2-4}$ alkenyl groups, and a pentenyl group, a pentadienyl group, and a hexenyl group. Additional examples of alkenyl groups include a heptenyl group, an octenyl group, and an octatrienyl group.

As used herein, an "alkenylene group" is a divalent group formed by additionally removing a hydrogen from an "alkenyl group". Specific examples of alkenylene groups include, but are not limited to, —CH=CH—, —CH=CH—CH$_2$—, —CH=CH—(CH$_2$)$_2$—, —CH$_2$—CH=CH—CH$_2$—, —CH=C(CH$_3$)—CH$_2$—, —CH=CH—CH=CH—, —CH=CH—(CH$_2$)$_3$—, —CH=CH—CH=CH—CH$_2$—, —CH=CH—(CH$_2$)$_4$—, —CH=CH—(CH$_2$)$_5$—, —CH=CH—(CH$_2$)$_6$—, —CH=CH—(CH$_2$)$_7$—, and —CH=CH—(CH$_2$)$_8$—.

Unless otherwise specified, an "alkynyl group" as used herein as a single entity or a part of another group refers to a linear or branched hydrocarbyl group having carbon atoms and one or more carbon-carbon triple bonds. Alkynyl groups can typically have two to eight carbon atoms, and in some embodiments alkynyl groups can have two to six carbon atoms. In some embodiments, alkynyl groups can have two to four carbon atoms. The one or more carbon-carbon triple bonds may be present inside (e.g., a triple bond in 2-butynyl) or at an end (e.g., a triple bond in 1-butynyl). Examples of $C_{2-4}$ alkynyl groups include an ethynyl group, a propin-1-yl group, a propin-3-yl group, a 1-butin-1-yl group, a 1-butin-4-yl group, and 2-butin-1-yl group. Examples of $C_{2-6}$ alkenyl groups include the aforementioned $C_{2-4}$ alkynyl groups, and a pentynyl group and a hexynyl group. Additional examples of alkynyl include a heptynyl group and an octynyl group.

As used herein, an "alkynylene group" is a divalent group formed by additionally removing a hydrogen from an "alkynyl group". Specific examples of alkynylene groups include, but are not limited to, —C≡C—, —C≡C—CH$_2$—, —C≡C—(CH$_2$)$_2$—, —CH$_2$—C≡C—CH$_2$—, —C≡C—C≡C—, —C≡C—(CH$_2$)$_3$—, —CH$_2$—C≡C—(CH$_2$)$_2$—, —C≡C—C≡C—CH$_2$—, —C≡C—(CH$_2$)$_4$—, —(CH$_2$)$_2$—C≡C—(CH$_2$)$_2$—, —CH$_2$—C≡C—C≡C—CH$_2$—, —C≡C—C≡C—C≡C—, —C≡C—(CH$_2$)$_5$—, —(CH$_2$)$_2$—C≡C—(CH$_2$)$_3$—, —(CH$_2$)$_2$—C≡C—C≡C—(CH$_2$)$_3$—, —C≡C—(CH$_2$)$_6$—, —C≡C—(CH$_2$)$_7$—, and —C≡C—(CH$_2$)$_8$—.

As used herein, an "aliphatic group" refers to any of alkyl groups, alkenyl groups, and alkynyl groups, and cyclic hydrocarbon groups are not included in aliphatic groups.

As used herein, a "heteroaliphatic group" refers to a group such that a part in an aliphatic group is replaced with a heteroatom (e.g., a nitrogen atom, an oxygen atom, a sulfur atom).

As used herein, the term "aryl group" refers to a monoaromatic ring or fused polycyclic system in which at least one of the ring(s) is aromatic and every ring atom is carbon with one, two, or three bonding points (monovalent, divalent, and trivalent, respectively) to the rest of the molecule. For example, aryl groups can have 6 to 26 carbon atoms (6- to 26-membered), 6 to 20 carbon atoms (6- to 20-membered), 6 to 14 carbon atoms (6- to 14-membered), or 6 to 12 carbon atoms (6- to 12-membered). Aryl groups include a phenyl group. Aryl groups include fused polycyclic systems (e.g., cyclic systems including two, three, or four rings) having 8 to 20 carbon atoms in which at least one of the rings is aromatic and the other rings may be each aromatic or not. Such a fused polycyclic system may be optionally substituted with one or more (e.g., one, two, or three) oxo groups in any carbocycle moiety in the fused polycyclic system. Rings in a fused polycyclic system can be connected together via any of condensation, and spiro and crosslinking bonds, as long as valence requirements permit. It should be understood that bonding points of fused polycyclic systems as defined above can be present at any position in the cyclic system including aromatic rings or carbocycle moieties of the rings. Typical examples of aryl groups include, but are not limited to, a phenyl group, an indenyl group, a naphthyl group, a 1,2,3,4-tetrahydronaphthyl group, an anthryl group, and a pyrenyl group.

The term "heteroaryl group" as used herein refers to a monoaromatic ring or fused polycyclic system having at least one heteroatom in the ring(s) and having one, two, or three bonding points (monovalent, divalent, and trivalent, respectively) to the rest of the molecule, and the heteroatom is selected from the group consisting of oxygen, nitrogen, and sulfur. Heteroaryl groups can typically 5- to 26-membered, and in some embodiment can be 5- to 20-membered. In some embodiment, heteroaryl groups can be 5- to 14-membered. In some embodiment, heteroaryl groups can be 5- to 12-membered. In some embodiment, heteroaryl groups can be 5- to 10-membered. Heteroaryl groups include a monoaromatic ring having in the ring about one to six carbon atoms and about one to four heteroatoms selected from the group consisting of oxygen, nitrogen, and sulfur. Examples of such rings include, but are not limited to, a pyridyl group, a pyrimidinyl group, a pyrazinyl group, an oxazolyl group, and a furyl group. Heteroaryl groups may contain a metal atom. If the ring is aromatic, sulfur and nitrogen atoms can exist in their oxidized forms. Heteroaryl groups include fused polycyclic systems (e.g., cyclic systems including two, three, or four rings) in which a heteroaryl group as defined above is capable of fusing to form a fused polycyclic system with one or more rings selected from heteroaryl (e.g., to form naphthyridinyl such as 1,8-naphthyridinyl), heterocycles (e.g., to form 1,2,3,4-tetrahydronaphthyridinyl such as 1,2,3,4-tetrahydro-1,8-naphthyridinyl), carbocycles (e.g., to form 5,6,7,8-tetrahydroquinolyl), and aryl (e.g., to form indazolyl). In some embodiments, heteroaryl groups (monoaromatic rings or fused polycyclic systems) have about 1 to 20 carbon atoms and about one to six heteroatoms in the heteroaryl ring. Such a fused polycyclic system may be optionally substituted with one or more (e.g., one, two, three, or four) oxo groups in carbocycle or heterocycle moieties in the fused ring. Rings in a fused polycyclic system can be connected together via any of condensation, and spiro and crosslinking bonds, as long as valence requirements permit. It should be understood that individual rings in a fused polycyclic system can be connected together in arbitrary order. It should be also understood that bonding points of a fused polycyclic system described above can be present at any position in the fused polycyclic system including heteroaryl, heterocycle, aryl, or carbocycle moieties of the fused polycyclic system, and at any appropriate atom in the fused polycyclic system including carbon atoms and heteroatoms (e.g., nitrogen). Examples of heteroaryl groups include, but are not limited to, a pyridyl group, a pyrrolyl group, a pyrazinyl group, a pyrimidinyl group, a pyridazinyl group, a pyrazolyl group, a thienyl group, an indolyl group, an imidazolyl group, an oxazolyl group, an isoxazolyl group, a thiazolyl group, a furyl group, an oxadiazolyl group, a thiadiazolyl group, a quinolyl group, an isoquinolyl group, a benzothiazolyl group, a benzoxazolyl group, an indazolyl group, a quinoxalyl group, a quinazolyl group, a 5,6,7,8-tetrahydroisoquinolinylbenzofuranyl group, a benzimidazolyl group, a thianaphthenyl group, a pyrrolo[2,3-b]pyridinyl group, a quinazolinyl-4(3H)-one group, a triazolyl group, a 4,5,6,7-tetrahydro-1H-indazole group, and a 3b,4,4a,5-tetrahydro-1H-cyclopropa[3,4]cyclopenta[1,2-c]pyrazole group, and a porphine group, a porphyrin group, and

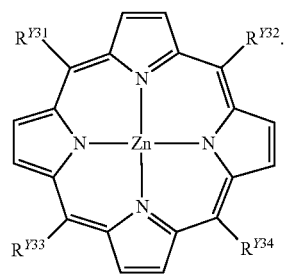

wherein $R^{Y31}$, $R^{Y32}$, $R^{Y33}$, and $R^{Y34}$ are as defined herein.

As used herein, an "arylene group" refers to a divalent group in which a plurality of divalent aromatic monocyclic or fused polycyclic 6- to 26-membered aryl or 5- to 26-membered heteroaryl groups or 6- to 26-membered aryl and/or 5- to 26-membered heteroaryl groups is directly bonding together at their ring atoms. Arylene groups can be typically 6- to 16-membered, and in some embodiments can be 6- to 14-membered. In some embodiments, arylene groups can be 6- to 12-membered. Examples of such arylene groups include a phenylene group, a naphthylene group, an anthrene group, a biphenylene group, -(phenylene group)-(naphthylene group)-, and a binaphthylene group. Preferred examples include a 1,4-phenylene group and a 4,4'-biphenylene group.

Unless otherwise specified, "halo" or "halogen" as used herein as a single entity or a part of another group refers to fluorine (fluoro), chlorine (chloro), bromine (bromo), or iodine (iodo).

Unless otherwise specified, a "haloalkyl group" as used herein as a single entity or a part of another group refers to an alkyl group in which one or more of the hydrogen atoms are each independently substituted with halo. In some embodiments ("perhaloalkyl groups"), every hydrogen atom is substituted with fluoro or chloro. In some embodiments ("perfluoroalkyl groups"), every hydrogen atom is substituted with fluoro. Examples of perfluoroalkyl groups include —CF$_3$, —CF$_2$CF$_3$, and —CF$_2$CF$_2$CF$_3$. Examples of perhaloalkyl groups include the aforementioned perfluoroalkyl groups, and —CCl$_3$, —CFCl$_2$, —CF$_2$Cl, and —CCl$_2$CCl$_3$. Examples of haloalkyl groups include the aforementioned perhaloalkyl groups, and —CH$_2$F, —CHF$_2$, —CH$_2$Cl, —CH$_2$Br, —CH(Cl)CH$_2$Br, and —CH$_2$CH(F)CH$_2$Cl. "Haloalkenyl groups", "perhaloalkenyl groups", "haloalkynyl groups", "perhaloalkynyl groups", "haloaliphatic groups", "perhaloaliphatic groups", and the like are defined in the same manner as for the aforementioned "haloalkyl groups" and "perhaloalkyl groups".

As used herein, a "carbocycle" or "carbocyclic group" as a single entity or a part of another group refers to a monocyclic, bicyclic, tricyclic, or tetracyclic hydrocarbon group, or a polycyclic hydrocarbon group with more than five rings which is completely saturated or includes one or more unsaturated units, but is not aromatic, and has one, two, or three bonding points (monovalent, divalent, and trivalent, respectively) to the rest of the molecule. In one embodiment, carbocyclic groups can be monocyclic $C_{3-9}$ hydrocarbon groups. In one embodiment, carbocyclic groups can be bicyclic $C_{8-12}$ hydrocarbon groups. In one embodiment, carbocyclic groups can be tricyclic $C_{10-16}$ hydrocarbon groups. In one embodiment, carbocyclic groups can be tetracyclic $C_{12-21}$ hydrocarbon groups. Any individual ring in the carbocyclic groups can have three to seven ring atoms. Examples of carbocyclic groups include, but are not limited to, cycloalkyl groups such as a cyclopropyl group, a cyclobutyl group, a cyclopentyl group, a cyclohexyl group, a cycloheptyl group, a cyclooctyl group, and a cyclononyl group; cycloalkenyl groups such as a cyclopropenyl group, a cyclobutenyl group, a cyclopentenyl group, a cyclohexenyl group, a cycloheptenyl group, a cyclooctenyl group, and a cyclononenyl group; and cycloalkynyl groups such as a cyclopropynyl group, a cyclobutynyl group, a cyclopentynyl group, a cyclohexynyl group, a cycloheptynyl group, a cyclooctynyl group, and a cyclononynyl group; and an adamantyl group,

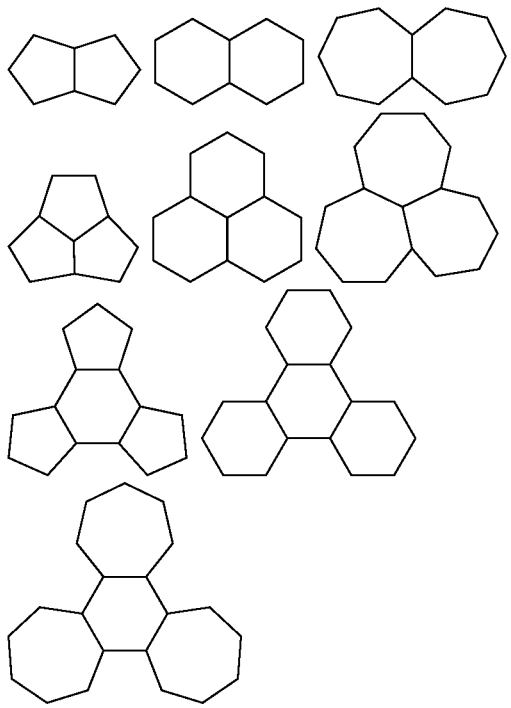

In a carbocyclic group, any ring atom may be bonding to the rest part of the molecule, if possible.

As used herein, a "heterocycle", "heterocycle group", or "heterocyclic group" as a single entity or a part of another group refers to a monocyclic, bicyclic, tricyclic, or tetracyclic ring system, or a polycyclic ring system with more than five rings in which at least one ring in the ring system includes one or more identical or different heteroatoms, and which is completely saturated or includes one or more unsaturated units, but is not aromatic, and has one, two, or three bonding points (monovalent, divalent, and trivalent, respectively) to the rest of the molecule. In some embodiments, "heterocycles" or "heterocyclic groups" have 3 to 14 ring atoms, where one or more of the ring atoms are heteroatoms each independently selected from oxygen, sulfur, nitrogen, and phosphorus, and each ring in the ring system includes 3 to 8 ring atoms.

Examples of heterocyclic groups include, but are not limited to, monocycles including a 2-tetrahydrofuranyl group, a 3-tetrahydrofuranyl group, a 2-tetrahydrothiophenyl group, a 3-tetrahydrothiophenyl group, a 2-morpholino group, a 3-morpholino group, a 4-morpholino group, a 2-thiomorpholino group, a 3-thiomorpholino group, a 4-thiomorpholino group, a 1-pyrrolidinyl group, a 2-pyrrolidinyl group, a 3-pyrrolidinyl group, a 1-tetrahydropiperazinyl group, a 2-tetrahydropiperazinyl group, a 3-tetrahydropiperazinyl group, a 1-piperidinyl group, a 2-piperidinyl group, a 3-piperidinyl group, a 1-pyrazolinyl group, a 3-pyrazolinyl group, a 4-pyrazolinyl group, a 5-pyrazolinyl group, a 1-piperidinyl group, a 2-piperidinyl group, a 3-piperidinyl group, a 4-piperidinyl group, a 2-thiazolidinyl group, a 3-thiazolidinyl group, a 4-thiazolidinyl group, a 1-imidazolidinyl group, a 2-imidazolidinyl group, a 4-imidazolidinyl group, and a 5-imidazolidinyl group; and bicycles including a 3-1H-benzimidazol-2-one group, a 3-(1-alkyl)-benzimidazol-2-one group, an indolinyl group, a tetrahydroquinolinyl group, a tetrahydroisoquinolinyl group, a benzothiolane group, a benzodithiane group, and a 1,3-dihydro-imidazol-2-one group. In a heterocyclic group, any ring atom may be bonding to the rest part of the molecule, if possible.

As used herein, a monovalent organic group refers to a monovalent group containing at least one of carbon, oxygen, nitrogen, and sulfur. This can be, for example, a 5- to 26-membered, 5- to 20-membered, 5- to 14-membered, or 5- to 12-membered nitrogen-containing heteroaryl group, a di(5- to 26-membered, 5- to 20-membered, 5- to 14-membered, or 5- to 12-membered nitrogen-containing heteroaryl group)phenyl group, a nitrile group, an optionally substituted amino group, or a carboxylic acid group (—COOH or —COO⁻). Non-limiting examples of them can include 5- to 12-membered monocyclic or fused bicyclic nitrogen-containing heteroaryl groups and di(5- to 12-membered monocyclic or fused bicyclic nitrogen-containing heteroaryl group)phenyl groups. Preferred examples of monovalent organic groups include, but are not limited to, a 4-pyridyl group, a 3-pyridyl group, a pyrimidinyl group, a 3,5-di(4-pyridyl)phenyl group, and a 3,5-di(3-pyridyl)phenyl group.

As used herein, a divalent organic group refers to a divalent group containing at least one of carbon, oxygen, nitrogen, and sulfur. This can be, for example, a divalent group as one divalent group or a plurality of (e.g., two, three, four, or five or more) groups linked together, with the one divalent group or plurality of groups selected from the group consisting of the following (a) to (r):

(a) —NR$^a$—,
(b) —O—,
(c) —S—,
(d) —C(=O)O—,
(e) —C(=O)—,
(f) —C(=O)NR$^a$—,
(g) —C(=N—CN)—,
(h) —NR$^a$C(=O)O—,
(i) —S(=O)$_2$NR$^a$—,
(j) —NR$^a$C(=O)NR$^a$—,
(k) —NR$^a$S(=O)$_2$NR$^a$—,
(l) —S(=O)—, (m) —S(=O)$_2$—,
(n) optionally substituted C$_{1-6}$ alkylene groups,
(o) optionally substituted C$_{2-6}$ alkenylene groups,
(p) optionally substituted C$_{2-6}$ alkynylene groups,
(q) optionally substituted arylene groups, and
(r) an optionally substituted adamantyl group,
wherein each R$^a$ is independently hydrogen or an optionally substituted C$_{1-6}$ aliphatic group. The number of carbon atoms constituting a divalent organic group is preferably 2 to 18, more preferably 2 to 12, and even more preferably 2 to 6.

As used herein, the term "[optionally substituted heteroaryl group]$_z$" refers to a monovalent group including z arbitrary heteroaryl groups linked together and represented by the following formula:

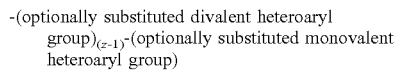

wherein z is an integer of 1 or more, the heteroaryl ring of the monovalent heteroaryl group may be the same as or different from the heteroaryl ring of the divalent heteroaryl group, provided that if z=1 then the "(optionally substituted divalent heteroaryl group)$_{(z-1)}$" indicates a single bond, and that term refers to -(optionally substituted monovalent heteroaryl group). Specific examples of such groups include, but are not limited to, a pyridyl group, a bipyridyl group, a terpyridyl group, a quaterpyridyl group, and a quinquepyridyl group. When the term [optionally substituted five- to six-membered monocyclic nitrogen-containing heteroaryl group]$_z$ is used herein, for example, this refers to -(optionally substituted five- to six-membered monocyclic nitrogen-containing divalent heteroaryl group)$_{(z-1)}$-(optionally substituted five- to six-membered monocyclic nitrogen-containing monovalent heteroaryl group).

As used herein, the term "unsaturated" means that a moiety has one or more unsaturated units.

In divalent groups used herein, either one of the two bonding points may be bonding to the parent molecule (a part in the inner side or center side of the molecule). For example, the group —O—CH$_2$— may be any of the following forms:

[parent molecule]-O—CH$_2$-[another group]
[parent molecule]-CH$_2$—O-[another group]

When a wavy line is drawn to intersect a bond (line) in chemical structural formulas as follows:

this indicates a bonding point, for example, to the rest part of the molecule, or another group or ligand.

"Optionally substituted" groups herein may be unsubstituted or substituted.

When a "heteroaliphatic group", a "heterocycle", a "heterocyclic group", a "heteroaryl group", or an "arylene group" is substituted, it may have a substituent on a heteroatom, if such substitution is possible.

When a group is "substituted", at least one hydrogen in the group is replaced with a group other than hydrogen (substituent), and the number of substituents is not limited as long as such substitution is possible, and is one or more. Unless otherwise indicated, description of each group applies to cases that the group is a part or substituent of another group. When a C$_{1-6}$ alkyl group is substituted, for example, the number of carbons in the substituent is not included in the number of carbons of the alkyl group. This applies to other groups.

Examples of substituents in groups defined as "optionally substituted" or "substituted" include halogens, C$_{1-6}$ alkyl groups, C$_{2-6}$ alkenyl groups, C$_{2-6}$ alkynyl groups, C$_{1-6}$ haloalkyl groups, C$_{2-6}$ haloalkenyl groups, C$_{2-6}$ haloalkynyl groups, —O—C$_{1-6}$ haloalkyl groups, —OH, —OR$^b$, —SH, —SR$^b$, a 1,2-methylenedioxy group, a 1,2-ethylenedioxy group, a phenyl group (Ph), —O(Ph), —(CH$_2$)$_{1-2}$(Ph), —CH=CH(Ph), —NO$_2$, —CN, —R$^b$, —N(R$^b$)$_2$, —NR$^b$C(=O)R, —NHC(=S)R$^b$, —NR$^b$C(=S)R$^b$, —NR$^b$C(=O)N(R$^b$)$_2$, —NR$^b$C(=S)N(R$^b$)$_2$, —NR$^b$C(=O)OR$^b$, —C(=O)OR$^b$, —C(=O)R, —C(=S)R, —C(=O)N(R$^b$)$_2$, —C(=S)N(R$^b$)$_2$, —OC(=O)N(R$^b$)$_2$, —OC(=O)R$^b$, —C(=NOR)R$^b$, —S(=O)$_2$R$^b$, —S(=O)$_2$OR$^b$, —S(=O)$_2$N(R$^b$)$_2$, —S(=O)R$^b$, —NR$^b$S(=O)$_2$R$^b$, —N(OR$^b$)R$^b$, —(CH$_2$)$_{0-2}$NHC(=O)R$^b$, =N—CN, =N-(heterocyclic group), a heterocyclic group, —N$^+$(C$_{1-6}$ alkyl group)$_3$(counteranion (e.g., a nitrate ion and the like)), -L$^{10}$-R$^b$, -L$^{10}$-N(R$^b$)$_2$, -L$^{10}$-SR$^b$, -L$^{10}$-OR, -L$^{10}$-(C$_{3-10}$ carbocyclic group), -L$^{10}$-(C$_{6-10}$ aryl group), -L$^{10}$-(5- to 10-membered heteroaryl group), -L$^{10}$-(5- to 10-membered heterocyclic group), an oxo group (=O), -L$^{10}$-NO$_2$, -L$^{10}$-CN, -L$^{10}$-OH, -L$^{10}$-CF$_3$. Alternatively, two substituents on the same carbon or on different carbons together with the atom(s) to which they bond and/or an intervening atom form a five- to seven-membered saturated, unsaturated, or partially saturated ring, wherein L$^{10}$ is an C$_{1-6}$ alkylene group, and up to three methylene units are replaced with —NH—, —NR—, —O—, —S—, —C(=O)O—, —OC(=O)—, —C(=O)C(=O)—, —C(=O)—, —C(=O)NH—, —C(=O)NR$^b$—, —C(=N—CN), —NHCO—, —NR$^b$CO—, —NHC(=O)O—, —NR$^b$C(=O)O—, —S(=O)$_2$NH—, —S(=O)$_2$NR$^b$—, —NHS(=O)$_2$—, —NR$^b$S(=O)$_2$—, —NHC(=O)NH—, —NR$^b$C(=O)NH—, —NHC(=O)NR$^b$—, —NR$^b$C(=O)NR$^b$—, —OC(=O)NH—, —OC(=O)NR$^b$—, —NHS(=O)$_2$NH—, —NR$^b$S(=O)$_2$NH—, —NHS(=O)$_2$NR$^b$—, —NR$^b$S(=O)$_2$NR$^b$—, —S(=O)—, or —S(=O)$_2$—. Each R$^b$ is independently selected from a hydrogen atom, optionally substituted C$_{1-6}$ aliphatic groups, unsaturated five- to six-membered heteroaryl groups or heterocycles, a phenyl group, and —CH$_2$(Ph), or two R$^b$ groups present on the same substituent or present independently on different substituents together with the atom(s) to which the R$^b$ groups bond form a five- to eight-membered heterocyclyl ring, aryl ring, or heteroaryl ring, or a three- to eight-membered cycloalkyl ring, wherein the heteroaryl ring or heterocyclyl ring has one to three heteroatoms each independently selected from nitrogen, oxygen, and sulfur. Non-limiting examples of substituents on the aliphatic group of R$^b$ include —NH$_2$, —NH(C$_{1-4}$ aliphatic group), —N(C$_{1-4}$ aliphatic group)$_2$, halogens, C$_{1-4}$ aliphatic groups, halo C$_{1-4}$ aliphatic groups, —OH, —O(C$_{1-4}$ aliphatic group), —NO$_2$, —CN, —C(=O)OH, —C(=O)O(C$_{1-4}$ aliphatic group), —O(halo C$_{1-4}$ aliphatic group), and halo C$_{1-4}$ aliphatic groups, where each of the aforementioned C$_{1-4}$ aliphatic groups of R$^b$ is unsubstituted.

As used herein, the term "polydentate ligand" refers to a bidentate, tridentate, tetradentate, or pentadentate ligand, or a ligand with denticity of more than five.

"About" herein indicates that the following numerical value is in a range of ±10% thereof.

(Test Molecule)

In the present invention, the test molecule can be any molecule the structure of which is to be determined. The test molecule can be any molecular capable of being included in the metal complex. The test molecule may be derived from any source, but is different from solvent molecules contained in the crystallization solution. In one embodiment, the weight of the test molecule in the crystallization solution at initiation of crystallization is less than the weight of the solvent contained in the crystallization solution.

The test molecule may have given no information (e.g., source information, results of mass spectrometry, results of NMR analysis, results of elemental analysis, results of characteristics test) or some pieces of information on the molecule. The structure of the test molecule may be unknown, or have already been partially or totally determined. In one embodiment, at least part of the structure of the test molecule (e.g., chirality for one or more atoms, or cis-trans isomerism) is unknown or uncertain. In such a case, the structure which was unknown or uncertain can be clarified through analysis of the structure of the test molecule by using the method of the present invention with an X-ray or a neutron beam. In one embodiment, in which some pieces of information (e.g., source information, results of mass spectrometry, results of NMR analysis, results of elemental analysis, results of characteristics test) on the test molecule have been acquired, the structure or a partial structure of the test molecule may be predicted in advance based on one of more pieces of the information. Examples of the structure or a partial structure of the test molecule that can be predicted in advance in such a manner include, but are not limited to, the maximum length of a main backbone (e.g., a central ring), the minimum length of a main backbone (e.g., a central ring), the types and/or numbers of functional groups included, the distance between a hydrophilic group and the atom most distant therefrom, the distance between a hydrophilic group and the atom in a main backbone (e.g., a central ring) most distant therefrom.

The "backbone structure" of a compound herein refers to a primary part in the compound. In one embodiment, the backbone structure of a compound can be a ring structure (herein, referred to as a "central ring") consisting of all the consecutive rings (referring to the entire of a series of rings linked by forming fused rings and/or spiro rings, and/or linked via single bonds) or single rings without any consecutive neighboring ring in the compound. The central ring is specified with bonding relation among all the members constituting the ring (the interrelation and bond order of each pair of atoms forming a bond) and the atomic types of all the members. When a plurality of ring structures as described above is present in one compound, the ring structure constituted with the largest number of atoms is the central ring (when a plurality of ring structures constituted with the same number of atoms is present, any of them can be referred to as the central ring). In one embodiment, the backbone structure of a compound can be a structure consisting of a central ring and a main chain. The "main chain" herein is a linear structure constituted with at least six carbon atoms with an end directly bonding to a central ring (provided that none of the bonds between atoms in the linear structure is a part of the ring). The main chain is specified with the bonding position to the central ring and the bond order of each pair of constituent atoms. When a plurality of linear structures as described above is present in one compound, the linear structure constituted with the largest number of atoms is the main chain (when a plurality of linear structures constituted with the same number of atoms is present, any of them can be referred to as the main chain).

Example of central ring and main chain:

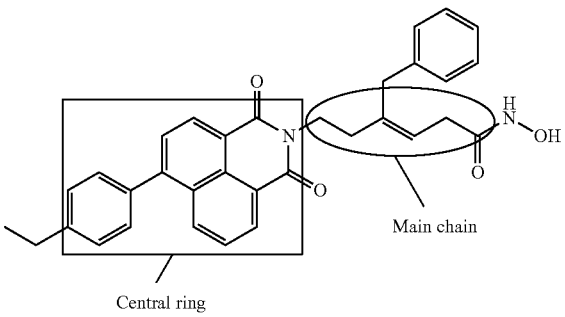 [SMILES: CCc1ccc(-c2ccc3c4c(cccc24)C(=O)N(CC/C(=C/CC(=O)NO)Cc2ccccc2)C3=O)cc1]

The expression that a compound A and a compound B "have a common backbone structure" herein means that the backbone structure or analogous backbone structure thereto of the compound A includes the backbone structure of the compound B, and/or the backbone structure or analogous backbone structure thereto of the compound B includes the backbone structure of the compound A. Here, an analogous backbone structure refers to a backbone structure such that in comparing with the original backbone structure, the bond order of interatomic bonding is different at corresponding zero, one, two, three, or four positions in their central rings, the atomic type of an atom is different at corresponding zero, one, two, three, or four positions in their central rings, bond order of interatomic bonding is different at any number of corresponding positions in their main chains, and the other features are in common. In one embodiment, the number of atoms constituting a backbone structure can be identical among compounds having a common backbone structure, or differ by six or less, five or less, four or less, three or less, two or less, or one or less.

The molecular weight of the test molecule can be any molecular weight that allows the test molecule to be included in the metal complex, and is 50 to 700 (Da) in one embodiment, 100 to 500 (Da) in a more specific embodiment, and 200 to 400 (Da) in a preferred embodiment. It should be noted that these preferred molecular weights are those when the test molecule is free of halogen atoms, and it is preferable when the test molecule contains a halogen atom that the product of the number of halogen atoms and its molecular weight be added to those molecular weights. The molecular weight of the test molecule can be determined or predicted in advance through measurement by mass spectrometry or the like. The structure of the test molecule can be referred to in selecting the metal complex.

In one embodiment, the method of the present invention can determine the structure of a test molecule satisfying one or more of the following conditions:
 (1) being a compound predicted to have an aromatic ring (e.g., a compound having a benzene ring, a naphthalene ring, an anthracene ring, or a benzo-fused ring);
 (2) being a compound predicted to have a carbocycle (e.g., a compound having a five- to seven-membered monocyclic carbocycle, a 9- to 10-membered bicyclic carbocycle, an adamantane structure, and the like, a compound having a steroidal structure (e.g., a cholestane structure, a cholane structure, a pregnane structure, an androstane structure, an estrane structure)); and
 (3) being a compound predicted to have fluorine.
For the condition (1), information on the structure of the test molecule can be acquired in advance, for example, through $^1$H-NMR and $^{13}$C-NMR methods. For the condition (2), information on the structure of the test molecule can be acquired in advance, for example, through $^1$H-NMR and $^{13}$C-NMR, and if possible those skilled in the art could expect the primary structure (including the central ring and main chain) from the origin of the test molecule. For the condition (3), the presence or absence of fluorine in the test molecule can be simply examined through $^{19}$F-NMR.

The length of the test molecule can vary with the metal complex to be used, and those skilled in the art can appropriately identify the length range of the test molecule by using information known or well-known in the art.

In one embodiment, the test molecule includes a hydrophilic moiety. In one embodiment, the test molecule includes both a hydrophilic moiety and a hydrophobic moiety.

A hydrophilic moiety herein refers to a moiety of a molecule including at least one hydrophilic group.

In one embodiment, the test molecule includes one, two, three, four, or more hydrophilic groups. In one embodiment, the test molecule includes at least one hydrophilic group in the outer side of the molecule. In one embodiment, the test molecule can be in a conformation such that hydrophilic groups are included in one side of a plane and all the other atoms are included in the opposite side of the plane. The test molecule may be insoluble or soluble in water.

A group including an atom having an unshared electron pair can be a hydrophilic group. Examples of the hydrophilic groups include, but are not limited to, a hydroxy group (—OH), a carboxylic acid group (—COOH), an aldehyde group (—CHO), a carbonyl group (—C(=O)—), an amine groups (such as —NH$_2$, —NH(R), —N(R)(R)), a nitrile group (—CN), a sulfo group (such as —SO$_3$H, —SO$_3$R$^M$), a sulfate group (such as —OSO$_3$H, —OSO$_3$R$^M$), and a phosphate group (such as —OPO(OH)$_2$, —OPO(OH)(OR)), wherein each R is independently, for example, an aliphatic group, and R$^M$ is, for example, a cation. In addition, moieties with polarity (e.g., an ether bond, an ester bond, or an amide bond) exhibit hydrophilicity in some cases, and such moieties with polarity are herein also referred to as hydrophilic groups.

In one embodiment, the test molecule can be derivatized to introduce a hydrophobic group and/or a hydrophilic group into the test molecule. In one embodiment, the test molecule can be derivatized to introduce an aromatic ring into the test molecule. In one embodiment, the test molecule can be derivatized to introduce an electron-rich moiety into the test molecule. In one embodiment, the test molecule can be derivatized to introduce a protective group into the test molecule. These derivatizations are known, and those skilled in the art can suitably perform them.

Examples of derivatization include, but are not limited to, esterification of a hydroxyl group, esterification and amidation of a carboxyl group, and amidation of an amino group in the test molecule. Specific examples of esterification of a hydroxyl group include, but are not limited to, esterification with a carboxylic acid including an aromatic ring, such as esterification with benzoic acid, methylbenzoic acid, dimethylbenzoic acid, trimethylbenzoic acid, naphthalenecarboxylic acid, anthracenecarboxylic acid, phenanthrenecarboxylic acid, triphenylenecarboxylic acid, perylenecarboxylic acid, or α-methoxy-α-(trifluoromethyl)phenylacetic acid (Mosher reagent). Specific examples of esterification of a carboxyl group include esterification with benzyl alcohol, naphthylmethanol, naphthylethanol, anthracenemethanol, phenanthrenylmethyl alcohol, triphenylenylmethyl alcohol, or perylenylmethyl alcohol. Specific examples of amidation of an amino group include, but are not limited to, amidation with a carboxylic acid including an aromatic ring, such as amidation with benzoic acid, methylbenzoic acid, dimethylbenzoic acid, trimethylbenzoic acid, naphthalenecarboxylic acid, anthracenecarboxylic acid, phenanthrenecarboxylic acid, triphenylenecarboxylic acid, perylenecarboxylic acid, or α-methoxy-α-(trifluoromethyl)phenylacetic acid (Mosher reagent).

The test molecule may have been purified or not. Examples of purification methods for the test molecule include, but are not limited to, filtration, chromatography, crystallization, extraction, liquid phase distribution, and salting-out, and any known purification method is applicable. Even when the test molecule has not been purified, in other words, impurities are present, those skilled in the art can allow the test molecule to be exclusively included in the metal complex in accordance with the description herein, and thus can identify the structure of the targeted test molecule even in the presence of impurities.

The test molecule may be in any of solid, liquid, and gas at normal temperature under normal pressure. The test molecule in solid may be in any of crystalline form, amorphous form, and so on. The method of the present invention is highly advantageous particularly when crystallization of the test molecule is difficult. General characteristics of molecules that are difficult to crystallize include being liquid or gas at normal temperature under normal pressure, having high volatility, being deliquescent, and being chemically unstable. For example, most components for perfumes are difficult to crystallize because of their volatility. Substances that are present as liquid at normal temperature under normal pressure and have boiling points of 260° C. or lower are volatile. If the test molecule is gas or volatile, it can be advantageous to perform the step(s) of inclusion and/or crystallization at low temperature (e.g., lower than 20° C., lower than 0° C.).

In one embodiment, the chemical structure of the test molecule remains unchanged from preparation of a sample containing the test molecule (or optionally the test molecule as it is) until X-ray or neutron beam diffraction data have been acquired. In one embodiment, the chemical structure of the test molecule remains unchanged from initiation of the step of inclusion until X-ray or neutron beam diffraction data have been acquired.

In one embodiment, the total amount of the test molecule to be used can be 1 ng or more. In a representative embodiment, the total amount of the test molecule to be used is 1 mg or less. This is because structural determination by NMR is difficult if the amount of the test molecule is 1 mg or less. In one embodiment, the total amount of the test molecule to be used can be 0.5 mg or less, 0.2 mg or less, or even 0.1 mg or less. In one embodiment, the total amount of the test molecule to be used is 3 ng to 1 mg, and preferably 5 ng to 1 mg. If a molecule obtained from a natural product is used as the test molecule, it is often difficult to obtain a large quantity of the test molecule. The method of the present invention can be advantageous in that the method can be used for structural determination of such a very small amount of the test molecule with an X-ray.

The test molecule may be provided together with a solvent. The test molecule dissolved, mixed, or suspended in a solvent may be provided.

(Metal Complex)

The metal complex may include one or more ligands and one or more metal molecules. Each of the metal molecules may be a metal atom. In view of easiness in preparation, it is preferable that the metal complex be formed of one type of ligand and one type of metal molecule. If the types of the ligand and metal molecule have been specified, it is preferable that molecules of the metal complex having common molecular weight and three-dimensional shape be formed. It is preferable that molecules of the metal complex have definite molecular weight and molecular shape In one embodiment, a moiety in one molecule of the ligand can form one face of the three-dimensional shape of the metal complex. In one embodiment, a rigid moiety (with few possible conformations) included in the ligand can maintain the three-dimensional shape of the metal complex, ensuring an inner space required for inclusion. For example, if an aromatic ring and an atomic group linked from the aromatic ring via a π conjugated system, such as adamantane, are present in the molecule, the moiety can be rigid. In one embodiment, the ligand can include a moiety of planar structure including an aromatic ring and an atomic group linked from the aromatic ring via a π conjugated system. If a plurality of aromatic rings is present in the ligand, it is preferable that the aromatic rings be together forming a π conjugated system. This is because a rigid moiety formed in the ligand ensures an inner space when the metal complex is formed, and because, as described later, part of the metal complex becomes electron-deficient, which can promote capturing of an electron-rich moiety of the test molecule. In one embodiment, the number of atoms sharing a series of π conjugated systems in the ligand can be 6 to 48.

In one embodiment, the ligand has symmetry (e.g., rotational symmetry). In one embodiment, the ligand having n coordination sites takes the same atomic configuration through a 2π/n rotation operation.

In general, use of a polydentate ligand in which the distance from the center of the ligand to each coordination site is long provides a metal complex with a large inner space, and use of a ligand in which the distance from the center of the ligand to each coordination site is short provides a metal complex with a small inner space.

In one embodiment, the ligand has two coordination sites (bidentate ligand). In one embodiment, the ligand has three coordination sites (tridentate ligand). In one embodiment, the ligand has four coordination sites (tetradentate ligand). In one embodiment, the ligand has more than four coordination sites. In one embodiment, unshared electron pairs (orbits) at coordination sites in the ligand are present on pseudoidentical planes. In one embodiment, the ligand can have a coordination site at an end portion of the ligand. In one embodiment, the ligand can have a coordination site on an aromatic ring positioned at an end portion of the ligand.

In one embodiment, carbon atoms present in the center of gravity of the ligand or carbon atoms in aromatic rings included in the ligand can be electron-deficient. Herein, deficiency in electrons as compared with the electron density of unsubstituted benzene is called electron-deficient, and richness in electrons as compared with the electron density of unsubstituted benzene is called electron-rich. If atoms involved in formation of coordinate bonds in the ligand are linked to carbon atoms in a ring present in the center of gravity of the ligand or carbon atoms in aromatic rings included in the ligand to form a series of π conjugated systems, the carbon atoms in the ring present in the center of gravity of the ligand or the carbon atoms in the aromatic rings included in the ligand can be electron-deficient in the metal complex.

In one embodiment, the distance from the center of gravity of the ligand to the circumcircle of the ligand can be 6 to 10 Å.

In one embodiment, the structural formula of the metal complex can be the general formula $M_m L_n X_p$, wherein M is a metal molecule; L and X are each an aromatic compound containing a heteroatom; m in $M_m$ is 4 to 12; n in $L_n$ is 1 to 4; and p in $X_p$ is 0 to 3, and m, n, and p can be in any combination, and m:n:p can be preferably any of 4:1:0, 4:4:0, 6:1:0, 6:2:0, 6:2:3, 6:3:0, 6:4:0, 8:1:0, 8:2:0, 8:4:0, 10:1:0, 10:4:0, 12:2:0, 12:4:0, 16:2:0, 20:2:0, and so on.

In one embodiment, the metal complex of the present invention is represented by the following formula:

$$[M_6 L_4] \quad \text{Formula 1}$$

wherein M is a metal molecule, and L is a tridentate ligand represented by the following formula:

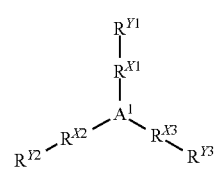

Formula 1L wherein $A^1$ represents an optionally substituted trivalent aliphatic group, carbocyclic group, heterocyclic group, or aromatic group;

$R^{X1}$, $R^{X2}$, and $R^{X3}$ each independently represent a single bond or a divalent organic group; and $R^{Y1}$, $R^{Y2}$, and $R^{Y3}$ each independently represent a monovalent organic group having a coordination site.

The metal complex represented by $[M_6 L_4]$ can include a wide variety of molecules, and hence is particularly preferred in the present invention.

In one embodiment of $[M_6 L_4]$, the metal molecule is selected from the group consisting of:

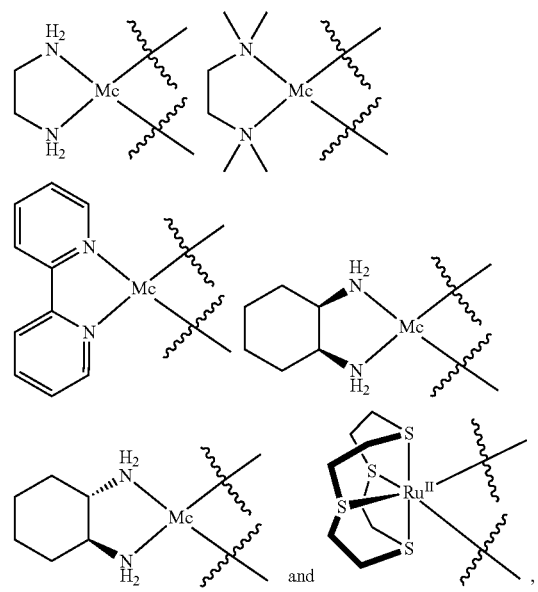

wherein Mc is palladium or platinum.

In one embodiment of [M₆L₄], the metal molecule is selected from the group consisting of:

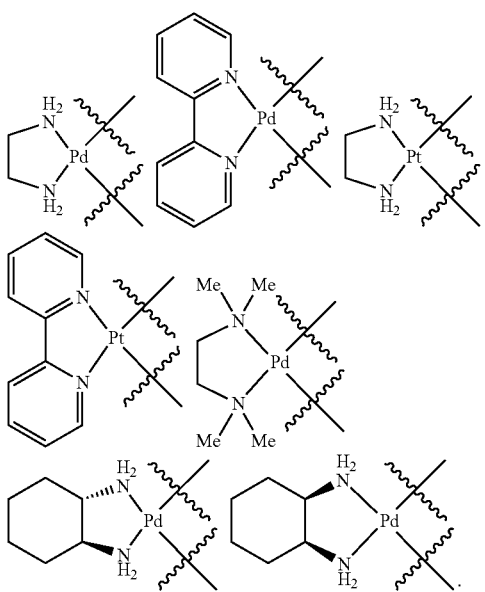

In one embodiment of [M₆L₄], the aliphatic group can be a $C_{1-6}$ alkyl group, a $C_{2-6}$ alkenyl group, or a $C_{2-6}$ alkynyl group.

In one embodiment of [M₆L₄], the carbocyclic group can be a $C_{3-7}$ cycloalkyl group, a $C_{3-7}$ cycloalkenyl group, or a $C_{4-7}$ cycloalkynyl group.

In one embodiment of [M₆L₄], the heterocyclic group can be a three- to seven-membered heterocycloalkyl group, a three- to seven-membered heterocycloalkenyl group, or a four- to seven-membered heterocycloalkynyl group.

In one embodiment of [M₆L₄], the aromatic group is a 6- to 26-membered aryl group or a 5- to 26-membered heteroaryl group, and this 5- to 26-membered heteroaryl group may contain one to five heteroatoms selected from N, O, and S.

In one embodiment of [M₆L₄], each of the divalent organic groups is a divalent group as one divalent group or a plurality of groups linked together, with the one divalent group or plurality of groups selected from the group consisting of the following (a) to (r):
(a) —NR$^a$—,
(b) —O—,
(c) —S—,
(d) —C(=O)O—,
(e) —C(=O)—,
(f) —C(=O)NR$^a$—,
(g) —C(=N—CN)—,
(h) —NR$^a$C(=O)O—,
(i) —S(=O)₂NR$^a$—,
(j) —NR$^a$C(=O)NR$^a$—,
(k) —NR$^a$S(=O)₂NR$^a$—,
(l) —S(=O)—,
(m) —S(=O)₂—,
(n) optionally substituted $C_{1-6}$ alkylene groups,
(o) optionally substituted $C_{2-6}$ alkenylene groups,
(p) optionally substituted $C_{2-6}$ alkynylene groups,
(q) optionally substituted arylene groups, and
(r) an optionally substituted adamantyl group,
wherein each R$^a$ is independently hydrogen or an optionally substituted $C_{1-6}$ aliphatic group.

Each of the divalent organic groups is preferably that capable of constituting a π-electron conjugated system together with A¹. A π-electron conjugated system constituted with the divalent organic groups represented by $R^{X1}$ to $R^{X3}$ enhances the planar character of the tridentate ligand represented by the formula 1L, facilitating formation of a firmer inner space of the metal complex. This applies to embodiments of other formulas.

The number of carbon atoms constituting each of the divalent organic groups is preferably 2 to 18, more preferably 2 to 12, and even more preferably 2 to 6.

In one embodiment of [M₆L₄], each of the monovalent organic groups having a coordination site is an optionally substituted $C_{2-6}$ alkyl group, an optionally substituted $C_{2-6}$ alkenyl group, an optionally substituted $C_{2-6}$ alkynyl group, an optionally substituted 6- to 26-membered aryl group, or an optionally substituted 5- to 26-membered heteroaryl group, and this 5- to 26-membered heteroaryl group may contain one to five heteroatoms selected from N, O, and S.

In one embodiment of [M₆L₄], each of the monovalent organic groups having a coordination site is an optionally substituted five- to six-membered monocyclic nitrogen-containing heteroaryl group.

In one embodiment of [M₆L₄], each of the monovalent organic groups having a coordination site is a 4-pyridyl group or a 3-pyridyl group.

In a preferred embodiment of [M₆L₄], the metal molecule is:

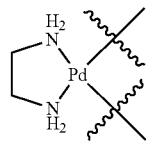

In another preferred embodiment of [M₆L₄], the metal molecule is:

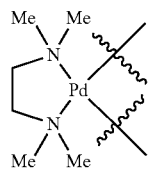

In still another preferred embodiment of [M₆L₄], the metal molecule is:

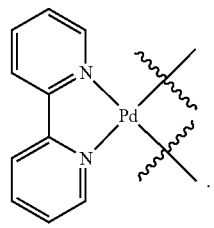

In yet another preferred embodiment of [M$_6$L$_4$], the metal molecule is:

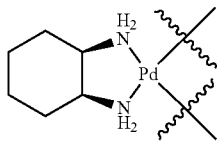

In still yet another preferred embodiment of [M$_6$L$_4$], the metal molecule is:

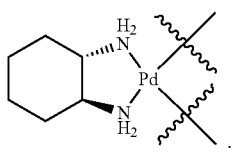

In further another preferred embodiment of [M$_6$L$_4$], the metal molecule is:

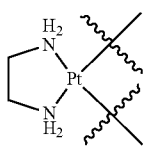

In a preferred embodiment of [M$_6$L$_4$], A$^1$ is a trivalent 1,3,5-triazine group.

In another preferred embodiment of [M$_6$L$_4$], A$^1$ is a trivalent phenyl group.

In still another preferred embodiment of [M$_6$L$_4$], A$^1$ is a trivalent pyrimidine group.

In yet another preferred embodiment of [M$_6$L$_4$], A$^1$ is a trivalent verdazyl group ([3,4-dihydro-1,2,4,5-tetrazin-1(2H)-yl] radical) represented by the following formula:

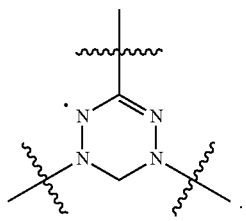

In a preferred embodiment of [M$_6$L$_4$], R$^{X1}$, R$^{X2}$, and R$^{X3}$ are each a single bond.

In another preferred embodiment of [M$_6$L$_4$], R$^{X1}$, R$^{X2}$, and R$^{X3}$ are each an ethynylene group (i.e., —C≡C—).

In still another preferred embodiment of [M$_6$L$_4$], R$^{X1}$, R$^{X2}$, and R$^{X3}$ are each a 1,4-phenylene group.

In another preferred embodiment of [M$_6$L$_4$], R$^{Y1}$, R$^{Y2}$, and R$^{Y3}$ are each a 4-pyridyl group.

In still another preferred embodiment of [M$_6$L$_4$], R$^{Y1}$, R$^{Y2}$, and R$^{Y3}$ are each 3-pyridyl.

Figure 3:
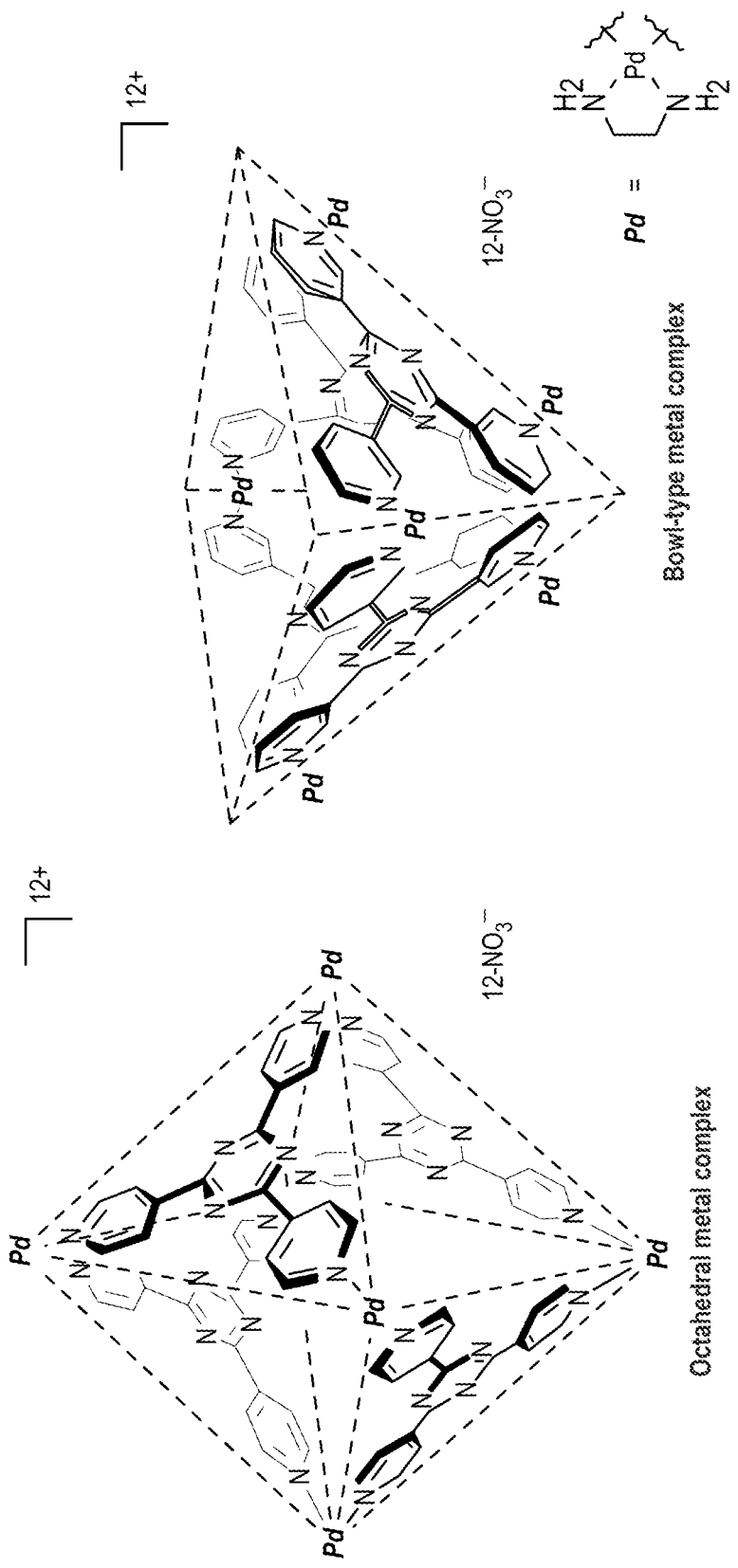
FIG. 3 shows an embodiment of a metal complex $[M_6L_4]$.

In a preferred embodiment of [M$_6$L$_4$], the preferred embodiments for M, preferred embodiments for A$^1$, preferred embodiments for R$^{X1}$, R$^{X2}$, and R$^{X3}$, and preferred embodiments for R$^{Y1}$, R$^{Y2}$, and R$^{Y3}$ described herein can be arbitrarily combined, and the combinations are also preferred embodiments of the present invention, and examples of such combined embodiments of the metal complex as shown in FIG. 3. However, the present invention is not limited thereto.

In one embodiment, the metal complex of the present invention is represented by the following formula:

[M$_8$L$_4$]    Formula 2 wherein M is a metal molecule having the same definition as the metal molecule in the formula 1, and L is a tridentate ligand represented by the following formula:

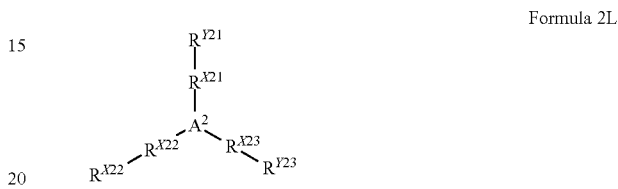

Formula 2L wherein A$^2$, R$^{X21}$, R$^{X22}$, R$^{X23}$, R$^{Y21}$, R$^{Y22}$, and R$^{Y23}$ have the same definitions as A$^1$, R$^{X1}$, R$^{X2}$, R$^{X3}$, R$^{Y1}$, R$^{Y2}$, and R$^{Y3}$ in the formula 1L, respectively.

In one embodiment of [M$_8$L$_4$], the aliphatic group is a C$_{1-6}$ alkyl group, a C$_{2-6}$ alkenyl group, or a C$_{2-6}$ alkynyl group.

In one embodiment of [M$_8$L$_4$], the carbocyclic group is a C$_{3-7}$ cycloalkyl group, a C$_{3-7}$ cycloalkenyl group, or a C$_{4-7}$ cycloalkynyl group.

In one embodiment of [M$_8$L$_4$], the heterocyclic group is a three- to seven-membered heterocycloalkyl group, a three- to seven-membered heterocycloalkenyl group, or a four- to seven-membered heterocycloalkynyl group.

In one embodiment of [M$_8$L$_4$], the aromatic group is a 6- to 26-membered aryl group or a 5- to 26-membered heteroaryl group, and this 5- to 26-membered heteroaryl group may contain one to five heteroatoms selected from N, O, and S.

In one embodiment of [M$_8$L$_4$], each of the divalent organic groups is a divalent group as one divalent group or a plurality of groups linked together, with the one divalent group or plurality of groups selected from the group consisting of the following (a) to (r):

(a) —NR$^a$—,
(b) —O—,
(c) —S—,
(d) —C(=O)O—,
(e) —C(=O)—,
(f) —C(=O)NR$^a$—,
(g) —C(=N—CN)—,
(h) —NR$^a$C(=O)O—,
(i) —S(=O)$_2$NR$^a$—,
(j) —NR$^a$C(=O)NR$^a$—,
(k) —NR$^a$S(=O)$_2$NR$^a$—,
(l) —S(=O)—,
(m) —S(=O)$_2$—,
(n) optionally substituted C$_{1-6}$ alkylene groups,
(o) optionally substituted C$_{2-6}$ alkenylene groups,
(p) optionally substituted C$_{2-6}$ alkynylene groups,
(q) optionally substituted arylene groups, and
(r) an optionally substituted adamantyl group, wherein each R$^a$ is independently hydrogen or an optionally substituted C$_{1-6}$ aliphatic group.

In one embodiment of [M$_8$L$_4$], each of the monovalent organic groups having a coordination site is an optionally substituted five- to six-membered monocyclic nitrogen-containing heteroaryl group.

In a preferred embodiment of [M$_8$L$_4$], A$^2$ is a trivalent pyrimidine group.

In another preferred embodiment of [M$_8$L$_4$], A$^2$ is a trivalent phenyl group.

In still another preferred embodiment of [M$_8$L$_4$], A$^2$ is a trivalent 1,3,5-triazine group.

In yet another preferred embodiment of [M$_8$L$_4$], A$^2$ is a trivalent verdazyl group ([3,4-dihydro-1,2,4,5-tetrazin-1(2H)-yl] radical).

In a preferred embodiment of [M$_8$L$_4$], R$^{X21}$, R$^{X22}$, and R$^{X23}$ are each a single bond.

In another preferred embodiment of [M$_8$L$_4$], R$^{X21}$, R$^{X22}$, and R$^{X23}$ are each an ethynylene group (i.e., —C≡C—).

In still another preferred embodiment of [M$_8$L$_4$], R$^{X21}$, R$^{X22}$, and R$^{X23}$ are each a 1,4-phenylene group.

In another preferred embodiment of [M$_8$L$_4$], any one of R$^{Y21}$, R$^{Y22}$, and R$^{Y23}$ is a pyrimidin-5-yl group, and the other two are each a 3-pyridyl group.

In a preferred embodiment of [M$_8$L$_4$], any one of R$^{Y21}$, R$^{Y22}$, and R$^{Y23}$ is a pyrimidin-5-yl group, and the other two are each a (1-methoxy-1-methylethan-1-yl)pyridin-5-yl group.

In another preferred embodiment of [M$_8$L$_4$], any one of R$^{Y21}$, R$^{Y22}$, and R$^{Y23}$ is a 2-methylpyrimidin-5-yl group, and the other two are each a 3-pyridyl group.

In a preferred embodiment of [M$_8$L$_4$], the metal molecule is selected from the group of metal molecules in the preferred embodiments of the formula 1.

Figure 4:
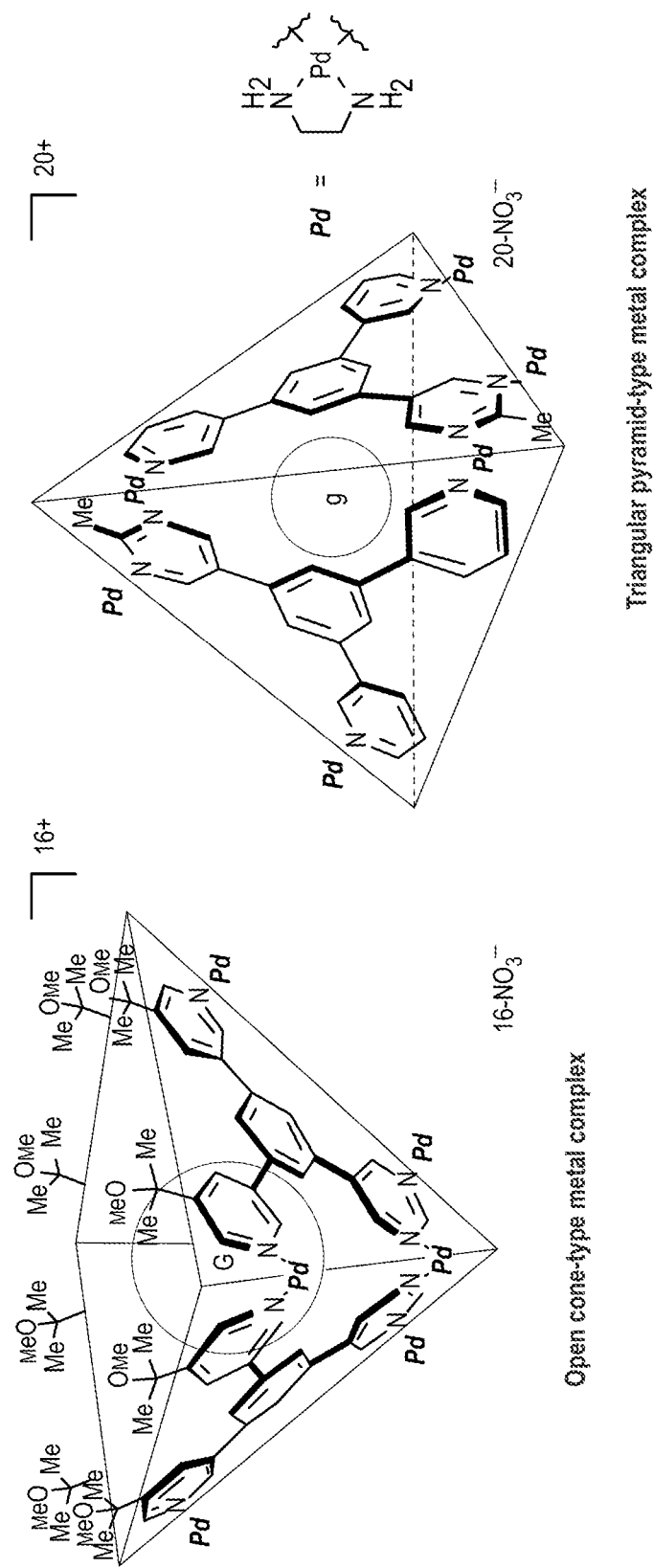
FIG. 4 shows an embodiment of a metal complex $[M_8L_4]$.

In a preferred embodiment of [M$_8$L$_4$], the preferred embodiments for M, preferred embodiments for A$^2$, preferred embodiments for R$^{X21}$, R$^{X22}$, and R$^{X23}$, and preferred embodiments for R$^{Y21}$, R$^{Y22}$, and R$^{Y23}$ described herein can be arbitrarily combined, respectively, and the combinations are also preferred embodiments of the present invention, and examples of such combined embodiments of the metal complex as shown in FIG. 4. However, the present invention is not limited thereto.

In one embodiment, the metal complex of the present invention is represented by the following formula:

[M$_6$L$_3$]      Formula 3 wherein M is a metal molecule having the same definition as the metal molecule in the formula 1, and L is a tetradentate ligand represented by the following formula:

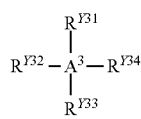

Formula 3L wherein A$^3$ represents an optionally substituted tetravalent group, and R$^{Y31}$, R$^{Y32}$, R$^{Y33}$, and R$^{Y34}$ each independently represent a monovalent organic group having a coordination site.

In one embodiment of [M$_6$L$_3$], each of the monovalent organic groups having a coordination site is an optionally substituted C$_{2-6}$ alkyl group, an optionally substituted C$_{2-6}$ alkenyl group, an optionally substituted C$_{2-6}$ alkynyl group, an optionally substituted 6- to 24-membered aryl group, or an optionally substituted 5- to 24-membered heteroaryl group, and this 5- to 24-membered heteroaryl group may contain one to five heteroatoms selected from N, O, and S.

In one embodiment of [M$_6$L$_3$], A$^3$ is a group having a porphyrin backbone.

In one embodiment of [M$_6$L$_3$], A$^3$ is a group having the following porphyrin backbone:

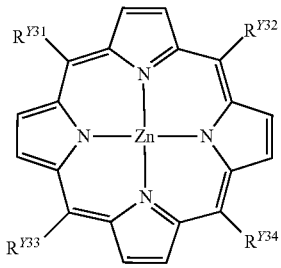

wherein R$^{Y1}$, R$^{Y2}$, R$^{Y3}$, and R$^{Y4}$ are each an optionally substituted 5- to 10-membered aryl group or an optionally substituted 5- to 10-membered heteroaryl group, and this 5- to 10-membered heteroaryl group may contain one to five heteroatoms selected from N, O, and S.

In a preferred embodiment of [M$_6$L$_3$], A$^3$ is a group having the following porphyrin backbone:

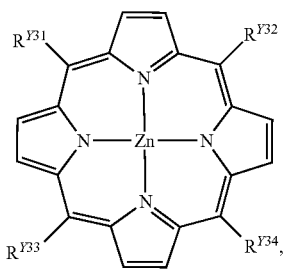

wherein R$^{Y31}$, R$^{Y32}$, R$^{Y33}$, and R$^{Y34}$ are each a 3-pyridyl group.

In a preferred embodiment of [M$_6$L$_3$], the metal molecule is selected from the group of metal molecules in the preferred embodiments of the formula 1.

In a preferred embodiment of [M$_6$L$_3$], the preferred embodiments for M, preferred embodiments for A$^3$, and preferred embodiments for R$^{Y31}$, R$^{Y32}$, R$^{Y33}$, and R$^{Y34}$ described herein can be arbitrarily combined, and the combinations are also preferred embodiments of the present invention, and an example of such combined embodiments of the metal complex as shown in FIG. 5. However, the present invention is not limited thereto.

In one embodiment, the metal complex of the present invention is represented by the following formula:

[M$_6$L$_2$X$_3$]      Formula 4 wherein M is a metal molecule having the same definition as the metal molecule in the formula 1, and L is a tridentate ligand represented by the following formula:

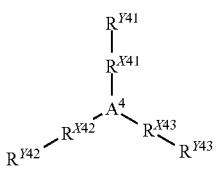

Formula 4L wherein $A^4$, $R^{X41}$, $R^{X42}$, $R^{X43}$, $R^{Y41}$, $R^{Y42}$, and $R^{Y43}$ have the same definitions as $A^1$, $R^{X1}$, $R^{X2}$, $R^{X3}$, $R^{Y1}$, $R^{Y2}$, and $R^{Y3}$ in the formula 1, respectively, X is an optionally substituted 5- to 26-membered heteroaryl group having a coordination site, or the bidentate ligand $X^4$ represented by the formula $R^{Y48}$—$R^{X47}$—$R^{Y48}$, $R^{X47}$ is a divalent organic group, and $R^{Y48}$ is a monovalent organic group having a coordination site.

In one embodiment of $[M_6L_2X_3]$, $R^{X47}$ is a single bond or a divalent group as one divalent group or a plurality of groups linked together, with the one divalent group or plurality of groups selected from the group consisting of the following (a) to (r):

(a) —$NR^a$—,
(b) —O—,
(c) —S—,
(d) —C(=O)O—,
(e) —C(=O)—,
(f) —C(=O)$NR^a$—,
(g) —C(=N—CN)—,
(h) —$NR^a$C(=O)O—,
(i) —S(=O)$_2NR^a$—,
(j) —$NR^a$C(=O)$NR^a$—,
(k) —$NR^a$S(=O)$_2NR^a$—,
(l) —S(=O)—,
(m) —S(=O)$_2$—,
(n) optionally substituted $C_{1-6}$ alkylene groups,
(o) optionally substituted $C_{2-6}$ alkenylene groups,
(p) optionally substituted $C_{2-6}$ alkynylene groups,
(q) optionally substituted arylene groups, and
(r) an optionally substituted adamantyl group, wherein each $R^a$ is independently hydrogen or an optionally substituted $C_{1-6}$ aliphatic group.

In one embodiment of $[M_6L_2X_3]$, each $R^{Y48}$ is independently an optionally substituted $C_{2-6}$ alkyl group, optionally substituted $C_{2-6}$ alkenyl group, optionally substituted $C_{2-6}$ alkynyl group, optionally substituted 6- to 26-membered aryl group or optionally substituted 5- to 26-membered heteroaryl group having a coordination site, and this 5- to 26-membered heteroaryl group may contain one to five heteroatoms selected from N, O, and S.

In one embodiment of $[M_6L_2X_3]$, $R^{Y48}$ is 4-pyridyl or 4-(2,6-dimethyl)pyridyl.

In one embodiment of $[M_6L_2X_3]$, X is selected from the group consisting of a dibenzopyrazine group, a 2,7-diazapyrene group, a pyrido[3,4-g]isoquinoline group, a phenanthroline group, an anthra[2,1,9-def:6,5,10-d'e'f']diisoquinoline group, a furan group,

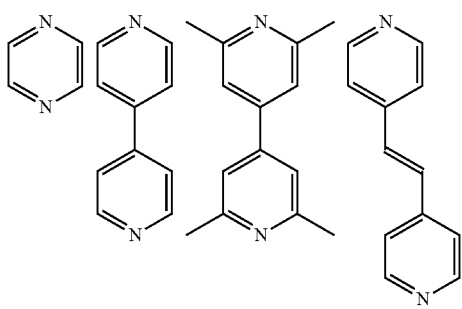

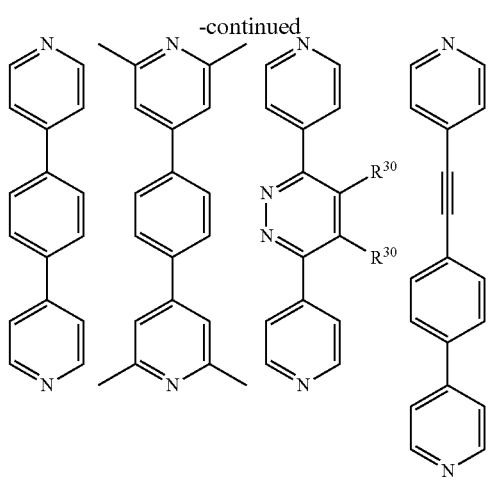

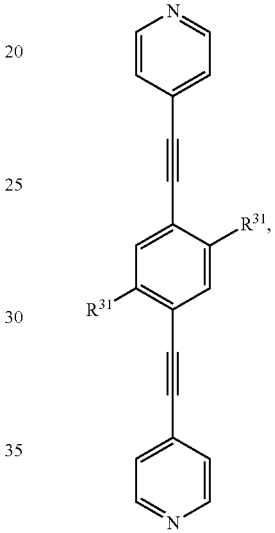

wherein $R^{30}$ and $R^{31}$ are each independently selected from the group consisting of —C(=O)O-(optionally substituted $C_{1-6}$ alkyl group), —C(=O)O-(optionally substituted $C_{1-6}$ alkylene group-O)$_k$— (optionally substituted $C_{1-6}$ alkyl group), —O-(optionally substituted $C_{1-6}$ alkylene group-O)$_k$-(optionally substituted $C_{1-6}$ alkyl group), —C(=O)NH—O-(optionally substituted $C_{1-6}$ alkyl group), and —C(=O)NH—O-(optionally substituted $C_{1-6}$ alkylene group-O)$_k$-(optionally substituted $C_{1-6}$ alkyl group), wherein each k is independently an integer of 1 to 5.

In one embodiment of $[M_6L_2X_3]$, $R^{X7}$ is selected from the group consisting of a single bond, an optionally substituted ethenyl group (—HC=CH—), an optionally substituted phenylene group, an optionally substituted heteroaryl group, —C≡C-(optionally substituted phenylene group)-, and —C=C— (optionally substituted phenylene group)-C≡C—.

In a preferred embodiment of $[M_6L_2X_3]$, X is pyrazine.

In a preferred embodiment of $[M_6L_2X_3]$, $R^{X47}$ is a single bond.

In another preferred embodiment of $[M_6L_2X_3]$, $R^{X47}$ is —HC=CH—.

In another preferred embodiment of $[M_6L_2X_3]$, $R^{X47}$ is a 1,4-phenylene group.

In still another preferred embodiment of [M₆L₂X₃], $R^{X47}$ is:

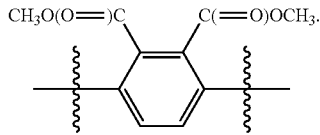

In yet another preferred embodiment of [M₆L₂X₃], $R^{X47}$ is:

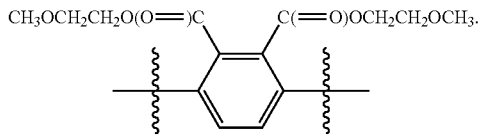

In further another preferred embodiment of [M₆L₂X₃], $R^{X47}$ is:

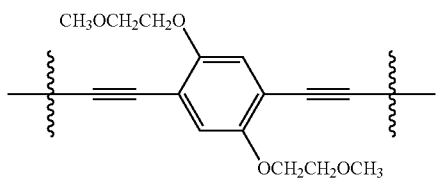

In yet another preferred embodiment of [M₆L₂X₃], $R^{X47}$ is —C≡C-(1,4-phenylene group)-.

In a preferred embodiment of [M₆L₂X₃], $R^{Y48}$ is 4-pyridyl.

In another preferred embodiment of [M₆L₂X₃], $R^{Y48}$ is 4-(2,6-dimethyl)pyridyl.

In a preferred embodiment of [M₆L₂X₃], M, A⁴, $R^{X41}$ to $R^{X43}$, and $R^{Y41}$ to $R^{Y43}$ are selected from the preferred embodiments for M, A¹, $R^{X1}$ to $R^{X3}$, and $R^{Y1}$ to $R^{Y3}$ in the formula 1, respectively.

Figure 6:
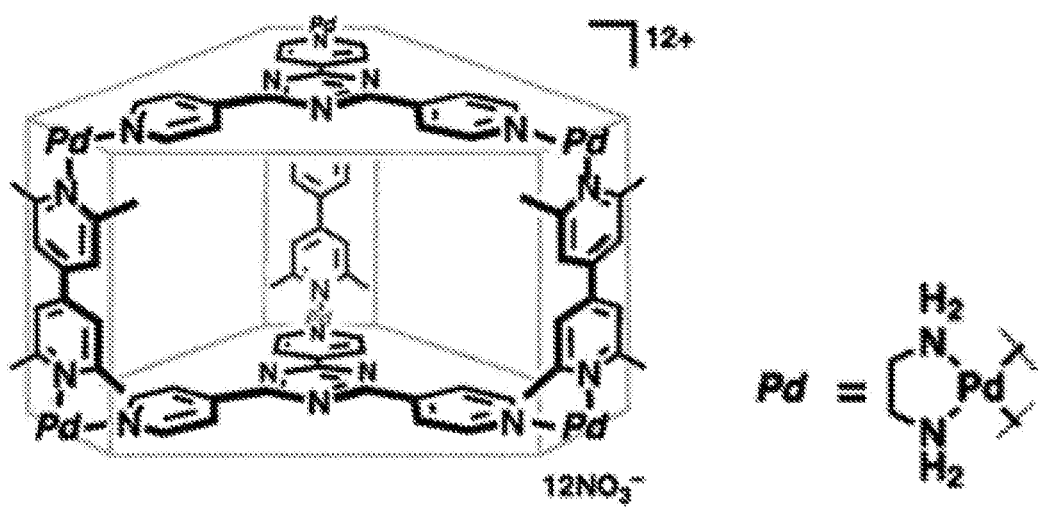
FIG. 6 shows an embodiment of a metal complex $[M_6L_2X_3]$.

In a preferred embodiment of [M₆L₂X₃], the preferred embodiments for M, preferred embodiments for A⁴, preferred embodiments for $R^{X41}$, $R^{X42}$, and $R^{X43}$, preferred embodiments for $R^{Y41}$, $R^{Y42}$, and $R^{Y43}$, preferred embodiments for X, preferred embodiments for $R^{X47}$, and preferred embodiments for $R^{Y48}$ described herein can be arbitrarily combined, and the combinations are also preferred embodiments of the present invention, and an example of such combined embodiments of the metal complex as shown in FIG. 6.

X is selected from the group consisting of:

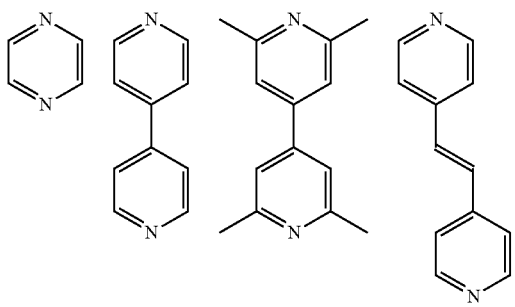

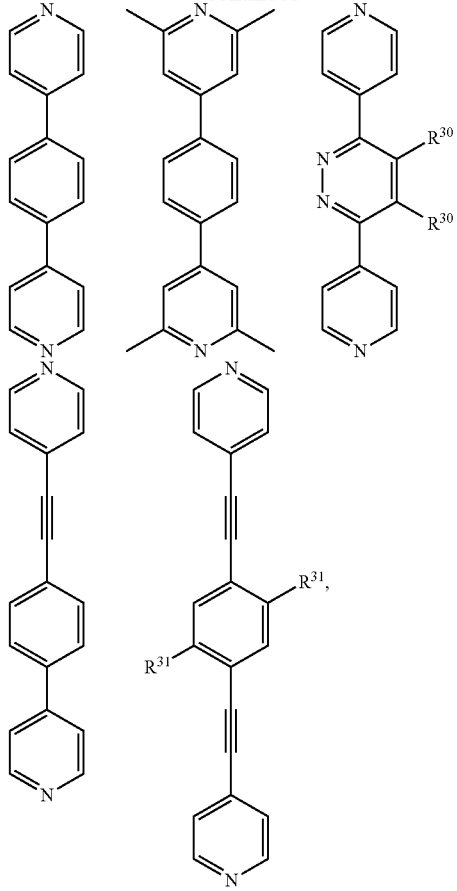

wherein $R^{30}$ is —CO₂CH₃ or —CO₂CH₂CH₂OCH₃, and $R^{31}$ is —OCH₂CH₂OCH₃. However, the present invention is not limited thereto.

In one embodiment, the metal complex of the present invention is represented by the following formula:

[M$_{2m}$L₁]   Formula 5 wherein M is a metal molecule having the same definition as the metal molecule in the formula 1, m is an integer of 2 or more, and L is a ligand with denticity of more than two represented by the following formula:

A⁵(—$R^{X58}$—$R^{Y58}$)₄   Formula 5L wherein A⁵ represents an optionally substituted tetravalent aromatic group,
$R^{X58}$ represents a divalent organic group, and
$R^{Y58}$ represents a monovalent organic group having a coordination site.

In one embodiment of [M$_{2m}$L₁], the tetravalent aromatic group is a 6- to 26-membered aryl group or a 5- to 26-membered heteroaryl group, and this 5- to 26-membered heteroaryl group may contain one to five heteroatoms selected from N, O, and S.

In one embodiment of [M$_{2m}$L₁], $R^{X58}$ is a divalent group as one divalent group or a plurality of groups linked together, with the one divalent group or plurality of groups selected from the group consisting of the following (a) to (r):

(a) —NR$^a$—,
(b) —O—,
(c) —S—,
(d) —C(=O)O—, (e) —C(=O)—,
(f) —C(=O)NR$^a$—,
(g) —C(=N—CN)—,
(h) —NR$^a$C(=O)O—,
(i) —S(=O)$_2$NR$^a$—,
(j) —NR$^a$C(=O)NR$^a$—,
(l) —S(=O)—,
(m) —S(=O)$_2$—,
(n) optionally substituted C$_{1-6}$ alkylene groups,
(o) optionally substituted C$_{2-6}$ alkenylene groups,
(p) optionally substituted C$_{2-6}$ alkynylene groups,
(q) optionally substituted arylene groups, and
(r) an optionally substituted adamantyl group,
wherein each R$^a$ is independently hydrogen or an optionally substituted C$_{1-6}$ aliphatic group, in one embodiment of [M$_{2m}$L$_1$], R$^{X58}$ is a divalent group as one divalent group or two or three groups linked together, with the one divalent group or two or three groups selected from the above (a) to (r), and each R$^a$ is independently hydrogen or an optionally substituted C$_{1-6}$ aliphatic group, and in one embodiment of [M$_{2m}$L$_1$], R$^{Y58}$ is -[optionally substituted heteroaryl group]m.

In one embodiment of [M$_{2m}$L$_1$], R$^{Y58}$ is a bipyridyl group, a terpyridyl group, a quaterpyridyl group, or a quinquepyridyl group.

In one embodiment of [M$_{2m}$L$_1$], A$^5$ is a phenyl group.

In a preferred embodiment of [M$_{2m}$L$_1$], R$^{X58}$ is —C(=O)O—CH$_2$—.

In a preferred embodiment of [M$_{2m}$L$_1$], m is 2, and R$^{Y58}$ is:

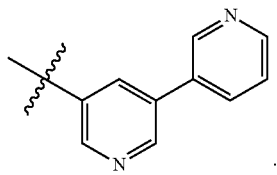 [SMILES: *c1cncc(-c2cccnc2)c1]

In another preferred embodiment of [M$_{2m}$L$_1$], m is 3, and R$^{Y58}$ is:

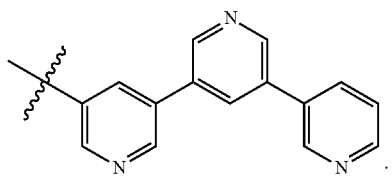 [SMILES: *c1cncc(-c2cncc(-c3cccnc3)c2)c1]

In still another preferred embodiment of [M$_{2m}$L$_1$], m is 4, and R$^{Y58}$ is:

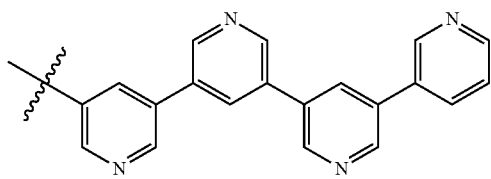 [SMILES: *c1cncc(-c2cncc(-c3cncc(-c4cccnc4)c3)c2)c1]

In yet another preferred embodiment of [M$_{2m}$L$_1$], m is 5, and R$^{Y58}$ is:

In a preferred embodiment of [M$_{2m}$L$_1$], the metal molecule is selected from the group of metal molecules in the preferred embodiments of the formula 1.

Figure 7:
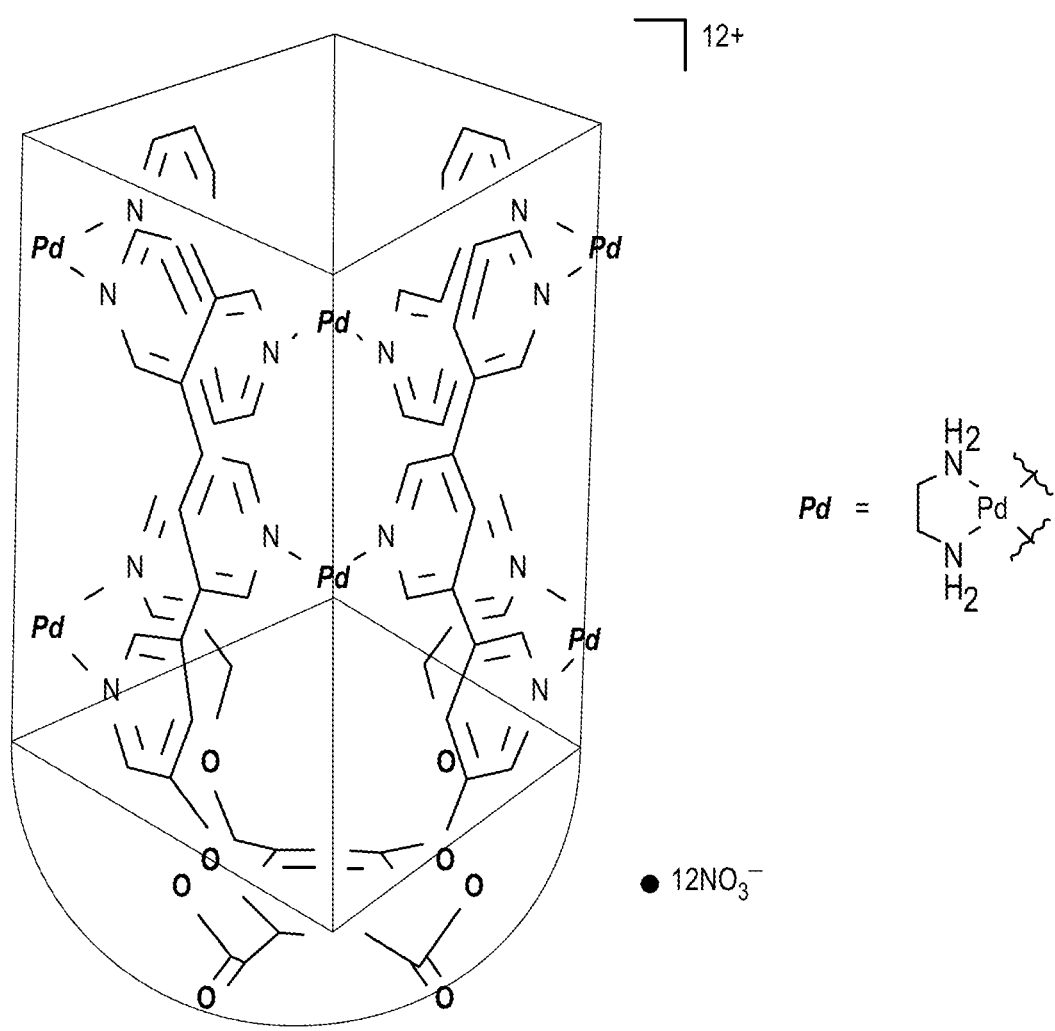
FIG. 7 shows an embodiment of a metal complex $[M_{2m}L_1]$.

In a preferred embodiment of [M$_{2m}$L$_1$], the preferred embodiments for M, preferred embodiments for m, preferred embodiments for A$^5$, preferred embodiments for R$^{X58}$, and preferred embodiments for R$^{Y58}$ described herein can be arbitrarily combined, and the combinations are also preferred embodiments of the present invention, and an example of such combined embodiments of the metal complex as shown in FIG. 7. However, the present invention is not limited thereto.

In one embodiment, the metal complex of the present invention is represented by the following formula:

[M$_{4m}$L$_2$]                    Formula 6 wherein M and L have the same definitions as for the above-described [M$_{2m}$L$_1$].

In a preferred embodiment of [M$_{4m}$L$_2$], M, m, A$^5$, R$^{X58}$, and R$^{Y58}$ are selected from M, m, A$^5$, R$^{X58}$, and R$^{Y58}$ in the preferred embodiments of [M$_{2m}$L$_1$], respectively.

Figure 8:
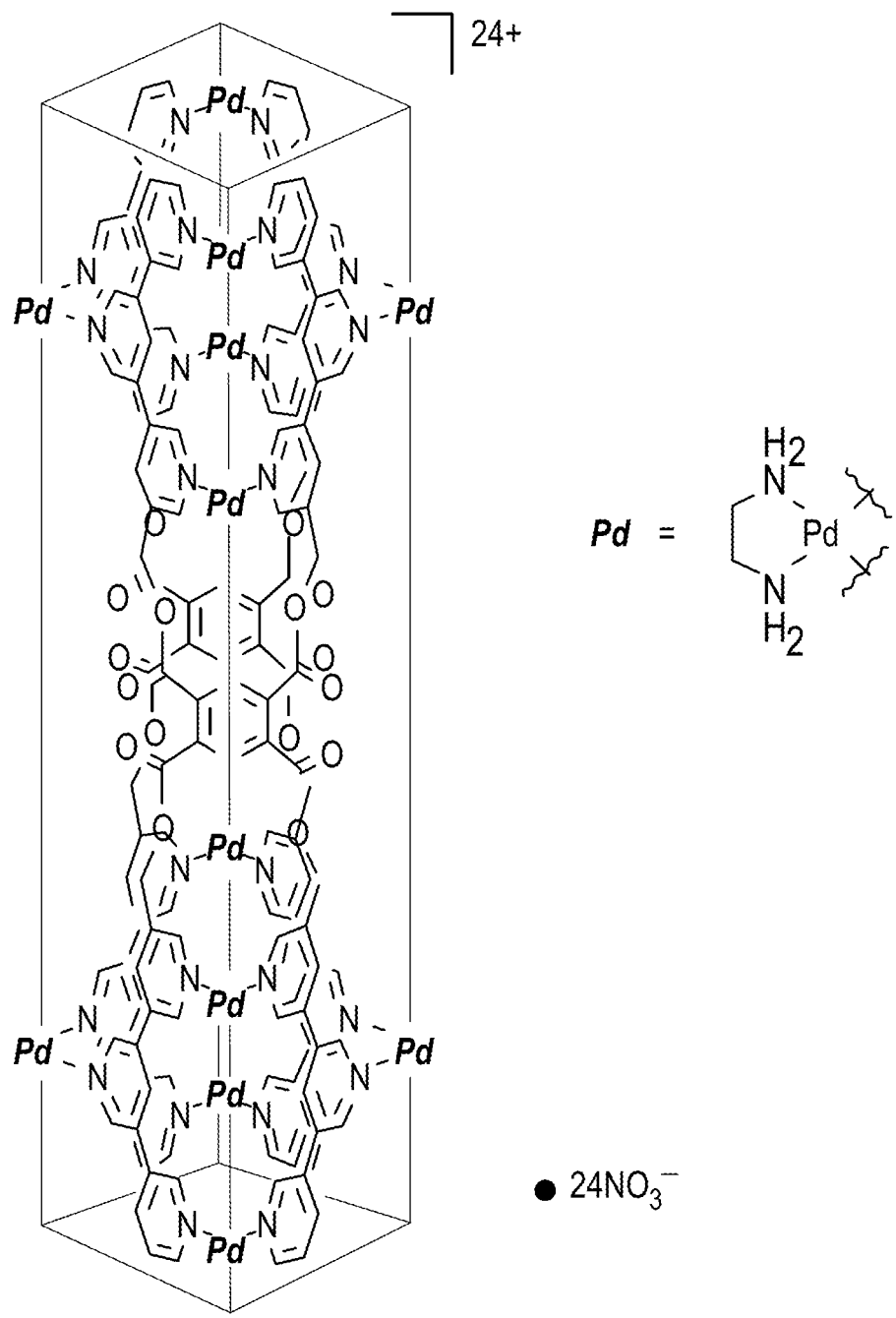
FIG. 8 shows an embodiment of a metal complex $[M_{4m}L_2]$.

In a preferred embodiment of [M$_{4m}$L$_2$], the preferred embodiments for M, preferred embodiments for m, preferred embodiments for A$^5$, preferred embodiments for R$^{X58}$, and preferred embodiments for R$^{Y58}$ described herein can be arbitrarily combined, and the combinations are also preferred embodiments of the present invention, and an example of such combined embodiments of the metal complex as shown in FIG. 8. However, the present invention is not limited thereto.

In one embodiment, the metal complex of the present invention is represented by the following formula:

[M$_{(2m+2)}$L$_4$] (nanotube-type)           Formula 7 wherein M is a metal molecule having the same definition as the metal molecule in the formula 1, m is an integer of 1 or more, and L is a monocyclic or fused polycyclic bidentate ligand or a polydentate ligand represented by the following formula:

R$^{Y78}$—R$^{X78}$—R$^{Y78}$                Formula 7L wherein R$^{X78}$ represents a single bond or an optionally substituted divalent organic group, wherein the divalent organic group may have a coordination site, and R$^{78}$ is a monovalent organic group having a coordination site.

In one embodiment of [M$_{(2m+2)}$L$_4$], L is a five- to six-membered monocyclic nitrogen-containing heteroaryl group.

In one embodiment of [M$_{(2m+2)}$L$_4$], R$^{X78}$ is a divalent group as one divalent group or a plurality of groups linked together, with the one divalent group or plurality of groups selected from the group consisting of the following (a) to (r):
(a) —NR$^a$—,
(b) —O—,
(c) —S—,
(d) —C(=O)O—,
(e) —C(=O)—,
(f) —C(=O)NR$^a$,
(g) —C(=N—CN)—, (h) —NR$^a$C(=O)O—,
(i) —S(=O)$_2$NR$^a$—,
(j) —NR$^a$C(=O)NR$^a$—,
(k) —NR$^a$S(=O)$_2$NR$^a$—,
(l) —S(=O)—,
(m) —S(=O)$_2$—,
(n) optionally substituted C$_{1-6}$ alkylene groups,
(o) optionally substituted C$_{2-6}$ alkenylene groups,
(p) optionally substituted C$_{2-6}$ alkynylene groups,
(q) optionally substituted arylene groups, and
(r) an optionally substituted adamantyl group,
wherein each R$^a$ is independently hydrogen or an optionally substituted C$_{1-6}$ aliphatic group.

In one embodiment of [M$_{(2m+2)}$L$_4$], R$^{X78}$ is a divalent group as one divalent group or two, three, four, five, or six groups linked together, with the one divalent group or two, three, four, five, or six groups selected from the above (a) to (r), and each R$^a$ is independently hydrogen or an optionally substituted C$_{1-6}$ aliphatic group.

In one embodiment of [M$_{(2m+2)}$L$_4$], R$^{Y78}$ is [optionally substituted five- to six-membered monocyclic nitrogen-containing heteroaryl group]$_y$, wherein y is an integer of 1 or more.

In a preferred embodiment of [M$_{(2m+2)}$L$_4$], L is pyrazine.
In a preferred embodiment of [M$_{(2m+2)}$L$_4$], R$^{X78}$ is a single bond.
In another preferred embodiment of [M$_{(2m+2)}$L$_4$], R$^{X78}$ is:

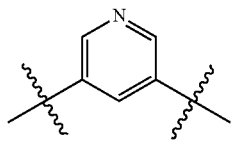 [SMILES: *c1cncc(*)c1]

In still another preferred embodiment of [M$_{(2m+2)}$L$_4$], R$^{X78}$ is:

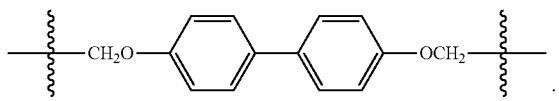

In yet another preferred embodiment of [M$_{(2m+2)}$L$_4$], R$^{X78}$ is 3-pyridyl.
In a preferred embodiment of [M$_{(2m+2)}$L$_4$], m is 1.
In another preferred embodiment of [M$_{(2m+2)}$L$_4$], m is 2.
In still another preferred embodiment of [M$_{(2m+2)}$L$_4$], m is 3.
In yet another preferred embodiment of [M$_{(2m+2)}$L$_4$], m is 4.
In a preferred embodiment of [M$_{(2m+2)}$L$_4$], z is 1.
In another preferred embodiment of [M$_{(2m+2)}$L$_4$], z is 2.
In still another preferred embodiment of [M$_{(2m+2)}$L$_4$], z is 3.
In yet another preferred embodiment of [M$_{(2m+2)}$L$_4$], z is 4.
In a preferred embodiment of [M$_{(2m+2)}$L$_4$], the metal molecule is selected from the group of the metal molecule in the preferred embodiments of the formula 1.

Figure 9:
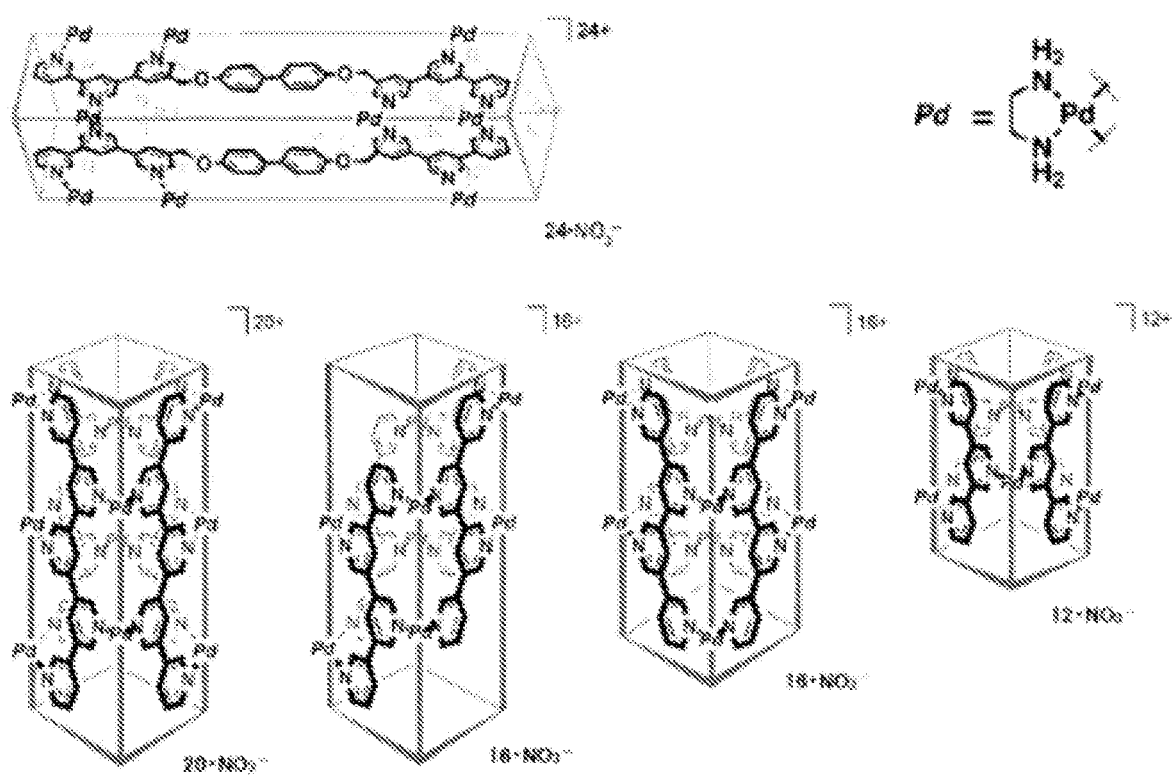
FIG. 9 shows an embodiment of a metal complex $[M_{(2m+2)}L_4]$.

In a preferred embodiment of [M$_{(2m+2)}$L$_4$], the preferred embodiments for M, preferred embodiments for m, preferred embodiments for L, preferred embodiments for R$^{X78}$, and preferred embodiments for R$^{Y78}$ described herein can be arbitrarily combined, and the combinations are also preferred embodiments of the present invention, and examples of such combined embodiments of the metal complex as shown in FIG. 9 and the below.

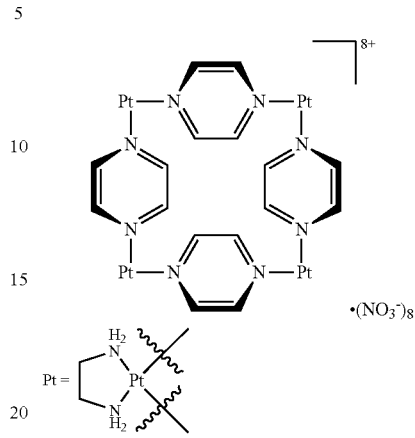

Tube-Type Metal Complex (Platinum)

However, the present invention is not limited thereto.
In one embodiment, the metal complex of the present invention is represented by the following formula:

[M$_6$L$_2$] (sandwich-type)      Formula 8 wherein M is a metal molecule, and L is a hexadentate ligand represented by the following formula:

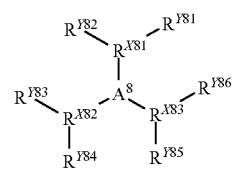

Formula 8L wherein A$^8$ represents an optionally substituted trivalent aromatic group,
R$^{X81}$, R$^{X82}$, and R$^{X83}$ each independently represent a trivalent organic group, and
R$^{Y81}$, R$^{Y82}$, R$^{Y83}$, R$^{Y84}$, R$^{Y85}$, and R$^{Y86}$ each independently represent a monovalent organic group having a coordination site.

In one embodiment of the formula 8, the aromatic group is an optionally substituted 5- to 10-membered aryl group or an optionally substituted 5- to 10-membered heteroaryl group, and this 5- to 10-membered heteroaryl group may contain one to five heteroatoms selected from N, O, and S.

In one embodiment of the formula 8, each of the trivalent organic groups is an optionally substituted trivalent C$_{1-6}$ alkyl group, an optionally substituted trivalent C$_{2-6}$ alkenyl group, an optionally substituted trivalent C$_{2-6}$ alkynyl group, an optionally substituted 5- to 10-membered aryl group, or an optionally substituted 5- to 10-membered heteroaryl group, and this optionally substituted 5- to 10-membered heteroaryl group may contain one to five heteroatoms selected from N, O, and S.

In one embodiment of the formula 8, each of the monovalent organic groups having a coordination site is an optionally substituted 5- to 10-membered aryl group or an optionally substituted 5- to 10-membered heteroaryl group, and this 5- to 10-membered heteroaryl group may contain one to five heteroatoms selected from N, O, and S.

In one embodiment of the formula 8, each of the monovalent organic groups having a coordination site is a 3-pyridyl group or a 4-pyridyl group.

In a preferred embodiment of the formula 8, $A^8$ is a phenyl group.

In a preferred embodiment of the formula 8, $R^{X81}$, $R^{X82}$, and $R^{X83}$ are each a phenyl group.

In a preferred embodiment of the formula 8, $R^{Y81}$, $R^{Y82}$, $R^{Y83}$, $R^{Y84}$, $R^{Y85}$, and $R^{Y86}$ are each a 3-pyridyl group.

In a preferred embodiment of the formula 8, L is:

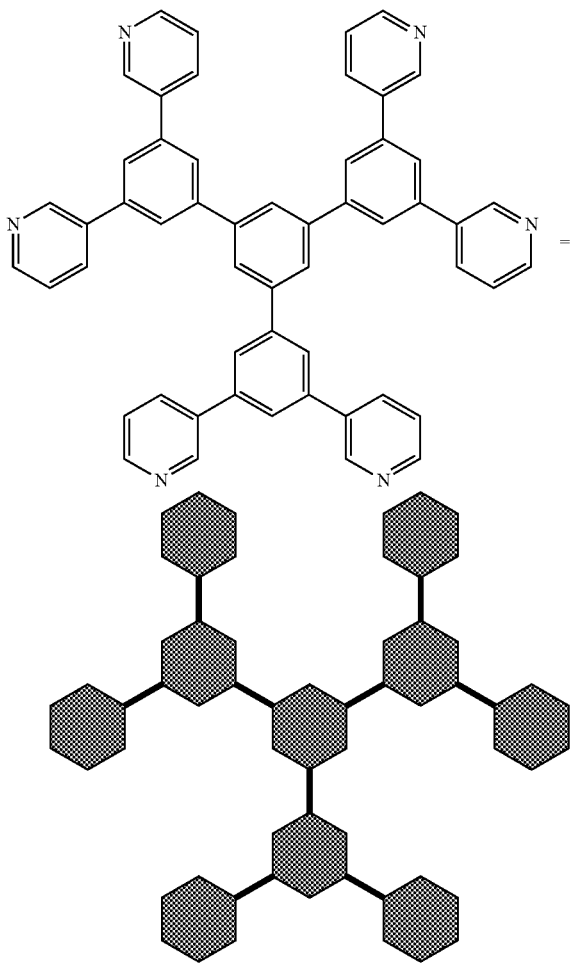

In a preferred embodiment of the formula 8, the metal molecule is selected from the group of metal molecules in the preferred embodiments of the formula 1.

Figure 10:
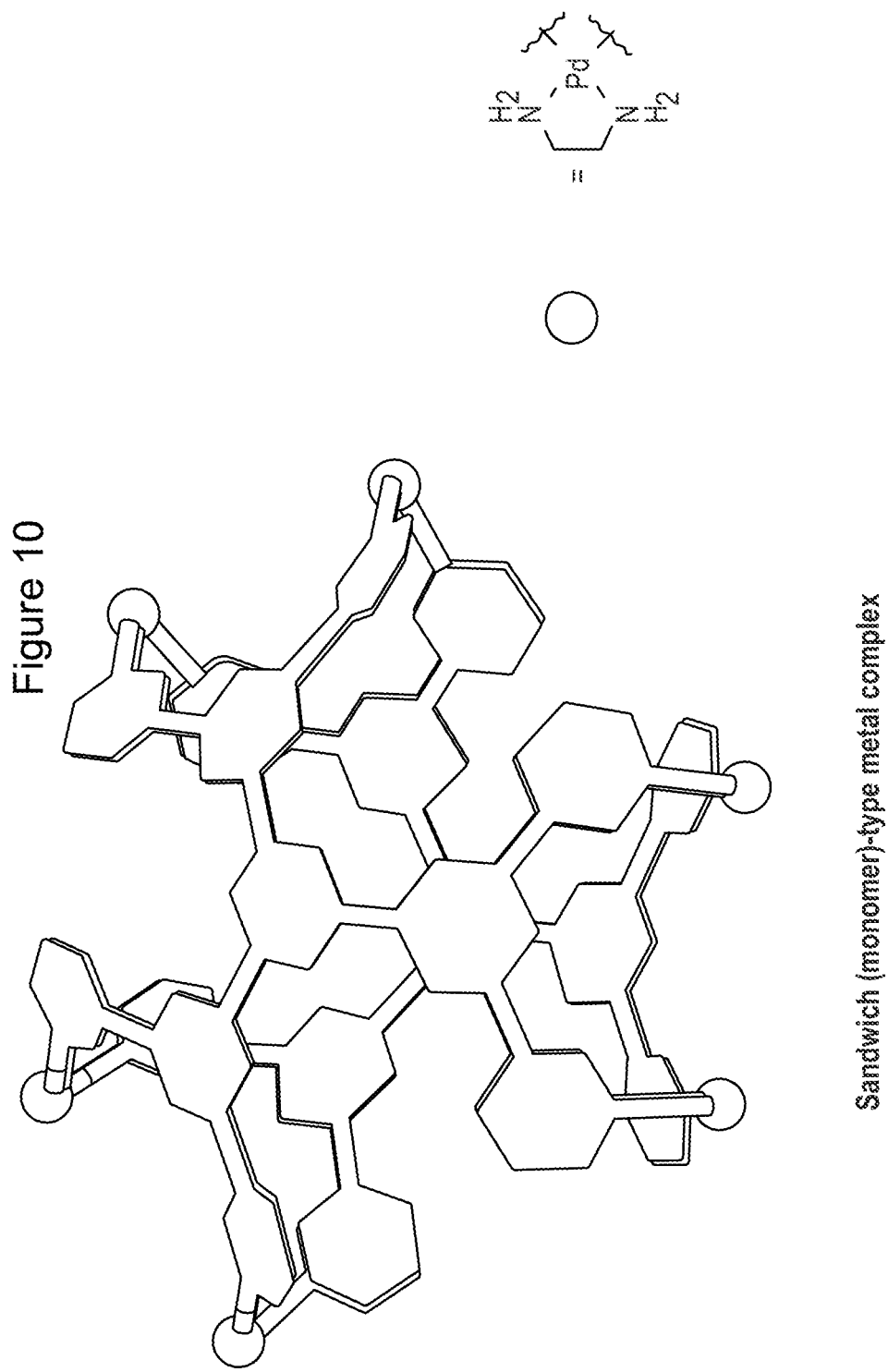
FIG. 10 shows an example of a metal complex.

In a preferred embodiment of the formula 8, the preferred embodiments for $A^8$, preferred embodiments for $R^{X81}$ to $R^{X83}$, and preferred embodiments for $R^{Y81}$ to $R^{Y86}$ described herein can be arbitrarily combined, and the combinations are also preferred embodiments of the present invention, and an example of such combined embodiments of the metal complex is schematically shown in FIG. 10. However, the present invention is not limited thereto.

In one embodiment, the metal complex of the present invention is represented by the following formula:

$[M_{12}L_4]$ (sandwich dimer-type)     Formula 9 wherein M is a metal molecule, and L is a hexadentate ligand represented by the following formula:

Sandwich (Monomer)-Type Metal Complex

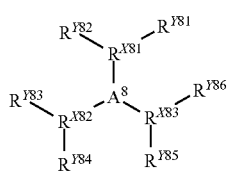

Formula 8L wherein $A^8$, $R^{X81}$ to $R^{X83}$, and $R^{Y81}$ to $R^{Y86}$ are as defined for the formula 8, $[M_6L_2]$(sandwich-type).

In a preferred embodiment of the formula 9, M, $A^8$, $R^{X81}$ to $R^{X83}$, and $R^{Y81}$ to $R^{Y86}$ are selected from $A^8$, $R^{X81}$ to $R^{X83}$, and $R^{Y81}$ to $R^{Y86}$ in the preferred embodiments of the formula 8, respectively.

Figure 11:
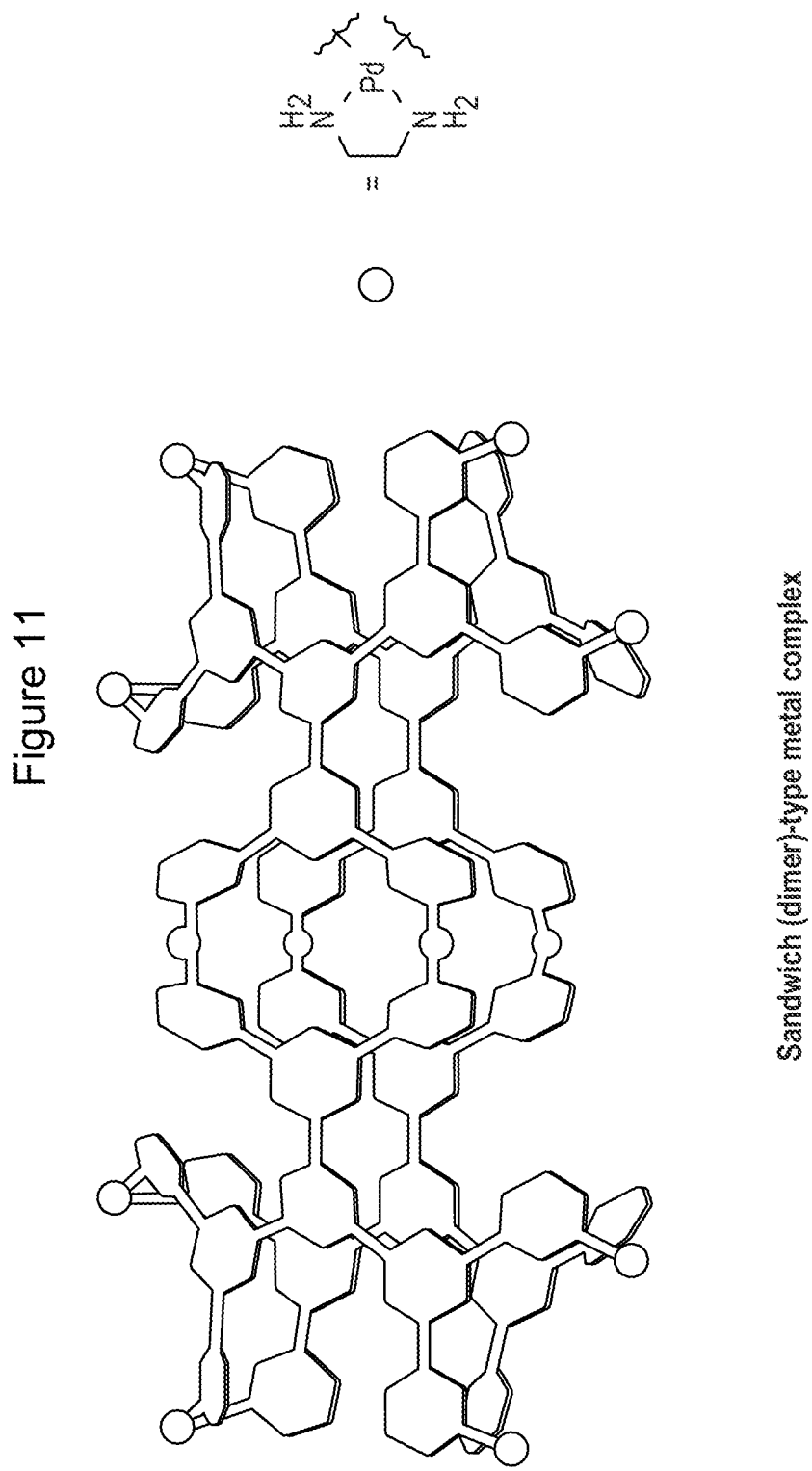
FIG. 11 shows an example of a metal complex.

In a preferred embodiments of the formula 9, the preferred embodiments for M, preferred embodiments for $A^8$, preferred embodiments for $R^{X81}$ to $R^{X83}$, and preferred embodiments for $R^{Y81}$ to $R^{Y86}$ described herein can be arbitrarily combined, and the combinations are also preferred embodiments of the present invention, and an example of such combined embodiments of the metal complex is schematically shown in FIG. 11. However, the present invention is not limited thereto.

In some embodiments, each aliphatic group or heteroaliphatic group or heterocycle can include one or more substituents. An appropriate substituent on a saturated carbon in each aliphatic group or heteroaliphatic group or heterocycle is selected from the group of the above-listed substituents for the groups defined as "optionally substituted" or "substituted", and =O, =S, =NNHR*, =NN(R*)$_2$, =NNHC(=O)R*, =NNHC(=O)O($C_{1-6}$ alkyl group), =NNHS(=O)$_2$($C_{1-6}$ alkyl group), and =NR* are further included in the group, wherein each R* is independently selected from hydrogen and optionally substituted $C_{1-8}$ aliphatic groups. Any substituent on the aliphatic group of R* is selected from —NH$_2$, —NH($C_{1-4}$ aliphatic group), —N($C_{1-4}$ aliphatic group)$_2$, halogens, $C_{1-4}$ aliphatic groups, —OH, —O($C_{1-4}$ aliphatic group), —NO$_2$, —CN, —C(=O)OH, —C(=O)O($C_{1-4}$ aliphatic group), —C(=O)NH$_2$, —C(=O)NH($C_{1-4}$ aliphatic group), —C(=O)N($C_{1-4}$ aliphatic group)$_2$, —O(halo-$C_{1-4}$ aliphatic group), and halo($C_{1-4}$ aliphatic group), wherein each of the aforementioned $C_{1-4}$ aliphatic groups of R* is unsubstituted, or two R* groups on the same nitrogen together with the nitrogen form a five- to eight-membered heterocyclyl ring or heteroaryl ring having one to three heteroatoms each independently selected from nitrogen, oxygen, and sulfur.

In some embodiments, examples of substituents on nitrogen in a heterocycle include —R$^+$, —N(R$^+$)$_2$, —C(=O)R$^+$, —C(=O)OR$^+$, —C(=O)C(=O)R$^+$, —C(=O)CH$_2$C(=O)R$^+$, —S(=O)$_2$R$^+$, —S(=O)$_2$N(R$^+$)$_2$, —C(=S)N(R$^+$)$_2$, —C(=NH)—N(R$^+$)$_2$, and —NR$^+$S(=O)$_2$R$^+$, wherein R$^+$ is hydrogen, an optionally substituted $C_{1-6}$ aliphatic group, optionally substituted phenyl, optionally substituted —O(Ph), optionally substituted —CH$_2$(Ph), optionally substituted —(CH$_2$)$_{1-2}$(Ph), optionally substituted —CH=CH(Ph), or an unsubstituted five- to six-membered heteroaryl group or heterocyclic group having one to four heteroatoms each independently selected from oxygen, nitrogen, and sulfur, or two R$^+$ groups present on the same substituent or each independently present on different substituents together with the atoms to which the R$^+$ groups bond form a five- to eight-membered heterocyclyl, aryl, or heteroaryl ring, or a three- to eight-membered cycloalkyl ring, wherein the heteroaryl group or heterocyclyl ring has one to three heteroatoms each independently selected from nitrogen, oxygen, and sulfur. Any substituent on the aliphatic group or phenyl ring of $R^+$ is selected from —$NH_2$, —$NH(C_{1-4}$ aliphatic group), —$N(C_{1-4}$ aliphatic group)$_2$, halogens, $C_{1-4}$ aliphatic groups, —OH, —O($C_{1-4}$ aliphatic group), —$NO_2$, —CN, —C(=O)OH, —C(=O)O($C_{1-4}$ aliphatic group), —O(halo ($C_{1-4}$ aliphatic group)), and halo($C_{1-4}$ aliphatic group), wherein each of the aforementioned $C_{1-4}$ aliphatic groups of $R^+$ is unsubstituted.

The compound of the present invention has one or more chiral centers, and hence such a compound (and an intermediate thereof) can exist, for example, as a racemic mixture; a pure stereoisomer (i.e., an enantiomer or a diastereomer); or a mixture enriched with a stereoisomer. Chiral compounds shown or termed herein without any three-dimensional configuration defined by a chiral center are intended to include, unless otherwise described, any or all possible modified forms of stereoisomers at a stereocenter not defined. Presenting or terming a specific stereoisomer indicates, unless otherwise described, that the stereocenter shown has the specified three-dimensional configuration under the understanding that very small amounts of other stereoisomers can be also present; however, the usefulness of the presented or termed compound is not excluded by the presence of another stereoisomer.

The compound of a formula (I) contains some basic groups (e.g., an amino group), and such a compound can be exist as a free base, or in various forms of salts, for example, in the form of a monoprotonated salt, in the form of a diprotonated salt, in the form of a triprotonated salt, or as a mixture of them. Unless otherwise described, all of these forms are included in the scope of the present invention.

The present invention includes isotope-labeled compounds of the formula (I), that is, compounds of the formula (I) with an atom replaced with an atom having the same atomic number but having an atomic mass differing from the atomic mass prevailing in nature or enriched with such atoms. Examples of isotopes that can be incorporated in the compound of the formula (I) include, but are not limited to, $^2H$, $^3H$, $^{11}C$, $^{13}C$, $^{14}C$, $^{13}N$, $^{15}N$, $^{15}O$, $^{17}O$, $^{18}O$, $^{35}S$, $^{36}Cl$, and $^{18}F$. Particularly targeted is a compound of the formula (I) enriched with tritium or carbon-14, and this compound can be used, for example, for tissue distribution study. Also particularly targeted is a compound of the formula (I) enriched with deuterium particularly in a site of metabolism, and this compound is expected to have higher metabolic stability. Further particularly targeted is a compound of the formula (I) enriched with a positron-emitting isotope (such as $^{11}C$, $^{18}F$, $^{15}O$, and $^{13}N$), and this compound can be used, for example, for positron emission tomography (PET) study.

In one embodiment, the structure of the ligand is selected from the group consisting of the followings:

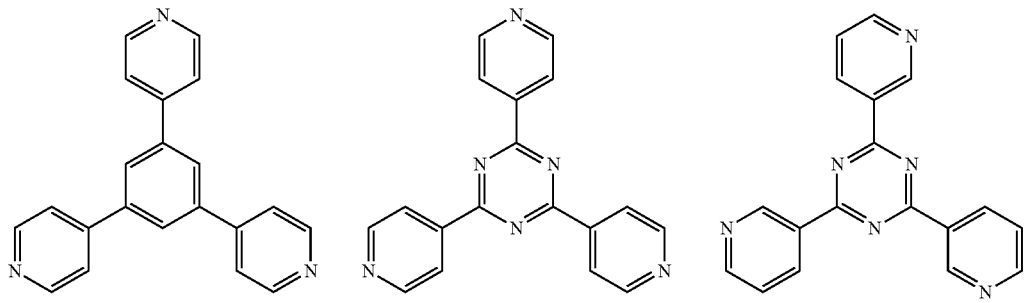

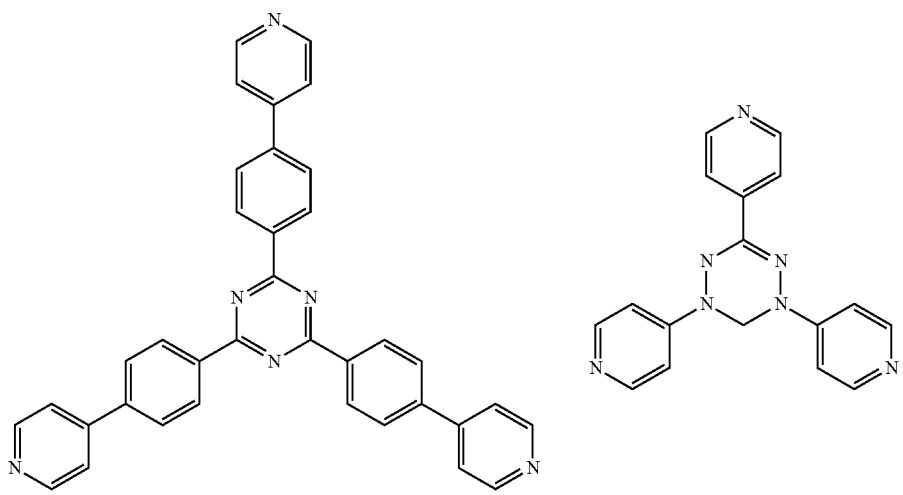

-continued
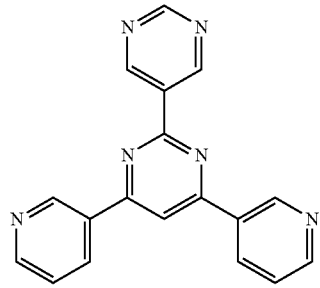
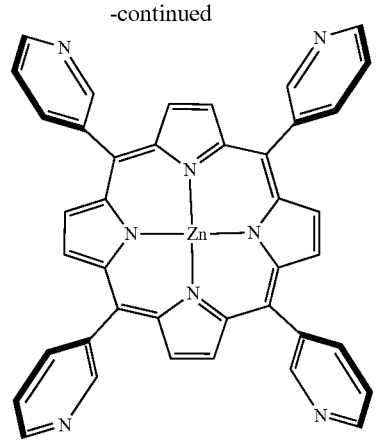
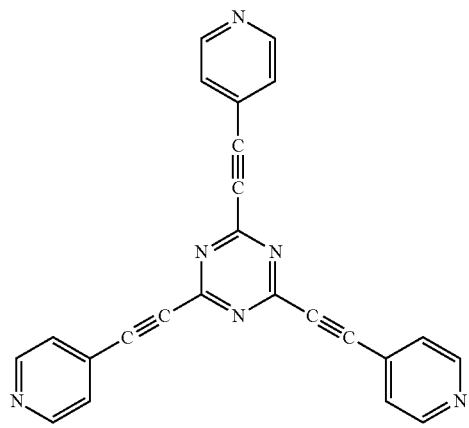
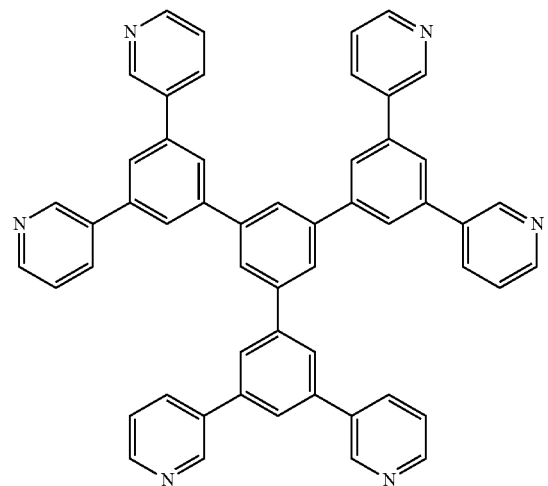
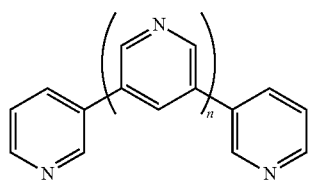
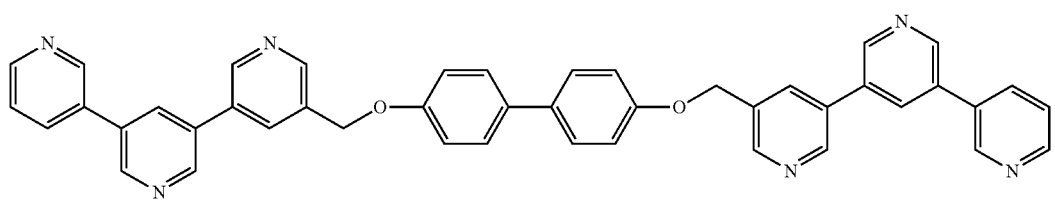
wherein n is 0, 1, 2, or 3.

Figure 12:
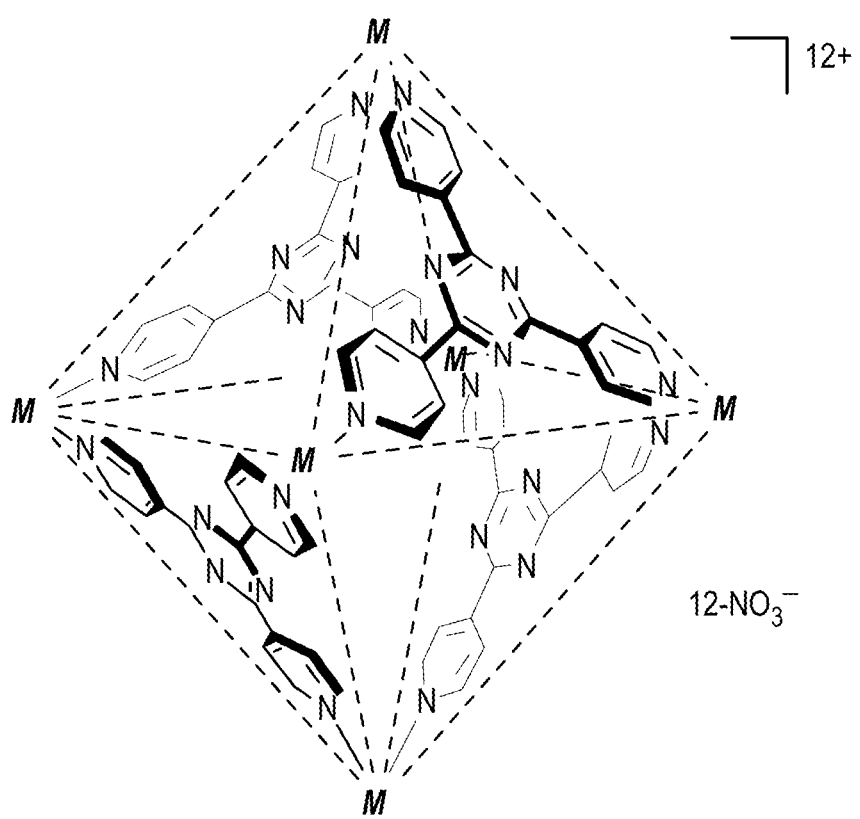
FIG. 12 shows an example of a metal complex.

A preferred metal complex of the present invention has the structure as shown in FIG. 12:

In FIG. 12, M is a metal molecule, and selected from the group consisting of:

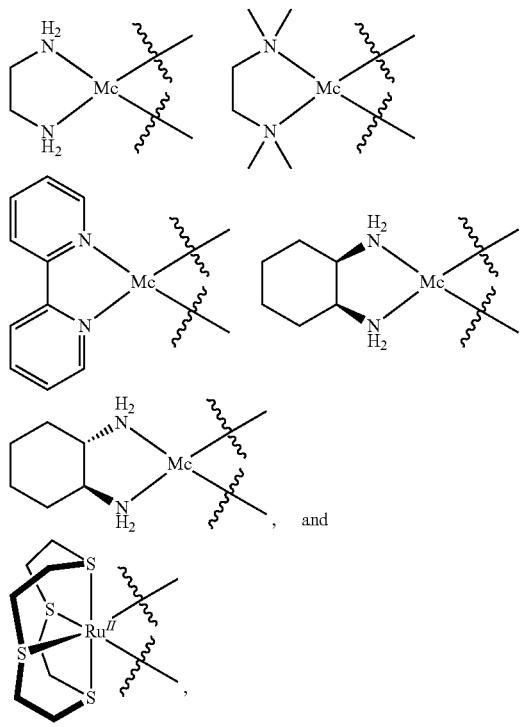

and Mc is Pd or Pt.

Figure 13:
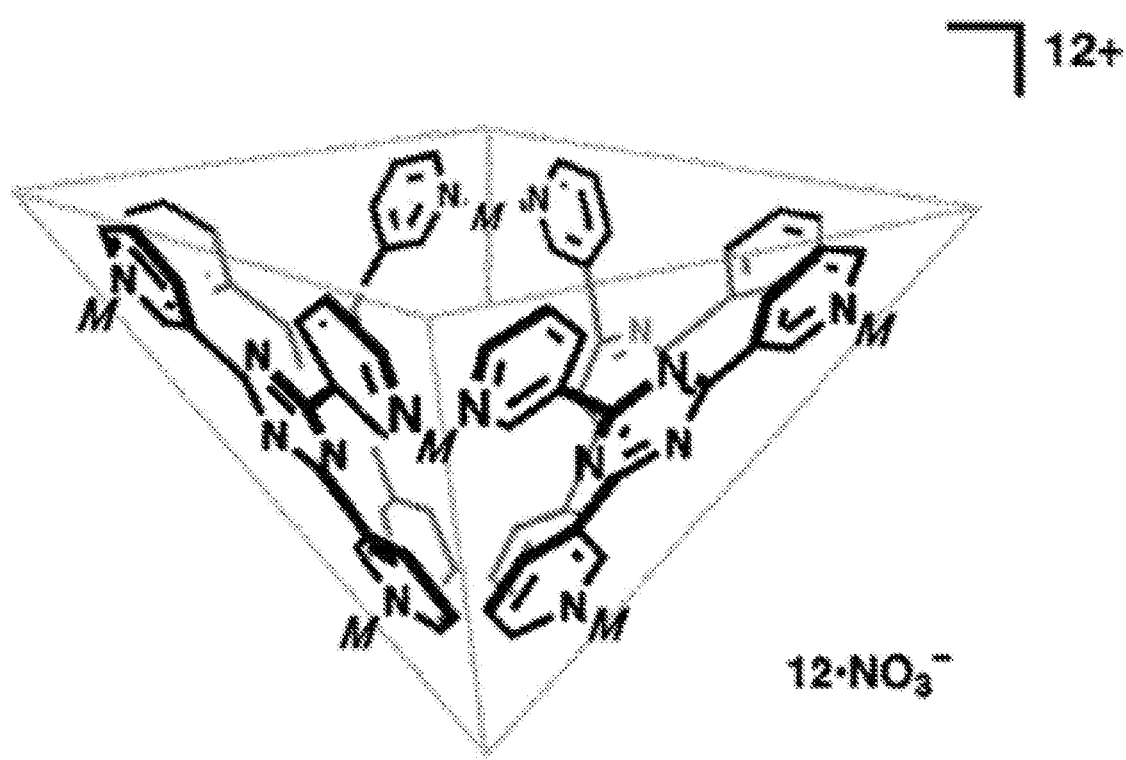
FIG. 13 shows an example of a metal complex.

Another preferred metal complex of the present invention has the structure as shown in FIG. 13.

Figure 14:
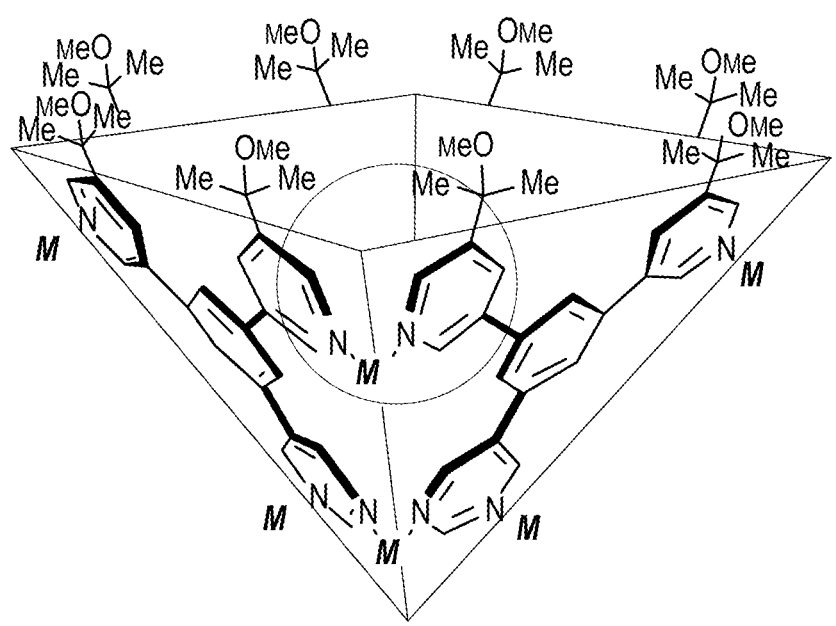
FIG. 14 shows an example of a metal complex.

In FIG. 13, M is the above metal molecule, and Mc is palladium or platinum. In one embodiment, the pyridyl group of the ligand is optionally substituted. Specific examples of the ligand the pyridyl group of which is substituted include:

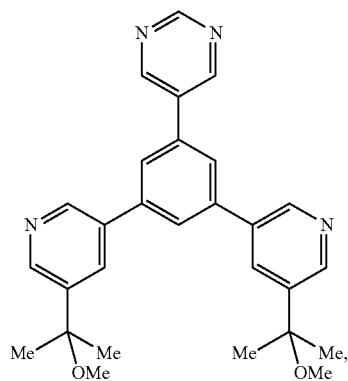 [SMILES: COC(C)(C)c1cncc(-c2cc(-c3cncnc3)cc(-c3cncc(C(C)(C)OC)c3)c2)c1]

and this ligand forms the metal complex as shown in FIG. 14.

Figure 15:
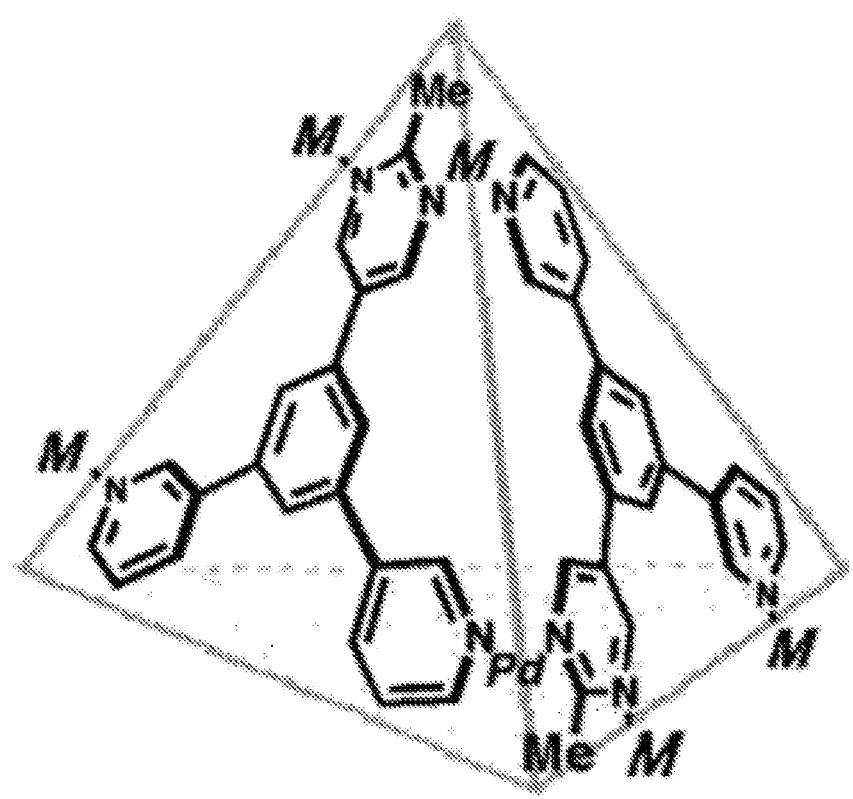
FIG. 15 shows an example of a metal complex.

Another preferred metal complex of the present invention has a structure obtained from a tetrahedron formed by four molecules of the following:

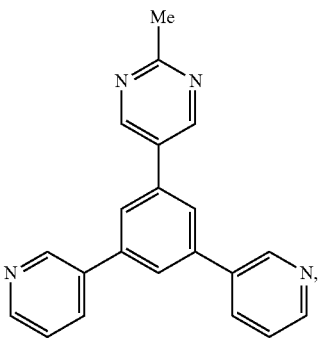 [SMILES: Cc1ncc(-c2cc(-c3cccnc3)cc(-c3cccnc3)c2)cn1]

the structure as shown in FIG. 15.

In FIG. 15, M is the above metal molecule, and Mc is as defined above.

Figure 16:
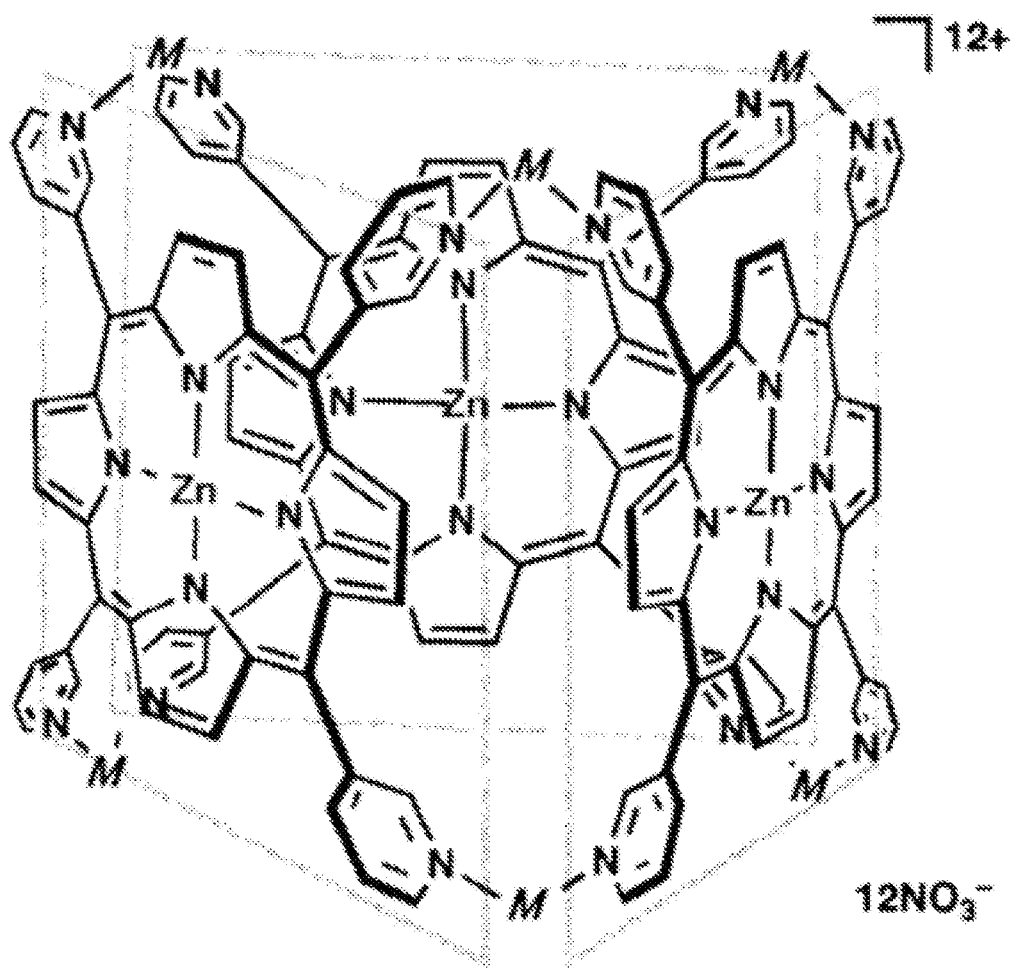
FIG. 16 shows an example of a metal complex.

Still another preferred metal complex of the present invention has the structure as shown in FIG. 16.

In FIG. 16, M is the above metal molecule, and Mc is as defined above.

Figure 17:
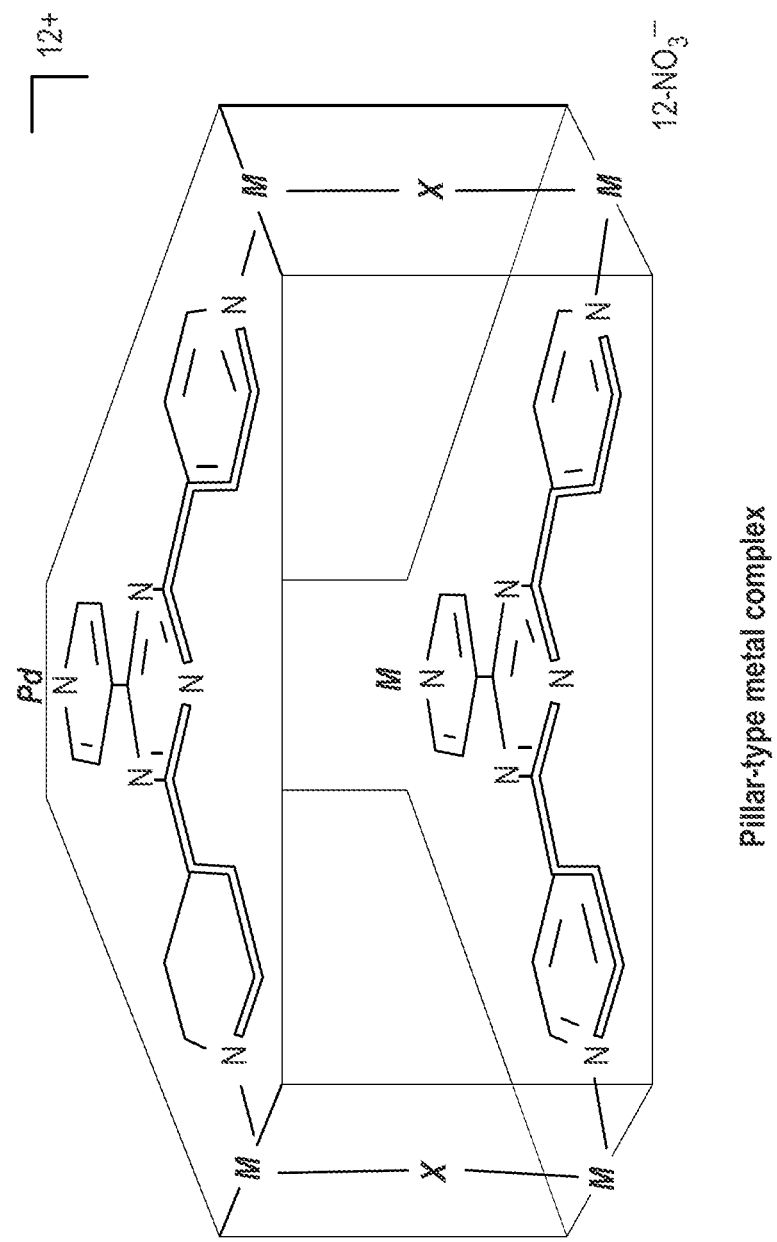
FIG. 17 shows an example of a metal complex.

Yet another preferred metal complex of the present invention has the structure as shown in FIG. 17.

In FIG. 17, M is the above metal molecule, and Mc is as defined above, and X is selected from the group consisting of:

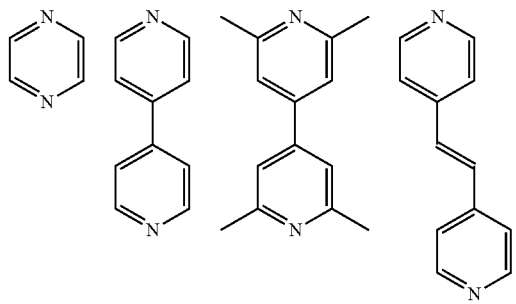

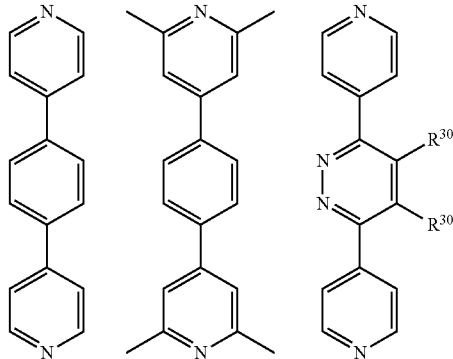

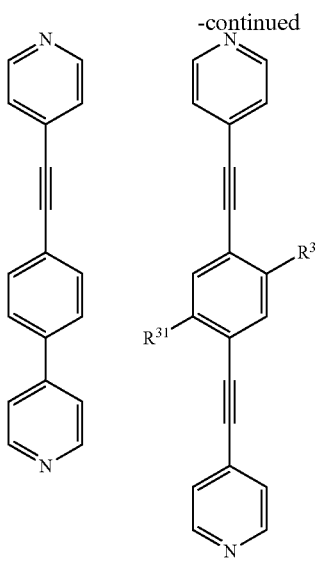

wherein $R^{30}$ is —$CO_2CH_3$ or —$CO_2CH_2CH_2OCH_3$, and $R^{31}$ is —$OCH_2CH_2OCH_3$.

Figure 18:
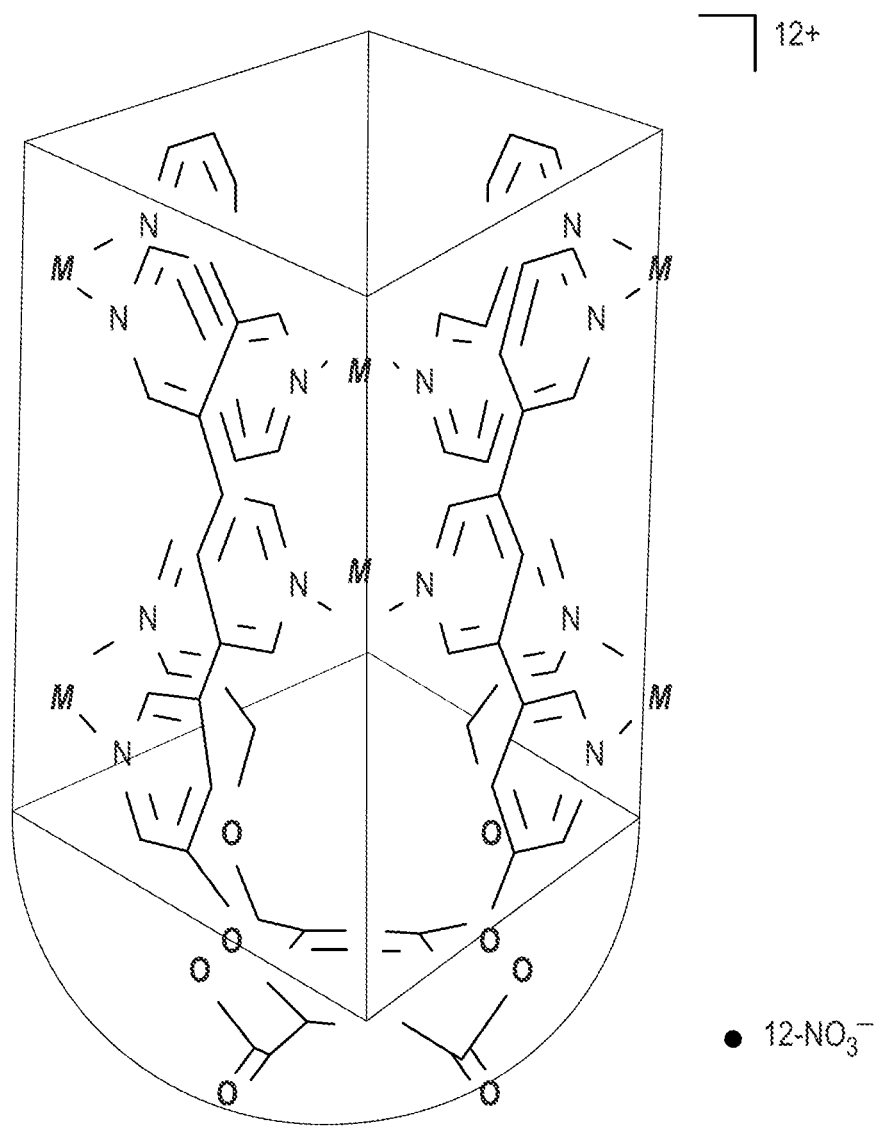
FIG. 18 shows an example of a metal complex.
Figure 19:
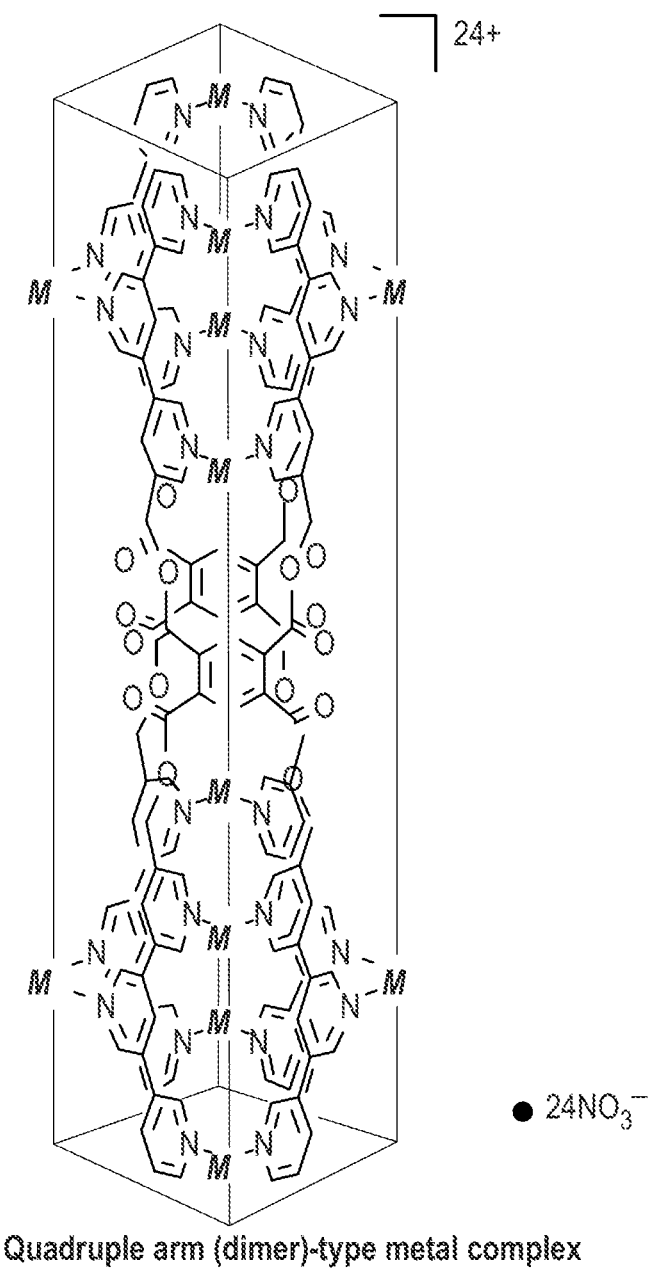
FIG. 19 shows an example of a metal complex.

Yet another preferred metal complex of the present invention has a structure (a) or structure (b) including the following ligand:

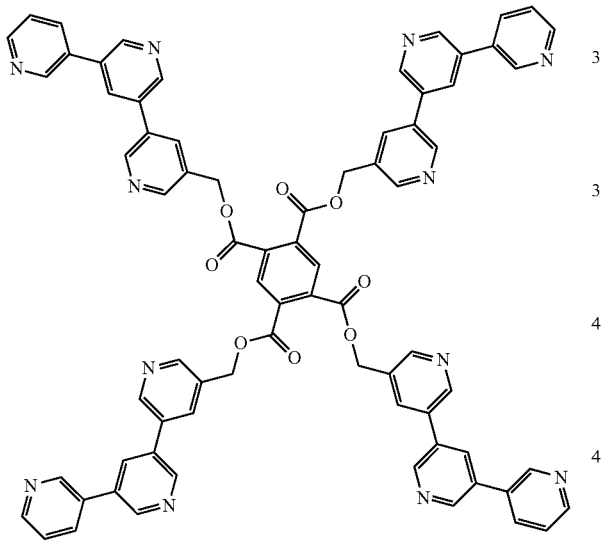

the structure (a) shown in FIG. 18:
the structure (b) shown in FIG. 19.

In FIG. 19, M is the above metal molecule, and Mc is as defined above.

Figure 20:
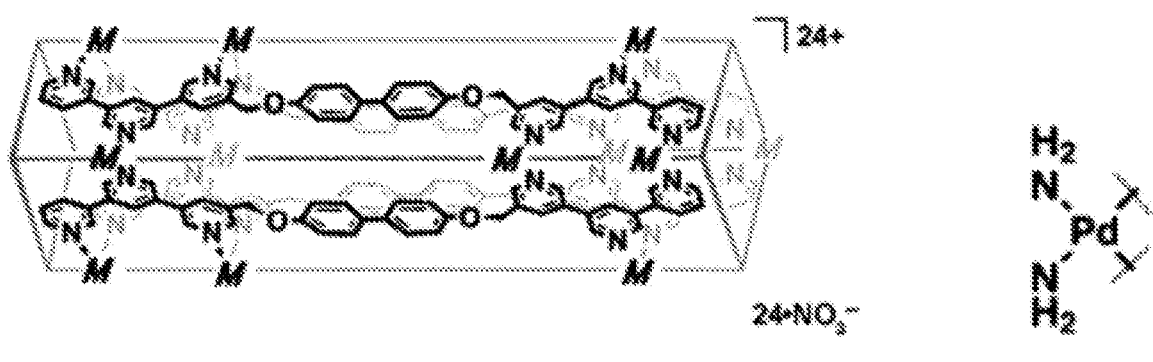
FIG. 20 shows an example of a metal complex.

Yet another preferred metal complex of the present invention has a structure including the following ligand:

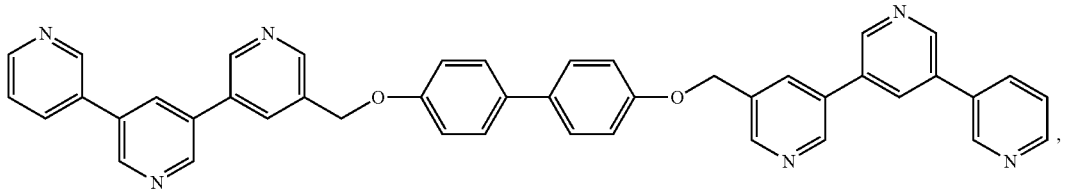 [SMILES: c1cncc(-c2cncc(-c3cncc(COc4ccc(-c5ccc(OCc6cncc(-c7cncc(-c8cccnc8)c7)c6)cc5)cc4)c3)c2)c1]

the structure as shown in FIG. 20.

In FIG. 20, M is the above metal molecule, and Mc is as defined above.

Figure 21:
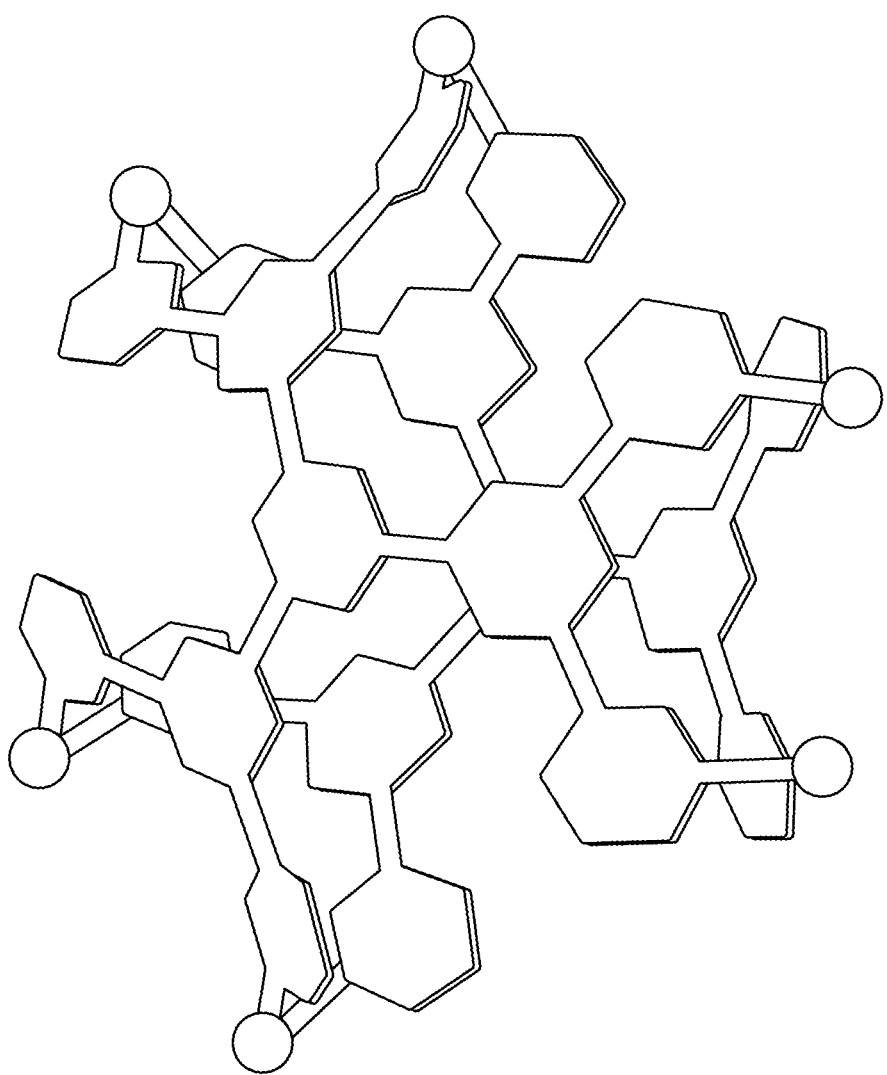
FIG. 21 shows an example of a metal complex.
Figure 22:
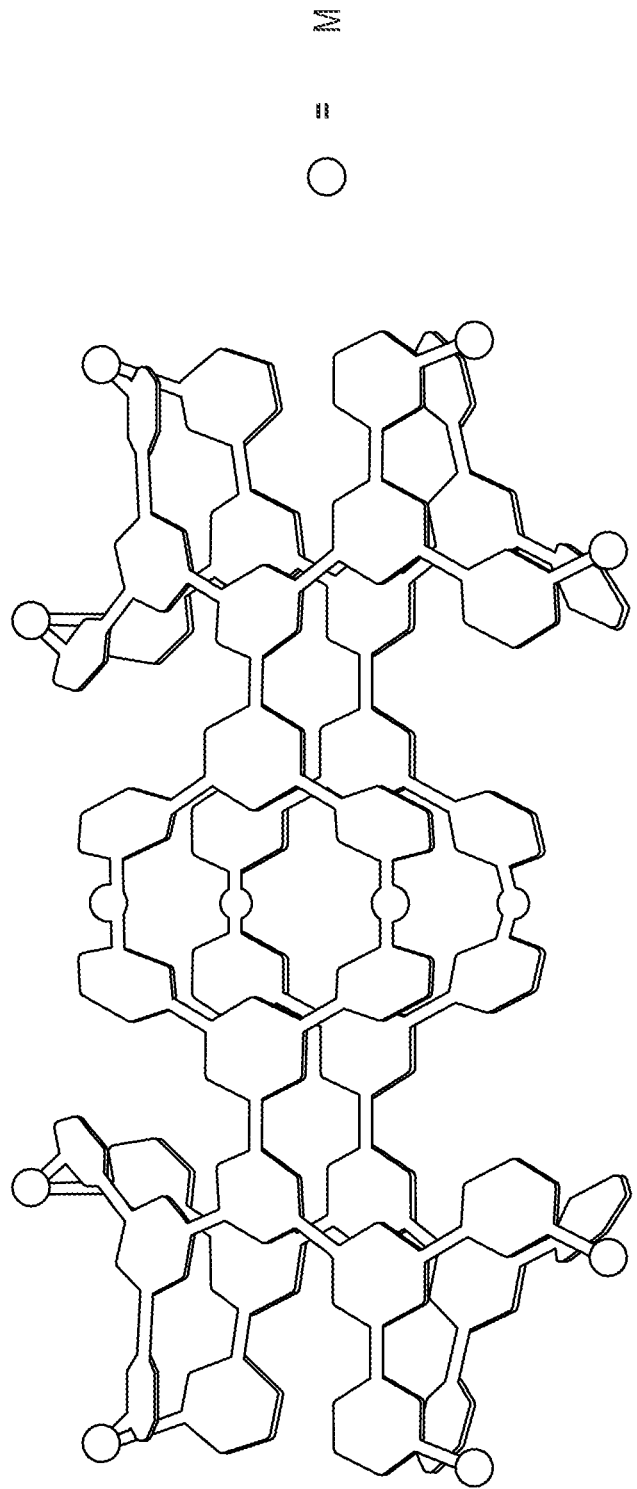
FIG. 22 shows an example of a metal complex.

Yet another preferred metal complex of the present invention has a structure (a) or a dimer structure (b) including the following ligand:

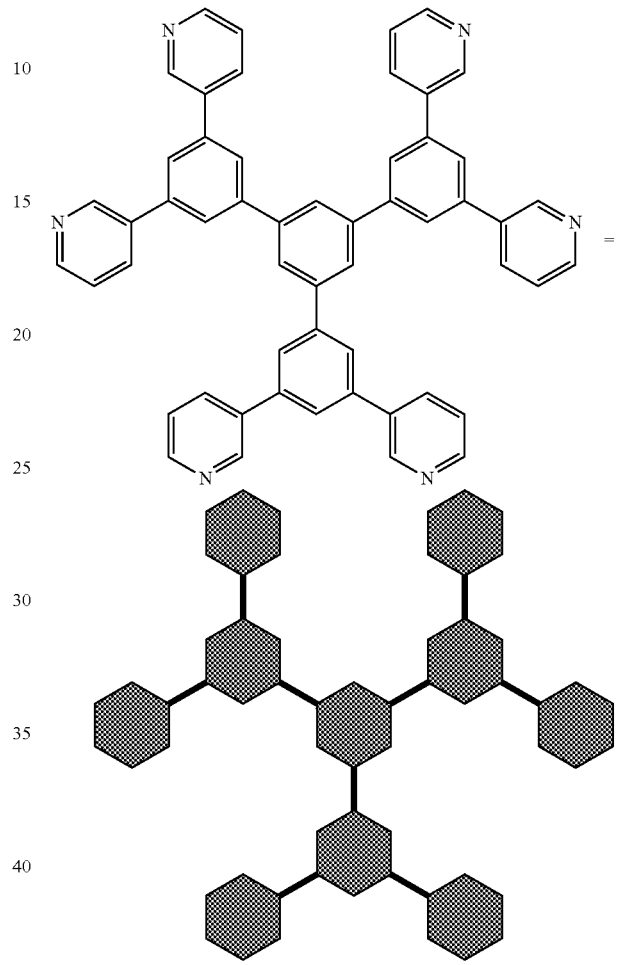

the structure (a) as shown in FIG. 21:
the dimer structure (b) as shown in FIG. 22:
wherein M is the above metal molecule, and Mc is as defined above.

Method for Producing Metal Complex

General Synthesis Procedure

Those skilled in the art would understand that the metal complex of the present invention can be prepared in accordance with any of the following general synthesis methods or procedures with starting materials and reagents commercially available or prepared in accordance with a known method.

Typical embodiments of the metal complex described herein can be synthesized by using any of the following general synthesis methods. It becomes clear from consideration of the description herein that the general synthesis methods can be modified by using in place of a mentioned starting material another material having a similar structure to provide a different product according thereto. Required starting materials are generally determined through examination considering an intended product with a defined substituent. Typically, starting materials can be obtained from commercial suppliers (such as reagent manufacturers), or synthesized by using a published method.

General Synthesis Method for [$M_6L_4$] Metal Complex

The ligand L is added to solution of (bidentate ligand) $Mc(NO_3)_2$ in aqueous solvent, and the resulting aqueous suspension is heated and then filtered to provide solution of a [$M_6L_4$] metal complex. The bidentate ligand is not limited to a particular bidentate ligand and may be any bidentate ligand that is capable of coordinating to palladium, but is preferably ethylenediamine, N,N,N',N'-tetramethylethylenediamine, 2,2'-bipyridine, or cis- or trans-1,2-diaminocyclohexane. Mc is preferably palladium or platinum, but is not limited thereto. The aqueous solvent is not limited to a particular aqueous solvent and may be any aqueous solvent that is capable of dissolving the metal complex, but is preferably water, a water-methanol mixture, or a water-acetonitrile mixture. The heating temperature is, for example, 40° C. to reflux temperature, and preferably 80° C.

General Synthesis Method for [$M_8L_4$] Metal Complex

To suspension of (bidentate ligand) $Mc(NO_3)_2$ and the ligand L in aqueous solvent, an excessive amount of carbon tetrabromide is added as a template molecule. The resulting mixture is stirred at ambient temperature, and then filtered. The resulting filtrate is concentrated to obtain a [$M_8L_4$] metal complex. The bidentate ligand is not limited to a particular bidentate ligand and may be any bidentate ligand that is capable of coordinating to Mc, but is preferably ethylenediamine, N,N,N',N'-tetramethylethylenediamine, 2,2'-bipyridine, or cis- or trans-1,2-diaminocyclohexane. The template molecule is not limited to a particular molecule and may be any molecule that assists self-organization into the metal complex, but is preferably carbon tetrabromide or the like. After the metal complex has been produced, the template molecule can be removed therefrom. Mc is preferably palladium or platinum, but is not limited thereto. The aqueous solvent is not limited to a particular aqueous solvent and may be any aqueous solvent that is capable of dissolving the metal complex, but is preferably water, a water-methanol mixture, or a water-acetonitrile mixture.

General Synthesis Method for [$M_6L_3$] Prism-Type Metal Complex

The ligand L is added to solution of (bidentate ligand) $Mc(NO_3)_2$ in aqueous solvent. The resulting mixture is heated, providing homogenous solution. Acetone is added to this solution, and a precipitate is collected through filtration to obtain a [$M_6L_3$] metal complex. The bidentate ligand is not limited to a particular bidentate ligand and may be any bidentate ligand that is capable of coordinating to palladium, but is preferably ethylenediamine, N,N,N',N'-tetramethylethylenediamine, 2,2'-bipyridine, or cis- or trans-1,2-diaminocyclohexane. Mc is preferably palladium or platinum, but is not limited thereto. The aqueous solvent is not limited to a particular aqueous solvent and may be any aqueous solvent that is capable of dissolving the metal complex, but is preferably water, a water-methanol mixture, or a water-acetonitrile mixture. The heating temperature is, for example, 40° C. to reflux temperature, and preferably 80° C.

General Synthesis Method for [$M_6L_2X_3$] Metal Complex

The ligand L, X, and a template molecule are added to solution of (bidentate ligand) $Mc(NO_3)_2$ in aqueous solvent. The resulting suspension mixture is heated. Thereafter, the mixture is filtered, and the filtrate is evaporated to obtain a [$M_6L_2X_3$] metal complex. The bidentate ligand is not limited to a particular bidentate ligand and may be any bidentate ligand that is capable of coordinating to palladium, but is preferably ethylenediamine, N,N,N',N'-tetramethylethylenediamine, 2,2'-bipyridine, or cis- or trans-1,2-diaminocyclohexane. The template molecule is not limited to a particular molecule and may be any molecule that assists self-organization into the metal complex, but is preferably triphenylene, pyrene, coronene, 2,4,6-tris(4-pyridyl)-1,3,5-triazine, or the like. After the metal complex has been produced, the template molecule can be removed therefrom. Mc is preferably palladium or platinum, but is not limited thereto. The aqueous solvent is not limited to a particular aqueous solvent and may be any aqueous solvent that is capable of dissolving the metal complex, but is preferably water, a water-methanol mixture, or a water-acetonitrile mixture. The heating temperature is, for example, 40° C. to reflux temperature, and preferably 100° C.

General Synthesis Method for Ligand of [$M_6L_1$] and [$M_{12}L_2$] Nanotube-Type Metal Complexes with Quadruple Arm Ligand A quadruple arm ligand 14 is synthesized, for example, in accordance with the following scheme.

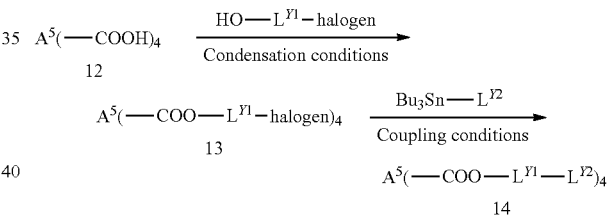

A tetracarboxylic acid 12 and an alcohol compound are subjected to condensation reaction (e.g., Mitsunobu esterification ($PPh_3$, DEAD)) to obtain a compound 13. Subsequently, this is treated with a tributyltin compound under coupling conditions (e.g., Stille coupling conditions) to obtain a ligand 14. In the formula, —COO-$L^{Y1}$-$L^{Y2}$ is equivalent to —$R^{X58}$—$R^{Y58}$.

The ligand 14 and (bidentate ligand) $Mc(NO_3)_2$ are mixed in aqueous solvent. A template molecule is added thereto, and this aqueous suspension is heated. The suspension is then filtered, and the filtrate is evaporated to obtain a [$M_6L_1$] metal complex and a [$M_{12}L_2$] metal complex. These can be separated from each other by using a method known to those skilled in the art. The bidentate ligand is not limited to a particular bidentate ligand and may be any bidentate ligand that is capable of coordinating to palladium, but is preferably ethylenediamine, N,N,N',N'-tetramethylethylenediamine, 2,2'-bipyridine, or cis- or trans-1,2-diaminocyclohexane. The template molecule is not limited to a particular molecule and may be any molecule that assists self-organization into the metal complexes, but is preferably 4,4'-dimethylbiphenyl, 4,4'-dicarboxylbiphenyl, or the like. After the metal complexes have been produced, the template molecule can be removed therefrom. Mc is preferably palladium or platinum, but is not limited thereto. The aqueous solvent is not limited to a particular aqueous solvent and may be any aqueous solvent that is capable of dissolving the metal complex, but is preferably water, a water-methanol mixture, or a water-acetonitrile mixture. The heating temperature is, for example, 40° C. to reflux temperature, and preferably 70° C.

General Synthesis Method (1) for Ligand of $[M_{(2m+2)}L_4]$ Nanotube-Type Metal Complex with Double Arm Ligand A ligand 17 is synthesized, for example, in accordance with the following scheme.

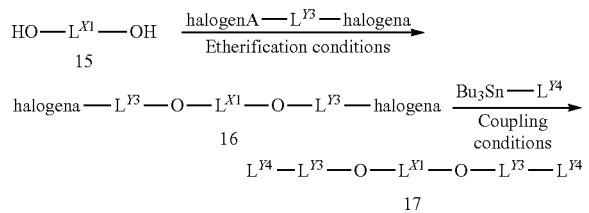

A compound 15 is reacted with a dihalogenated compound under etherification conditions (e.g., treatment with potassium carbonate in DMF) to form an ether compound 16. This is then treated with a tributyltin compound under coupling conditions (e.g., Stille coupling conditions) to obtain the intended ligand 17. In the formula, halogen$_A$ and halogen$_B$ are each independently selected from halogens, and $L^{Y4}$-$L^{Y3}$-$L^{X1}$-$L^{Y3}$-$L^{Y4}$ is equivalent to $R^{Y78}$—$R^{X78}$—$R^{Y78}$.

The ligand 17 and (bidentate ligand) $Mc(NO_3)_2$ are mixed in aqueous solvent. A template molecule is added to the mixture, and this aqueous suspension is heated. This suspension is then filtered, and the filtrate is evaporated to obtain a $[M_{(2m+2)}L_4]$ metal complex. The bidentate ligand is not limited to a particular bidentate ligand and may be any bidentate ligand that is capable of coordinating to palladium, but is preferably ethylenediamine, N,N,N',N'-tetramethylethylenediamine, 2,2'-bipyridine, or cis- or trans-1,2-diaminocyclohexane. The template molecule is not limited to a particular molecule and may be any molecule that assists self-organization into the metal complex, but is preferably 4,4'-dimethylbiphenyl, 4,4'-dicarboxylbiphenyl, (4-biphenyl)-O—$(CH_2O)_n$-(4-biphenyl) (here, n is 3, 4, or 5), an anthracenecarboxylic acid derivative (30), 1,1':4',1"-terphenyl, biphenyl-4-carboxylic acid, and the like. After the metal complex has been produced, the template molecule can be removed therefrom. Mc is preferably palladium or platinum, but is not limited thereto. The aqueous solvent is not limited to a particular aqueous solvent and may be any aqueous solvent that is capable of dissolving the metal complex, but is preferably water, a water-methanol mixture, or a water-acetonitrile mixture. The heating temperature is, for example, 40° C. to reflux temperature, and preferably 70° C.

General Synthesis Method (2) for $[M_{(2m+2)}L_4]$ (Nanotube-Type with Double Arm Ligand) Metal Complex The ligand L (e.g., 1,4-diazine, bipyridine, terpyridine, quaterpyridine, quinquepyridine, sexipyridine) and (bidentate ligand) $Mc(NO_3)_2$ are mixed in aqueous solvent. A template molecule is added to the mixture, and this aqueous suspension is heated. The mixture obtained is filtered, and acetone is added to the filtrate, and a precipitate is collected through filtration to obtain a $[M_{(2m+2)}L_4]$ (nanotube-type) metal complex. The bidentate ligand is not limited to a particular bidentate ligand and may be any bidentate ligand that is capable of coordinating to palladium, but is preferably ethylenediamine, N,N,N',N'-tetramethylethylenediamine, 2,2'-bipyridine, or cis- or trans-1,2-diaminocyclohexane. The template molecule is not limited to a particular molecule and may be any molecule that assists self-organization into the metal complex, but is preferably 4,4'-dimethylbiphenyl, 4,4'-dicarboxylbiphenyl, (4-biphenyl)-O—$(CH_2O)_n$-(4-biphenyl) (here, n is 3, 4, or 5), an anthracenecarboxylic acid derivative (30), 1,1':4',1"-terphenyl, biphenyl-4-carboxylic acid, and the like. After the metal complex has been produced, the template molecule can be removed therefrom. Mc is preferably palladium or platinum, but is not limited thereto. The aqueous solvent is not limited to a particular aqueous solvent and may be any aqueous solvent that is capable of dissolving the metal complex, but is preferably water, a water-methanol mixture, or a water-acetonitrile mixture. The heating temperature is, for example, 40° C. to reflux temperature, and preferably 70° C. It should be understood that the ligand L is commercially available, and can be easily synthesized by those skilled in the art in accordance with a known method.

General Synthesis Method for $[M_6L_2]$ (Sandwich-Type) Metal Complex

The ligand L (e.g., 1,3,5-tris[3,5-di(pyridin-3-yl)phenyl]benzene) and (bidentate ligand) $Mc(NO_3)_2$ are mixed in aqueous solvent. This mixture is heated for 2 hours. The mixture obtained is filtered to obtain a solution of a $[M_6L_2]$ (sandwich-type) metal complex. The bidentate ligand is not limited to a particular bidentate ligand and may be any bidentate ligand that is capable of coordinating to palladium, but is preferably ethylenediamine, N,N,N',N'-tetramethylethylenediamine, 2,2'-bipyridine, or cis- or trans-1,2-diaminocyclohexane. Mc is preferably palladium or platinum, but is not limited thereto. The aqueous solvent is not limited to a particular aqueous solvent and may be any aqueous solvent that is capable of dissolving the metal complex, but is preferably water, a water-methanol mixture, or a water-acetonitrile mixture. The heating temperature is, for example, 40° C. to reflux temperature, and preferably 60° C.

General Synthesis Method for $[M_{12}L_4]$ (Sandwich Dimer-Type) Metal Complex

The ligand L (e.g., 1,3,5-tris[3,5-di(pyridin-3-yl)phenyl]benzene) and (bidentate ligand) $Mc(NO_3)_2$ are mixed in an aqueous solvent at an appropriate mole ratio (e.g., ligand: metal molecule=1:3) to obtain the titled metal complex.

The ligand may be synthesized using a known method, or purchased as a commercially available product. In one embodiment, the metal complex of the present invention includes a cation including a metal molecule and a counteranion. In another embodiment, the metal complex of the present invention consists of a cation including a metal molecule and a counteranion. Examples of the counteranion include inorganic ions such as a nitrate ion, a nitrite ion, a sulfate ion, a sulfite ion, a hydroxide ion, a phosphate ion, a chloride ion, a bromide ion, an iodide ion, a perchlorate ion, a chlorate ion, a chlorite ion, a hypochlorite ion, a perbromate ion, a bromate ion, a bromite ion, a hypobromite ion, a periodate ion, an iodate ion, an iodite ion, and a hypoiodite ion; and organic ions such as a formate ion, an acetate ion, a trifluoroacetate ion, a propionate ion, a butyrate ion, an isobutyrate ion, a succinate ion, a malonate ion, a maleate ion, a fumarate ion, a methanesulfonate ion, a benzenesulfonate ion, a toluenesulfonate ion, a lactate ion, a citrate ion, a tartrate ion, and a malate ion. The counteranion is preferably a nitrate ion, a sulfate ion, or a perchlorate ion, and particularly preferably a nitrate ion. With the counteranion being a nitrate ion, a sulfate ion, or a perchlorate ion, the metal complex can have appropriate solubility in water.

In the metal molecule, the structure of the metal complex can be modified through adjustment of the maximum coordination number and coordinate bond angles to the metal molecule by introducing various coordinate molecules to the metal atom.

The metal atom constituting the metal complex is not limited to a particular metal atom and may be any metal atom that is capable of forming a coordinate bond to the polydentate ligand to form the metal complex of the present invention, and examples thereof include known metal atoms. Preferred examples include ions of Group 8 to 12 metals in the periodic table, and more preferred examples include palladium (Pd), platinum (Pt), silver (Ag), cobalt (Co), iron (Fe), nickel (Ni), copper (Cu), chromium (Cr), and ruthenium (Ru). Particularly preferred metal is palladium. The metal may be zerovalent, monovalent, divalent, or trivalent, or of higher valency than three; however, divalent metals are preferred.

In one embodiment, the metal molecule consists of one metal atom and one bidentate coordinate molecule. When the metal atom (Mc) is palladium or platinum, the metal molecule can be represented by the following formula:

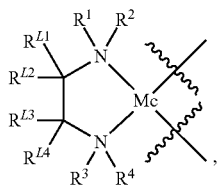

wherein $R^{L1}$, $R^{L2}$, $R^{L3}$, and $R^{L4}$ are each independently selected from the group consisting of —H and —$C_{1-3}$ alkyl, or any two of $R^{L1}$, $R^{L2}$, $R^{L3}$, and $R^{L4}$ may together form a $C_{3-7}$ carbocycle and the rest two may each independently be selected from the group consisting of —H and —$C_{1-3}$ alkyl, $R^1$, $R^2$, $R^3$, and $R^4$ are each independently selected from the group consisting of —H and —$C_{1-3}$ alkyl, or $(R^1)(R^2)N$—$C(R^{L1})(R^{L2})$ may together form 5- to 10-membered heterocyclyl or 5- to 10-membered heteroaryl, and $C(R^{L3})(R^{L4})$—$N(R^3)(R^4)$ may together form 5- to 10-membered heterocyclyl or 5- to 10-membered heteroaryl.

Specific examples of the metal molecule include the following:

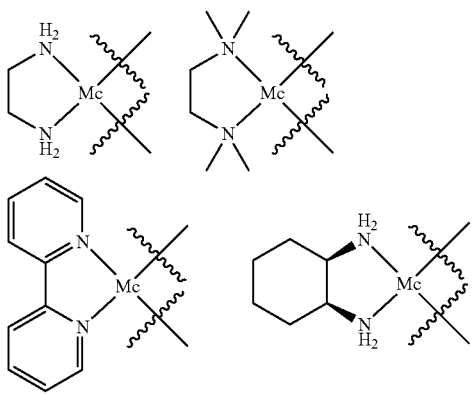

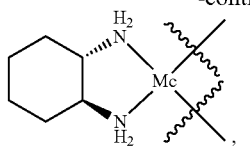

wherein Mc is palladium or platinum.

More specific examples are metal molecules having the following structures:

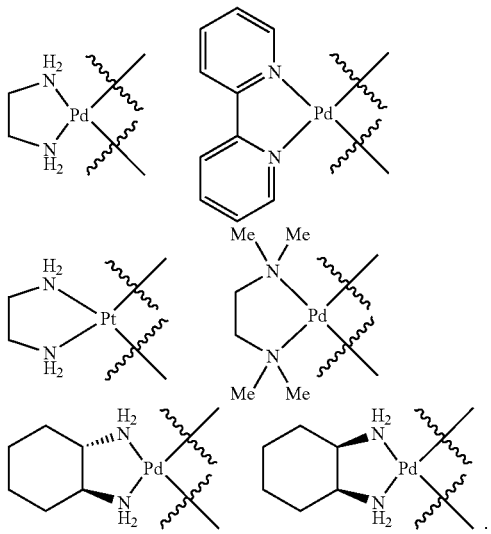

The metal molecule may be prepared by using a known method, or purchased as a commercially available product.

Regarding the dimensions of the metal complex, the pore size of the metal complex can be in one embodiment 0.45 to 0.9 nm in diameter. In one embodiment, the inner diameter of the metal complex can be 0.45 to 1.2 nm in diameter.

Figure 23:
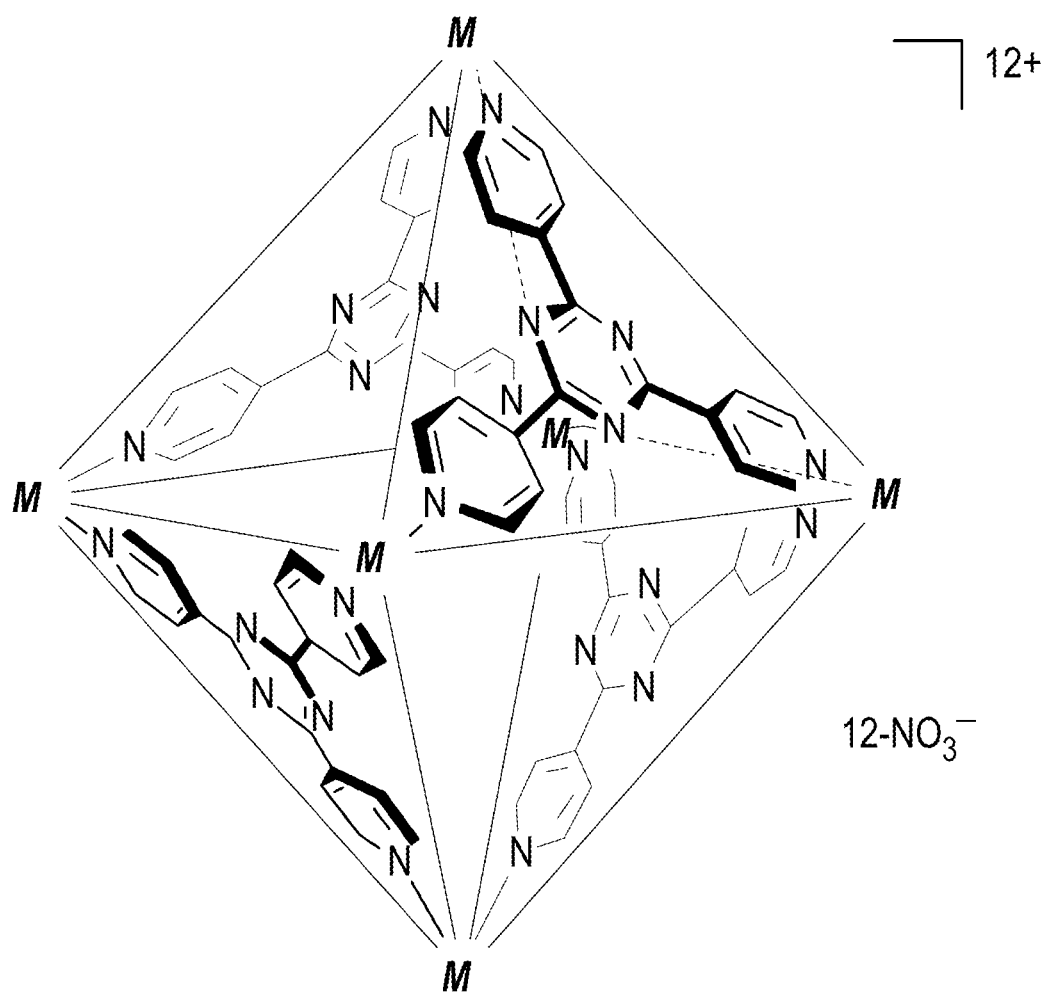
FIG. 23 shows an octahedral $[M_6L_4]$ metal complex.

For example, in the case of the octahedral [$M_6L_4$] metal complex as shown in FIG. 23; the pore size of the metal complex is 7.5 Å in diameter, and the inner diameter of the metal complex is 10.6 Å in diameter.

Figure 24:
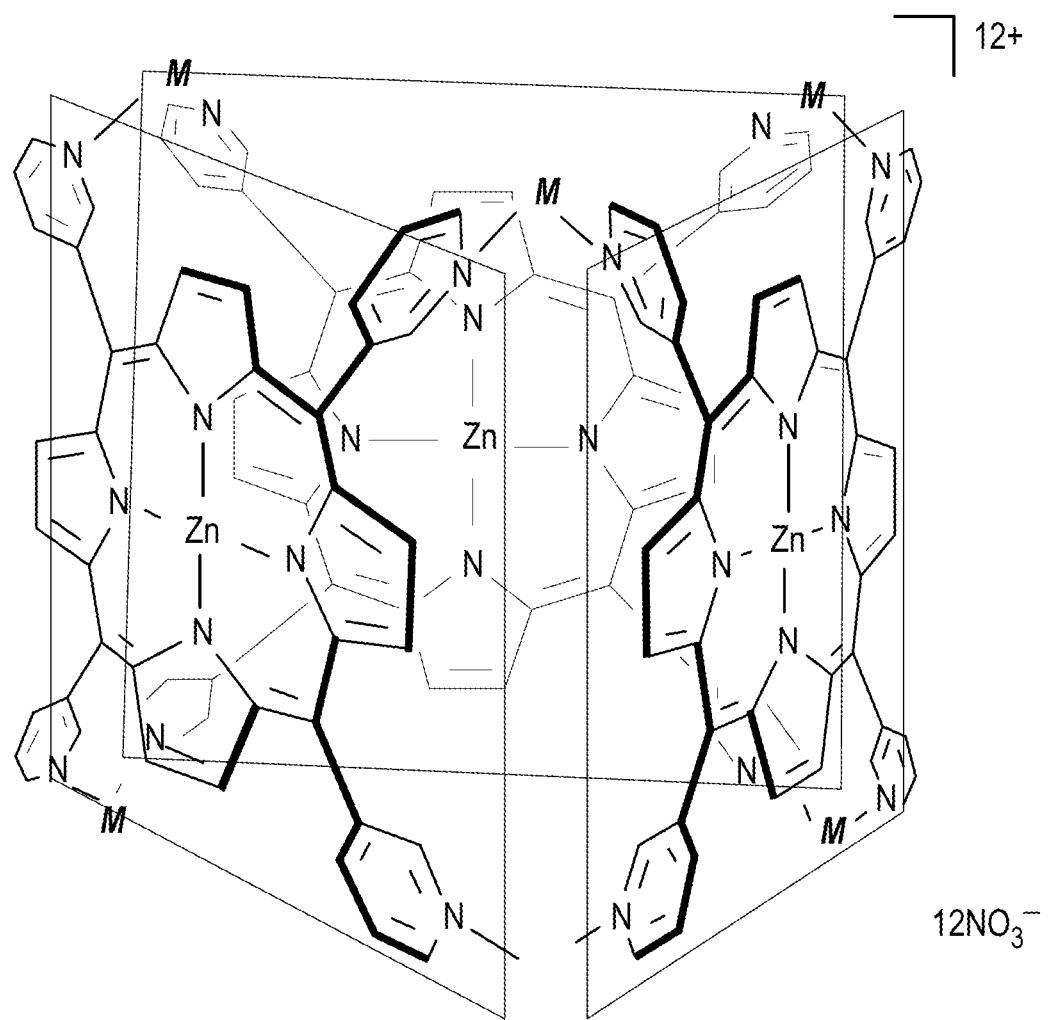
FIG. 24 shows a porphyrin prism-type $[M_6L_3]$ metal complex.

In the case of the porphyrin prism-type [$M_6L_3$] metal complex as shown in FIG. 24, the pore size of the metal complex is 4.7 Å in diameter, and the inner diameter of the metal complex is 10.7 Å in diameter. If the metal complex has a structure such that an end portion (aromatic ring) of each molecule of the ligand is flexible to some extent, the pore may temporarily extend to include the test molecule larger than the pore size of the metal complex, and it can be advantageous in predicting inclusion of the test molecule to take deformation due to such flexibility into account and set a parameter larger than the pore size of the metal complex. For the porphyrin prism-type [$M_6L_3$] metal complex shown above, for example, an alternative parameter to the pore size of the metal complex may be set in view of the possibility that the aromatic moiety at each end extends outside because of molecular motion or the like to open the pore up to nearly 10 Å.

Figure 25:
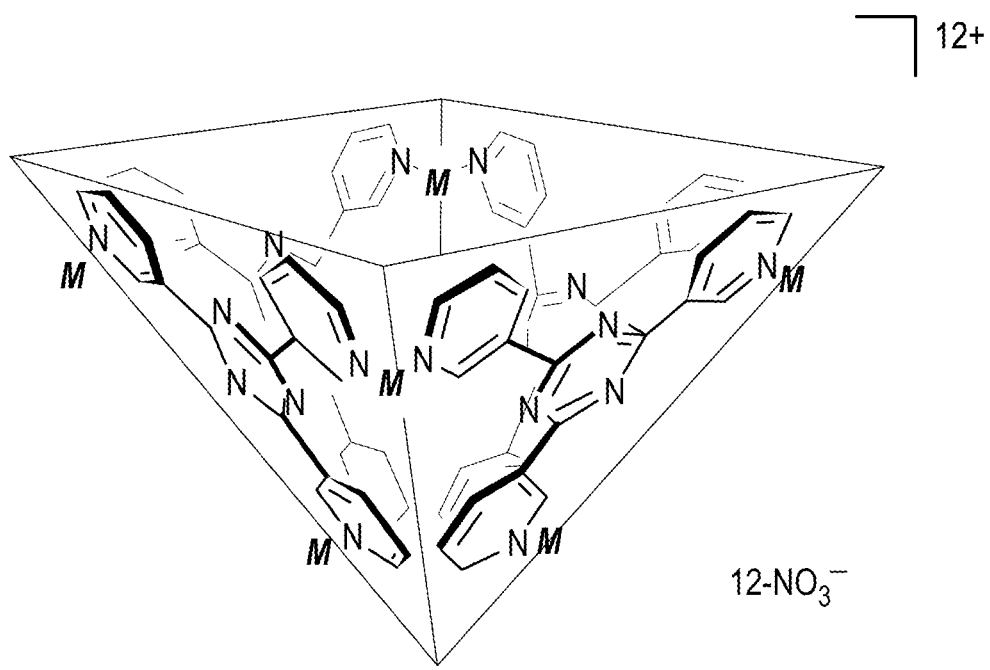
FIG. 25 shows a quadrangular pyramid (bowl)-type $[M_6L_4]$ metal complex.

When the metal complex lacks a molecule of the ligand in one face of a polyhedron, such as the quadrangular pyramid (bowl)-type [$M_6L_4$] metal complex as shown in FIG. 25, it can be advantageous to set as a parameter "the maximum diameter of a hemisphere present in the metal complex without being in contact with any of the centers of the atoms constituting the metal complex" (also referred to as the hemisphere inner diameter of the metal complex). For the quadrangular pyramid (bowl)-type [$M_6L_4$] metal complex shown above, for example, the hemisphere inner diameter is about 8 to 10 Å in diameter, where the reason why the quadrangular pyramid (bowl)-type [$M_6L_4$] metal complex comes to have various hemisphere inner diameters is that the quadrangular pyramid (bowl)-type [$M_6L_4$]metal complex, which possesses sides sandwiched by faces formed by molecules of the ligand, includes a side including only one metal molecule thereon, and this metal molecule serves as a center of rotation, providing flexibility.

Examples of the three-dimensional shape of the metal complex include a sphere, an icosahedron, a dodecahedron, an octahedron, a cuboid, a cube, a prism (e.g., a triangular prism), a triangular pyramid, and a quadrangular pyramid.

(Characteristics of Metal Complex)

The metal complex of the present invention can be formed by assemblage through self-organization of the ligand and the metal molecule via coordinate bonds. The structure of the metal complex can affect inclusion and crystallization of the test molecule. The metal complex of the present invention can crystallize in such a manner that molecules of the metal complex including the test molecule inside stack one after another like "shipping containers".

The metal complex may be present singly, or as an integrated form of a plurality of molecules of the metal complex (e.g., a dimer, a trimer, a tetramer, or a multimer with more than four units), or as a mixture of them in solution.

The metal complex is preferably dissolved. In one embodiment, the metal complex has a hydrophilic moiety. In one embodiment, the metal complex is soluble in water. In one embodiment, the inside of the metal complex is a hydrophobic environment.

Without wishing to be bound by theory, the properties of the ligand (such as electron deficiency and π electrons formed by an aromatic ring and protruding in the form of a plane) strongly have influence on a space near the molecules of the ligand in the inside of a molecule of the metal complex, and the influence can decrease as the position moves from molecules of the ligand to the center of a molecule of the metal complex.

In one embodiment, one or more parts corresponding to faces of the three-dimensional shape of the metal complex include no molecule of the ligand, and in this case the test molecule enters and exits from faces with no molecule of the ligand. Without wishing to be bound by theory, the more portions with no molecule of the ligand are in the three-dimensional shape of the metal complex, the higher the degree of freedom of direction and/or space for inclusion of the test molecule is, likely enabling inclusion of a wider variety of test molecules.

Molecules of solvent in the inside of the metal complex may be forming a cluster independent of molecules of solvent outside of the metal complex.

In one embodiment, the metal complex to be used in the present invention does not undergo the onset of crystallization until being concentrated, and hence can be stored as solution of the metal complex.

The metal complex can be prepared by mixing the metal atom or metal molecule and the ligand in solution. For such preparation of the metal complex, any temperature, any pressure, and any solvent can be used. In one embodiment, the metal complex can be prepared at normal temperature under normal pressure. In one embodiment, the metal complex can be prepared in aqueous solvent. In one embodiment, the metal complex can be prepared in aqueous solvent including nonaqueous solvent (e.g., organic solvent). In one embodiment, any known method may be used to confirm that the metal complex has been formed, and, for example, formation of the metal complex can be confirmed by NMR, but the method is not limited thereto.

In one embodiment, for example, a metal complex satisfying the following combination of characteristics can be used:

(1) carbon atoms on an aromatic ring present in the center of gravity of the ligand in the metal complex are electron-deficient;

(2) an aromatic ring is present in a place corresponding to the center of gravity of the ligand, and an atom bonding to the metal molecule via a coordinate bond and the aromatic ring are linked together via a π conjugated system therebetween;

(3) the number of coordination sites included in one molecule of the ligand is two, three, or four;

(4) the inner diameter of the metal complex is 0.5 to 1.2 nm; and (5) the three-dimensional shape of the metal complex is a regular octahedral, a cuboid, a triangular pyramid, a triangular prism, or a regular tetrahedron.

(Relation Between Metal Complex and Test Molecule)

The mole ratio of metal complex: test molecule and A value can affect inclusion and crystallization. Here, the A value is defined as [A value=b/a], wherein b denotes the weight of the test molecule in the crystallization solution, and a denotes the weight of a substance with a specific gravity of 1 required, assuming that the substance with a specific gravity of 1 fills the entire space of a crystal to be formed by complete crystallization of the metal complex used.

In one embodiment, the A value in inclusion solution can be 0.01 to 100, and preferably 0.1 to 10.

The mole ratio of metal complex: test molecule in the step of inclusion can be 1:100 to 100:1, and is 1:10 to 10:1 in one embodiment, and is 1:5 to 1:1 in a further embodiment. In general, it is preferred to increase the mole ratio of the test molecule to the metal complex as the number of test molecules included per molecule of the metal complex increases.

An inclusion compound is formed by contacting a sample containing the test molecule with the metal complex.

In one embodiment, the number of test molecules included in one molecule of the metal complex is one to four or more; however, the number is not limited to integers because one test molecule may be included in a plurality of molecules of the metal complex in an overlapping manner.

In the present invention, the inclusion solution for inclusion of the test molecule in the metal complex can be any liquid that reacts neither with the metal complex nor with the test molecule, is capable of dissolving the metal complex therein, is capable of dispersing or dissolving therein at least some of test molecules added, and does not inhibit inclusion of the test molecule by the metal complex. The solvent of the inclusion solution of the present invention can be preferably aqueous solvent. The inclusion solution of the present invention may contain a solute, or not. In one embodiment, the test molecule is added together with a small amount of nonaqueous solvent, and the solvent of the inclusion solution and the nonaqueous solvent can form a two-phase mixture.

The metal complex before inclusion of the test molecule is including solvent, and a group of solvent molecules inside of the metal complex forms a cluster independent of a group of solvent molecules outside of the metal complex. Thereafter, once the metal complex includes the test molecule, the solvent molecules originally present inside of the metal complex become a part of the cluster of the group of solvent molecules outside of the metal complex, releasing energy (entropy). Inclusion of the test molecule may be performed simultaneously with formation of the metal complex from the ligand and the metal molecule.

In one embodiment, the test molecule may be included in the metal complex via interaction such as covalent bonding, coordinate bonding, ion bonding, and hydrogen bonding. In one embodiment, the test molecule is included in the metal complex even without relatively strong interaction such as covalent bonding and ion bonding. In one embodiment, the test molecule is included in the metal complex via interaction such as Coulomb force, hydrophobic interaction, intermolecular forces, and π-π stacking etc. In one embodiment, inclusion is accelerated with the situation that the test molecule has an electron-rich moiety and the metal complex has an electron-deficient moiety. Examples of electron-rich chemical structures include, but are not limited to, a phenyl moiety, a naphthalene moiety, an anthracene moiety, a phenanthrene moiety, a triphenylene moiety, and a perylene moiety etc. In one embodiment, interaction between a functional group on the test molecule and the metal complex can affect inclusion of the test molecule.

In one embodiment, inclusion of the test molecule can be confirmed through various methods such as observation of change in color and NMR measurement, and the result can be referred to, as necessary, for selection of the metal complex. In one embodiment, inclusion of the test molecule can be simply confirmed from change after addition of the metal complex in wavelengths of light (e.g., wavelengths in the visible light region) transmitted through solution containing the test molecule. This change can be due to change in the ambient environment of the test molecule after inclusion. Hence, if solution containing the test molecule has color appreciable by visual observation, for example, inclusion of the test molecule in the metal complex can be quickly confirmed based on change in color in some cases, and appropriate inclusion conditions (e.g., the type of the metal complex) can be set, as necessary, based on the change in color. Further, even if solution containing the test molecule has no color appreciable by visual observation (or has pale color), color may develop (or the color may become deep) due to the occurrence of inclusion. This case similarly allows quick confirmation of inclusion and setting of appropriate inclusion conditions. Even if no color is found by visual observation, those skilled in the art could utilize wavelengths of light to confirm inclusion with any appropriate optical analysis method. In the method of the present invention, test molecules not included may be removed from the inclusion solution before crystallization of the inclusion compound. This removal can be achieved, for example, through filtration of the inclusion solution before crystallization.

It is preferable that the test molecule included in the metal complex be in a definite configuration to the metal complex. As the number of conformations possible for the test molecule in the metal complex increases, structural determination for the test molecule can become difficult.

The flexibility of the metal complex may cause the metal complex to undergo structural change after inclusion of the test molecule. The metal complex can undergo structural change induced to fit to the structure of the test molecule.

Inclusion of the test molecule may be irreversible or reversible. As an example of irreversible inclusion, in the situation that the size of the test molecule is close to the pore size of the metal complex, the test molecule, which has been included in the metal complex at high temperature, may fail to be liberated even if the temperature is decreased.

Inclusion of the test molecule can be performed at any temperature and pressure. Inclusion of the test molecule can be achieved in a shorter time than in the crystalline sponge method (e.g., within 1 hour). In contrast to the crystalline sponge method, the method of the present invention does not need permeation of the test molecule deep in a crystal. Inclusion of the test molecule can be achieved within any time, and the step of inclusion may be performed within 1 hour in one embodiment. If the rate of dissolution of the test molecule in the inclusion solution is low, the inclusion time may be adjusted based on the dissolution rate of the test molecule.

In one embodiment, the solvent of the inclusion solution is aqueous solvent. In one embodiment, the inclusion solution contains nonaqueous solvent.

In one embodiment, the product of the predicted number of test molecules to be included in one molecule of the metal complex (not limited to integers) and the size of each test molecule predicted from the molecular weight amounts to about 10%, about 20%, about 30%, about 40%, about 50%, about 60%, about 70%, about 80%, or about 90%, and preferably about 55% of the volume of the inside of the metal complex. Without wishing to be bound by theory, if the number of test molecules to be included in a molecule of the metal complex increases, test molecules or parts of test molecules are more likely to be present far from molecules of the ligand in the molecule of the metal complex, and prevented from existing stably at definite positions inside of the molecule of the metal complex, possibly generating disorder in results of X-ray analysis.

Without wishing to be bound by theory, the test molecule can be more stably included in the metal complex as the difference between the environment inside of the metal complex and the environment in the solvent is larger. For a metal complex whose inside is a hydrophobic environment, for example, the test molecule may be more stably included with use of aqueous solvent as the solvent than with use of solvent which provides a hydrophobic environment such as acetonitrile.

In one embodiment, the inside of the metal complex is a hydrophobic environment, and the outside of the metal complex (in the solvent) is a hydrophilic environment, and hence the test molecule can be stably present in such a structure that the hydrophobic moiety of the test molecule is positioned in the inside of the metal complex and the hydrophilic moiety of the test molecule is positioned outside of the metal complex.

In one embodiment, carbon atoms of a ring present in the gravity center of molecules of the ligand constituting each molecule of the metal complex or carbon atoms in an aromatic ring included in each molecule of the ligand are electron-deficient, and can thereby capture an electron-rich moiety in the test molecule.

In one embodiment, a moiety having a π conjugated system of the test molecule can be captured with the presence of a π conjugated system in the ligand constituting the metal complex.

In one embodiment, 99% or more, 95% or more, 90% or more, 80% or more, 70% or more, 60% or more, 50% or more, 40% or more, 30% or more, 20% or more, or 10% or more of all the atoms constituting the test molecule present in the inclusion solution are present in the inside of the metal complex.

The likeliness of the occurrence of inclusion of the test molecule in the metal complex may be evaluated based on the mean time for the test molecule to remain in the inside of the metal complex. In one embodiment, the mean time for the test molecule to remain in the inside of the metal complex can be 1 ms or longer. The mean time for the test molecule to remain in the inside of the metal complex can be measured by using any method, and may be measured by NMR in one embodiment.

Inclusion of the test molecule in the metal complex becomes better in some cases with combining with an insertion molecule. In addition, structural analysis of the test molecule with X-ray structural analysis becomes easier in some cases with combining with an insertion molecule, for example, for the reason that possible conformations in the metal complex are limited. In one embodiment, effects of such an insertion molecule on inclusion of the test molecule depend, for example, on whether the insertion molecule includes a moiety that interacts with the test molecule, whether the insertion molecule includes a moiety that interacts with the metal complex, and to what degree the total size of the insertion molecule and the test molecule occupies the volume of the inside of the metal complex. In one embodiment, an insertion molecule having a moiety that interacts with the test molecule (e.g., interaction between an electron-rich moiety and an electron-deficient moiety, interaction between a cation and an anion) is selected, and thereby inclusion of a pair of the test molecule and the insertion molecule in one molecule of the metal complex is promoted, which can reduce formation of a statistical inclusion mixture of the test molecule and the insertion molecule included in different modes among molecules of the metal complex (e.g., a mixture of metal complex including two test molecules and molecules of the metal complex including one test molecule and one insertion molecule). In one embodiment, when the metal complex does not have size and/or shape sufficient for one type of the test molecule (one molecule, two molecules, three molecules, or four molecules) to occupy the inner space of the metal complex, use of an insertion molecule can be advantageous if the structure of combination of the test molecule and the insertion molecule is expected to achieve a higher occupancy in the inner space of the metal complex. In a preferred embodiment, the insertion molecule can be an insertion molecule that does not promote chemical reaction of the test molecule.

In one embodiment, pair inclusion of the test molecule can be simply confirmed from change after addition of the test molecule in wavelengths of light (e.g., wavelengths in the visible light region) transmitted through solution containing the insertion molecule and the metal complex. This change can be due to change in the ambient environment of the insertion molecule after pair inclusion. Hence, if solution containing the insertion molecule and the metal complex has color appreciable by visual observation, for example, pair inclusion of the test molecule can be quickly confirmed based on change in color in some cases, and appropriate inclusion conditions (e.g., the type of the metal complex, the type of the insertion molecule) can be set, as necessary, based on the change in color. Even if no color is found by visual observation, those skilled in the art could utilize wavelengths of light to confirm pair inclusion with any appropriate optical analysis method.

Selection of the insertion molecule is made so that the total of the molecular weight of the test molecule and that of the insertion molecule is 50 to 700 (Da) in one embodiment, 100 to 500 (Da) in a more specific embodiment, and 200 to 400 (Da) in a preferred embodiment. It should be noted that these preferred molecular weights are those when the test molecule is free of halogen atoms, and it is preferable when the test molecule contains a halogen atom that the product of the number of halogen atoms and its molecular weight be added to those molecular weights.

In one embodiment, the insertion molecule has a planar structure. In one embodiment, the insertion molecule having a planar structure is a monocyclic or polycyclic aromatic compound including 1 to 30 rings. In one embodiment, the insertion molecule having a planar structure is an aromatic compound including one, two, three, four, five, six, seven, eight, nine, or 10 rings. In one embodiment of the insertion molecule having a planar structure, at least two rings in the molecule are fused to form a fused ring, and/or are forming a series of 7 conjugated systems. In one embodiment, the insertion molecule having a planar structure is optionally substituted. Examples of substituents of the insertion molecule having a planar structure in one embodiment include the examples of substituents of groups defined as "optionally substituted" or "substituted" described herein. In one embodiment, the insertion molecule having a planar structure consists of three, four, five, or six rings linked to form a series of 7 conjugated systems and substituents, and the total of the molecular weights of all the substituents can be lower than 200, lower than 100, lower than 50, or lower than 30.

In one embodiment, the insertion molecule having a planar structure includes a ring (or moiety) having higher electron density (more electron-rich) or lower electron density (more electron-deficient) compared with benzene. If the test molecule includes an electron-rich moiety and/or an electron-deficient moiety, electrons are present in a biased manner. And pair inclusion occurs in some cases by combining with an insertion molecule including an electron-deficient moiety and/or an electron-rich moiety. Such promotion of pair inclusion caused by richness in electrons and/or deficiency in electrons can act cooperatively with promotion of pair inclusion due to the above-mentioned structural factor. In one embodiment, the electron-rich insertion molecule includes an aromatic ring having a substituent selected from the group consisting of —$C_{1-6}$ alkyl, —$NH_2$, —OH, —$N(C_{1-6}$ alkyl$)_2$, —$OC_{1-6}$ alkyl, and —NHC(=O)—$C_{1-6}$ alkyl. In one embodiment, the electron-deficient insertion molecule includes an aromatic ring having a substituent selected from the group consisting of —$NO_2$, —C(=O)—$C_{1-6}$ alkyl, —C(=O)—$C_{6-26}$ aryl, —C(=O)—$C_{5-20}$ heteroaryl, —C(=O)H, and —C(=O)—NH—$C_{1-6}$ alkyl.

In one embodiment, the insertion molecule having a planar structure includes any of the following structures:

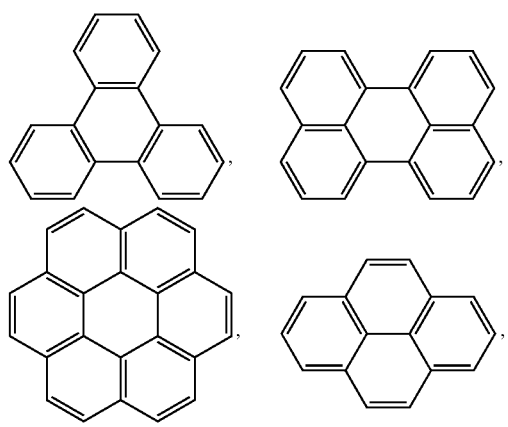

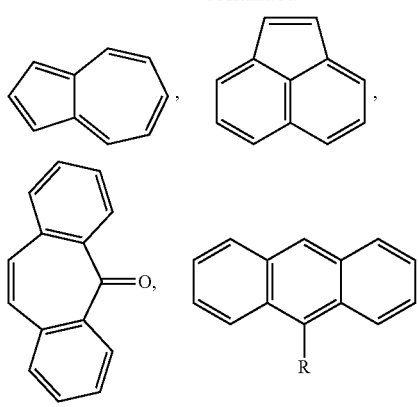

wherein R is a hydrogen atom, —CH₂OH, —CN, —CO₂H, —NO₂, or —CHCH₂,

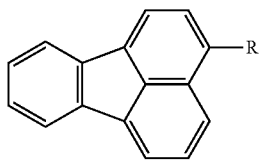

wherein R is a hydrogen atom or —CH₂OH,

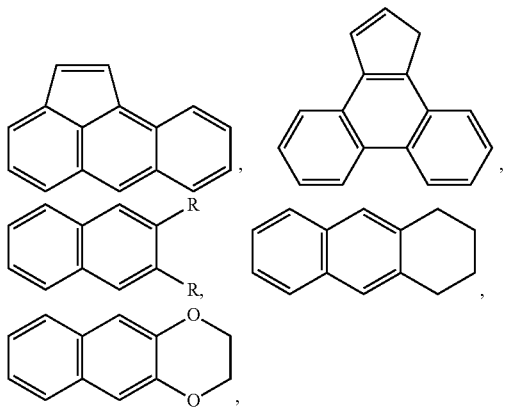

wherein R is a hydrogen atom, a methyl group, an ethyl group, a n-propyl group, a n-butyl group, an i-butyl group, or a n-pentyl group,

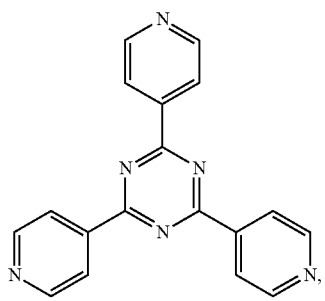

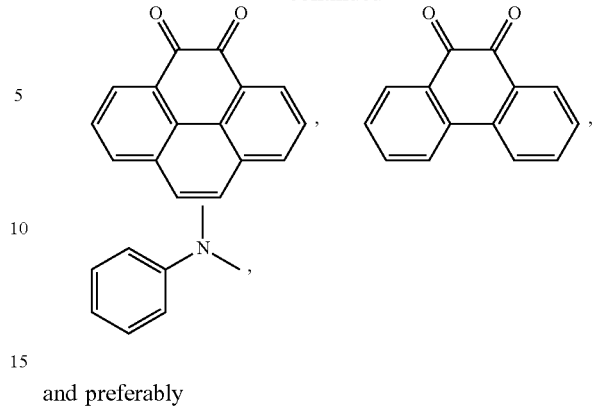

and preferably

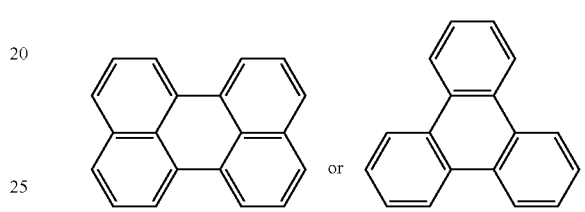

In one embodiment, the insertion molecule having a planar structure is selected if the test molecule is predicted to have at least one aromatic ring (e.g., a fused aromatic ring and an aromatic ring having a series of n conjugated systems). In one embodiment, the insertion molecule having a planar structure and being electron-deficient is selected if the test molecule is predicted to have an electron-rich moiety (e.g., an aromatic ring substituted with an electron-donating group such as —$C_{1-6}$ alkyl, halogen, —NH₂, —OH, —N($C_{1-6}$ alkyl)₂, —O$C_{1-6}$ alkyl, and —NHC(=O)—$C_{1-6}$ alkyl; a double bond; a triple bond; and a diacetylene structure (—C≡C—C≡C—)). In one embodiment, the insertion molecule having a planar structure and being electron-rich is selected if the test molecule is predicted to have an electron-deficient moiety (e.g., an aromatic ring substituted with an electron-withdrawing group such as —NO₂, —CN, —CHO, —C(=O)—$C_{1-6}$ alkyl, —COOH, and —COO—$C_{1-6}$ alkyl). In one embodiment, the insertion molecule having a planar structure is selected if one or two test molecules are predicted to have molecular weights of 50 to 250 Da (excluding halogen atoms).

Without wishing to be bound by theory, it is easier to confirm by visual observation that light transmitted through solution containing the insertion molecule and the metal complex has color, as the conjugated structure of a compound to be used as the insertion molecule (e.g., the above insertion molecule having a planar structure) is longer. Among such compounds, compounds that are not included by themselves in the metal complex can be particularly preferably used as the insertion molecule because change in color is possibly found by visual observation when pair inclusion occurred. Further, even when solution containing the insertion molecule and the metal complex does not have color that can be found by visual observation, color develops in some cases on the occurrence of pair inclusion. Also such an insertion molecule (e.g., having an electron-rich aromatic ring) can be preferably used for pair inclusion.

The insertion molecule for which change in color can be found by visual observation can be selected, for example, from compounds known to have color (e.g., known dyes). In one embodiment, selection can be made from such compounds which are known to have color and have been confirmed not to be included by themselves in the metal complex (this can be confirmed, for example, from no change in color after addition of the metal complex). For example, any known compound such as perylene, azulene, and metallocene or a derivative or substituted product thereof can be selected. Azulene (from blue to brown) and metallocene undergo significant change in color after inclusion, and other compounds that similarly undergo significant change in color can be preferably used. Perylene (from pale orange to dense orange) undergoes significant change in color after inclusion, and other compounds that similarly undergo significant change in color can be preferably used. In one preferred embodiment, the insertion molecule for which change in color can be found by visual observation can be selected from compounds that are usually colorless in solution but undergo pair inclusion to develop color. Any known compound or a derivative or substituted product thereof (e.g., a naphthalene derivative (from colorless to yellow), a phenanthrene derivative (from colorless to yellow), triphenylene (from colorless to yellow), pyrene (from colorless to orange), and an aniline derivative (from colorless to red)) can be selected as such an insertion molecule.

In one embodiment, the insertion molecule for which change in color can be found by visual observation can be selected from those further satisfying any of the above structural features of the insertion molecule, and can be particularly preferably a compound including an electron-rich aromatic ring (e.g., a fused aromatic ring, an aromatic ring containing a heteroatom, an aromatic ring having an electron-donating group (e.g., hydrogen, a methyl group, a methoxy group, an amino group)). In a particularly preferred embodiment, the insertion molecule for which change in color can be found by visual observation is optionally substituted pyrene, optionally substituted perylene, or optionally substituted triphenylene, and when any of these insertion molecules is used, the space that the test molecule can occupy in pair inclusion is appropriate in size, and the test molecule can relatively easily have a definite conformation when being included.

In one embodiment, the insertion molecule has a linear structure. In one embodiment, the insertion molecule having a linear structure is an optionally substituted saturated $C_{1-10}$ linear hydrocarbon chain or an optionally substituted unsaturated $C_{1-10}$ linear hydrocarbon chain, wherein the substituent of the hydrocarbon chain is selected from the group consisting of $C_{1-6}$ alkyl groups, halogens, a hydroxyl group, tri($C_{1-3}$ alkyl)silyl groups, a nitro group, a cyano group, and so on. In one embodiment, the insertion molecule having a linear structure includes one, two, or three triple bonds, and preferably includes the repeating unit $(-C\equiv C-)_d$, wherein d is 1, 2, or 3.

In one embodiment, the insertion molecule having a linear structure is represented by the formula $R_{N1}\text{-}L_{N1}\text{-}R_{N2}$, wherein $L_{N1}$ is a bond, a linear $C_{1-10}$ alkylene group optionally substituted with a halogen, a linear $C_{2-10}$ alkenylene group optionally substituted with a halogen, or a linear $C_{2-10}$ alkynylene group optionally substituted with a halogen; $R_{N1}$ and $R_{N2}$ are each independently selected from the group consisting of hydrogen, $C_{1-6}$ alkyl groups, tri($C_{1-3}$ alkyl)silyl groups, a halogen, a nitro group, a cyano group, and a hydroxyl group. In one embodiment, $L_{N1}$ is a bond, an unsubstituted linear $C_{1-10}$ alkylene group, an unsubstituted linear $C_{2-10}$ alkenylene group, or an unsubstituted linear $C_{2-10}$ alkynylene group. In one embodiment, $L_{N1}$ is an unsubstituted linear $C_{2-4}$ alkynylene group including one or two triple bonds. In one embodiment, $L_{N1}$ is an unsubstituted linear $C_{2-4}$ alkynylene group including one or two triple bonds.

In one embodiment, $L_{N1}$ is $-C\equiv C-$, $-C\equiv C-C\equiv C-$, or $-C\equiv C-C\equiv C-C\equiv C-$, and preferably $-C\equiv C-$ or $-C\equiv C-C\equiv C-$. In one embodiment, $L_{N1}$ is $-HC=CH-$.

In one embodiment, $R_{N1}$ and $R_{N2}$ are each independently selected from the group consisting of hydrogen, a methyl group, an ethyl group, a n-propyl group, an isopropyl group, a n-butyl group, an isobutyl group, a tert-butyl group, a trimethylsilyl group, and a triethylsilyl group.

In one embodiment, the insertion molecule having a linear structure is $(R)_3PAu(halogen)$, wherein each R is independently selected from $C_{1-4}$ alkyl groups. R is preferably a methyl group or an ethyl group.

In one embodiment, the insertion molecule having a linear structure includes any of the following structures:

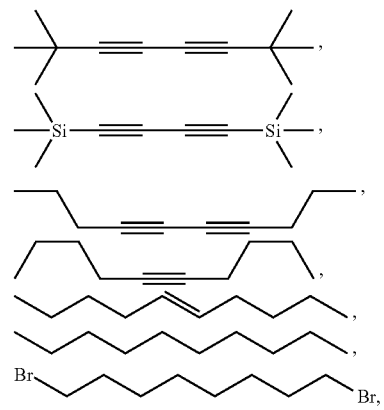

$R_3P-Au-Cl$ (wherein R is methyl or ethyl),

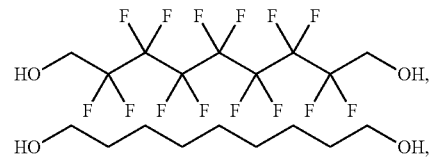

and is preferably

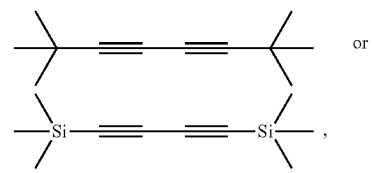

and is preferably

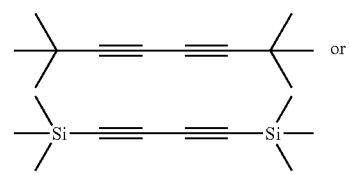

Selection of the insertion molecule having a linear structure is made so that the total of the molecular weight of one or two test molecules and one or two insertion molecules is 50 to 700 (Da) in one embodiment, 100 to 500 (Da) in a more specific embodiment, and 200 to 400 (Da) in a preferred embodiment. It should be noted that these preferred molecular weights are those when the test molecule is free of halogen atoms, and it is preferable when the test molecule contains a halogen atom that the product of the number of halogen atoms and its molecular weight be added to those molecular weights.

If the metal complex is specified and solvent is specified with respect to whether inclusion occurs, then the scope of the test molecule that can be included is naturally specified. The scope can be identified by checking whether an inclusion compound is generated in an inclusion compound generation experiment with the metal complex and the solvent, and conditions for identifying the scope include the situation that the test molecule includes a group having affinity with the solvent of the inclusion solution (e.g., including a hydrophilic group when the solvent is water).

In a method for selecting a metal complex suitable for inclusion, for example, if the test molecule is predicted to have characteristics of:
(A) having a hydrophilic group;
(B) having an electron-rich moiety; and
(C) including a backbone structure such that the longest part with the hydrophilic group excluded is 0.8 nm,
selection of a metal complex can be made in response to each characteristic of (A) to (C) so that:
(A') the metal complex is soluble in water;
(B') carbon atoms on an aromatic ring present in the center of gravity of molecules of the ligand in the metal complex are electron-deficient; and
(C') the inner diameter of the metal complex is about 0.8 to 1.2 nm in diameter.

In one embodiment, if a plurality of test molecules whose structures are unknown or uncertain is present,
1) the metal complex is dissolved in a solvent to prepare a metal complex test solution, and
2) one of the test molecules is added to the metal complex test solution to examine whether an inclusion compound is generated (e.g., by utilizing NMR, change in color);
through this process, the compatibility between the solvent and the test molecule is confirmed, and the same solvent may be used for the other test molecules.

In one embodiment, the test molecule can be included by a plurality of molecules of the metal complex in an overlapping manner.

(Crystallization)

The method of the present invention is characterized in that an inclusion compound in which the metal complex is including the test molecule is crystallized in the crystallization solution. Crystallization can proceed through the process that standardized molecules of the metal complex having the same molecular weight and three-dimensional shape and including the test molecule therein stack one after another. With addition of the volume of the metal complex, the volume of a crystal to be generated can be larger than when the test molecule is singly crystallized. By contrast, the amount of the test molecule present in a crystal to be generated can be smaller than when a crystal with the same size is obtained from the test molecule singly. Without wishing to be bound by theory, the three-dimensional shape of the metal complex is maintained by a rigid moiety included in the ligand, which can facilitate stacking of molecules of the metal complex into a crystal while the inner space needed for inclusion is ensured.

In one embodiment, some extent of flexibility possessed by the metal complex (e.g., flexibility caused by the situation that the interaction between the ligand and the metal complex is coordinate bonding) permits in an aspect a wider types of test molecules that can be included; however, if the flexibility of the metal complex is excessively high, it is difficult for the metal complex to crystallize so that test molecules are regularly arranged, and as a result the precision of structural analysis can be lowered. Hence, use of a metal complex with well-balanced flexibility for inclusion and rigidity for crystallization can be advantageous.

Crystallization ability is a characteristic independent of inclusion ability, and there were examples that even when inclusion had been confirmed for a test molecule, X-ray analysis of a single crystal generated found that possibly almost no test molecule was included in the single crystal. In one embodiment, crystallization may be performed without confirmation of inclusion of the test molecule. In the method of the present invention, structural determination of the test molecule can be possible by examination of crystallization conditions even when inclusion of the test molecule has not been confirmed.

It is generally difficult to predict crystallization conditions for molecules, and it takes many years in some cases to obtain crystals of a molecule. If the method of the present disclosure is used, however, crystals containing a targeted molecule can be obtained without any examination of conditions or with a little examination of conditions.

In the step of generating crystals, a crystallization solution is subjected under crystallization conditions to obtain a crystal. The crystallization conditions in the step of crystallization are similar to, although not the same as, conditions for crystallization of the metal complex (including no test molecule), and those skilled in the art could identify without excessive trials and errors.

The step of generating crystals can be performed under conditions such that at least some crystals including the inclusion compound are generated. The crystallization conditions in the step of crystallization include conditions for crystallization of a mixture of the inclusion compound and the metal complex or the inclusion compound.

In one embodiment, it can be advantageous if the solvent of the crystallization solution is aqueous solvent that the test molecule has at least one hydrophilic group.

Crystallization in a very small amount (e.g., 10 µL or less) of a crystallization solution has been considered to be disadvantageous, for example, because of various factors including estimated size of crystals, large variation of the composition of the crystallization solution, variable handling for different samples, susceptibility to ambient environments, strict control of the evaporation rate of solvent, and stochastic variation in timing of initiation of crystallization due to the very small amount. However, satisfactory crystals were unexpectedly obtained with high probability even with a very small amount, and there was a case where one crystal was formed in one independent crystallization solution. In one embodiment, more accurate control of crystals to be obtained can be achieved because only a few crystals (e.g., one, two, or three crystals, preferably one crystal) are formed in one independent crystallization solution through crystallization in a very small amount of a crystallization solution.

In one embodiment, preliminary diffraction data acquired for screening of crystals formed may be referred to in selecting crystals to be used for structural analysis. In one embodiment, preliminary diffraction data can be acquired by irradiating with an X-ray for a short period of time. To acquire such preliminary diffraction data, for example, an X-ray screening apparatus (PX-Scanner, Rigaku Oxford diffraction) or the like can be used, but the acquisition method is not limited thereto. In using an X-ray screening apparatus (PX-Scanner), crystals generated in wells can be sequentially screened, without need of setting each crystal on a stage in each screening.

In one embodiment, evaluation of crystals may be performed, in addition to evaluation with an X-ray screening apparatus, so as to select crystals satisfying the following criteria.

After an operation is performed to horizontally move a crystal by 10 mm in a crystallization solution of 5 mm depth by applying a force of $10^{-2}$ N or lower with a tungsten steel needle for crystal handling with a needle diameter of 0.1 mm, the shape retention rate of the crystal is 90% or higher.

After an operation is performed to suck a crystallization solution of 5 mm depth containing a crystal at a sucking rate of 6 µL/sec and then discharge the crystallization solution at a discharge rate of 6 µL/sec by using a 20- to 200-µL pipette tip with an aperture of 250 µm, the shape retention rate of the crystal is 90% or higher.

When a single crystal of a porous compound is observed by using a polarization microscope with crossed polarizers, neither color unevenness nor brightness unevenness is present in the crystal.

When a crystal is observed through a microscope, the crystal has no crack over the entire of the crystal and the transparency is not lowered. Degradation due to drying may occur in observing a crystal through a microscope. In this case, it is preferred to observe a crystal soaked in liquid.

After a crystal is contacted with solvent having the same composition as the solvent of the crystallization solution, the change rate in absorbance in a wavelength region of 450 to 500 nm in the UV-visible absorption spectrum is 10% or less. Generally, when a preferred crystal is measured for the ultraviolet-visible absorption spectrum, an absorption band is observed in a wavelength region of 1000 nm or shorter, and in one embodiment a crystal that undergoes a significant increase of absorption in a wavelength region of 450 to 700 nm is not preferred. In an unpreferred crystal, transmittance is lost over a wide range of wavelengths, and the baseline of the absorption spectrum can be raised from that of a preferred crystal.

In the present invention, the crystallization solution to crystalize the metal complex can be any liquid that dissolves the inclusion compound and crystallizes a crystal of the inclusion compound without releasing the test molecule from the metal complex. The solvent of the crystallization solution in the present invention can be preferably aqueous solvent.

The inclusion solution and the crystallization solution may be the same or different, but in a preferred embodiment the inclusion solution and the crystallization solution are liquids having an identical composition, and the inclusion solution can be directly used as the crystallization solution.

The crystallization solution may contain a salt, a crystallization accelerator, a pH adjuster, a viscosity adjuster, and so on, as necessary.

In one embodiment, the volume of the crystallization solution can be 10 µL or less, preferably 3 µL or less, and more preferably 2 µL or less. The present inventors have found that formation of a crystal from a very small amount of the crystallization solution enables crystal structure analysis of a very small amount of a test molecule, and conditions such that a single crystal is obtained can be set by using a very small amount of the crystallization solution. If the volume is excessively small, however, influence of errors of dispenses can appear, and hence the volume of the crystallization solution is preferably 100 nL or more, and can be more preferably 200 nL or more. In a preferred embodiment, the volume of the crystallization solution can be 200 nL to 2 µL, and more preferably 200 nL to 1 µL.

The inclusion solution prepared in the step of inclusion may be dispensed in a plurality of containers or wells in a plate to perform crystallization in independent crystallization solutions.

The amount of the test molecule to be contained in one independent crystallization solution depends on the total amount of the test molecule available, and in one embodiment the amount of the test molecule to be contained in one independent crystallization solution can be 1 ng to 1 mg, and in a preferred embodiment can be 10 ng to 0.1 mg, and more preferably 100 ng to 10 µg. The amount of the metal complex to be contained in one independent crystallization solution depends on the amount of the test molecule contained in the same crystallization solution, and the amount of the metal complex to be contained in one independent crystallization solution can be 1 ng to 1 mg, and in a preferred embodiment 10 ng to 0.1 mg, and more preferably 100 ng to 10 µg.

Without wishing to be bound by theory, in one embodiment of the present invention, molecules of the metal complex including the test molecule and molecules of the metal complex including no test molecule can be randomly mixed and crystallize to form a single crystal. The crystal thus formed, although having a lower packing factor of the test molecule, can be still available for structural determination.

The temperature in crystallization can be any temperature, but may be adjusted in accordance with the type(s) of the metal complex and/or test molecule selected, and is 0° C. to 100° C. in one embodiment.

The time to be taken for crystallization may be any time, but may be adjusted in accordance with the amount of the crystallization solution, the concentration of the inclusion compound in the crystallization solution, and the type of the metal complex selected, and is 10 minutes to 1 month in one embodiment. The air pressure in crystallization can be any air pressure.

The volatilization of the crystallization solution can increase the concentration of the inclusion compound to promote crystallization. Rapid increase of the concentration, however, can cause precipitation of the inclusion compound, formation of a crystal of an undesired crystal system, and formation of a twin or a polycrystal, and hence it is preferred to appropriately control the volatilization of the crystallization solution. In a representative embodiment of the present invention, elaboration to lower the volatilization rate can be more important since the volume of the crystallization solution is small.

Examples of methods for lowering the volatilization rate include adjustment of the vapor pressure around the crystallization solution, and the vapor pressure around the crystallization solution may be adjusted, for example, by selection of poorly volatile crystallization solvent (e.g., water), volatilization in a closed system, vapor transport, or temperature adjustment; however, adjustment of the vapor pressure around the crystallization solution is not limited thereto.

In one embodiment, unintended evaporation of the crystallization solvent may be suppressed by temperature adjustment for a period from dispensing the crystallization solution in wells to sealing the wells.

Crystallization can be performed with setting a plurality of crystallization conditions in crystallization solutions independent of each other. The present inventors have found that even when the amount of the test molecule is very small (e.g., less than 1 mg), it is more advantageous in some cases that the very small amount of the test molecule is further dispensed and crystals are generated in a plurality of independent crystallization solutions than generating a crystal as large as possible in a single crystallization solution. In one embodiment, crystallization is performed concurrently under a plurality of crystallization conditions. In one embodiment, crystallization of the inclusion compound is performed under conditions the same as or similar to those such that the metal complex including no test molecule crystallizes.

Examples of factors to be changed in setting crystallization conditions include the type of the metal complex (e.g., a metal complex with the type(s) of the metal atom and/or coordinate molecule being different, a metal complex with the counteranion being different), the insertion molecule, temperature, the amount of the crystallization solution, the composition of the crystallization solution (such as solvent, additives, and concentrations of components contained), and time. Preferably, the type and mixing ratio (for mixed solvent) of the solvent are set constant in setting crystallization conditions. There exist countless types of solvents, and they are largely different in characteristics and in most cases do not allow simple screening in contrast to temperature or concentrations, and hence fixing the type and mixing ratio (for mixed solvent) of the solvent can be advantageous for standardization and automation of the step of crystallization. In one embodiment, crystallization conditions are set to fix the crystallization solvent to the same aqueous solvent. In one embodiment, crystallization conditions are set to fix the crystallization solvent to the same aqueous solvent containing 90% or more, 95% or more, or 99% or more of water.

As used herein, "the same" used for crystallization conditions is intended to indicate that factors other than the test molecule (i.e., the type of the metal complex, the amount of the metal complex, the amount of the crystallization solution, the composition of the crystallization solution, temperature, air pressure, time, and so on) are set constant, and "the same" used for crystallization conditions when the type of the test molecule is changed is intended to indicate that the amount of the test molecule is further set constant. However, it is naturally understood that even when identical crystallization conditions are set, appropriate adjustment (for time, the amount of the crystallization solution, the composition of the crystallization solution, temperature, air pressure, and so on) based on technical difference in experiment among samples and degree of progression of crystallization is accepted.

"Similar" used for crystallization conditions refers to conditions with one or more changes within the following ranges:
  change of the metal complex such that the metal atom and/or coordinate molecule in the metal molecule are/is changed;
  change of the metal complex such that the counteranion is different;
  if any, change of the amount of the metal complex within the range of 10 to 1000% of the original conditions;
  if any, change of the amount of the test molecule within the range of 10 to 1000% of the original conditions;
  if any, change of the amount of the crystallization solution within the range of 10 to 1000% of the original conditions;
  if any, change of the composition of the crystallization solution such that concentrations of components are changed by less than 20% by weight;
  if any, change of time or air pressure within the range of 50 to 200% of the original conditions; and
  if any, change of temperature within the range of ±10° C. from the original conditions. Examples of the original conditions here include conditions such that the metal complex singly provides one single crystal and crystallization conditions when a molecule predicted to have something in common with the test molecule (e.g., having the same functional group, having the same or similar backbone structure, exhibiting similar retention behavior in chromatography) is used.

In one embodiment, examination on crystallization conditions may be performed separately in multiple stages. In one embodiment, for a few conditions (e.g., 10 crystallization conditions) values in wide ranges (e.g., the amount of the test molecule: 10 ng to 100 μg) may be set in the first-stage examination on crystallization conditions, and based on the result values in narrower ranges (e.g., the amount of the test molecule: 100 ng to 1 μg) may be set for more conditions (e.g., 20 crystallization conditions) in the second- and later-stage examinations on crystallization conditions. Preferably, the total amount of the test molecule to be used in the first-stage examination on crystallization conditions is smaller than the total amount of the test molecule to be used in the second-stage examination on crystallization conditions. In one embodiment, the original conditions in setting similar crystallization conditions can be conditions under which satisfactory crystallization was achieved in the first-stage examination on crystallization conditions.

In one embodiment, one of conditions of the amount of the crystallization solution at a certain component ratio, the amount of the test molecule, the amount of the metal complex, and the amount of the inclusion compound at a certain test molecule: metal complex ratio is changed, and the other conditions are set identical. Crystallization conditions for a given inclusion compound can be set with reference to crystallization conditions when the metal complex used to prepare the inclusion compound includes no test molecule.

In one embodiment, a plurality of crystallization conditions is tested for one test molecule. In this case, crystallization can be tested concurrently in a plurality of cells (referring to both of separated cells such as individual vials and integrated cells such as wells in a microplate) with conditions changed cell by cell. In one embodiment, cells suitable for aqueous solvent can be used in the step of crystallization of the present invention. In one embodiment, cells with a maximum capacity of 1 to 1000 μL can be used in the step of crystallization of the present invention. In one embodiment, cells for use in crystallization experiment for protein (e.g., wells in a microplate) can be used, and examples of such microplates include, but are not limited to, a VIOLAMO protein crystallization plate (AS ONE Corporation, Osaka, Japan). Cells may have been subjected to water-repellent finishing. Cells may be used together with reservoirs containing solution to control the rate of vapor transport, and the solution preferably contains a solute to control the osmotic pressure, and solvent the same as that of the crystallization solution or aqueous solvent can be used.

In one embodiment, 2 to 100 crystallization conditions may be tested for one test molecule, where the crystallization conditions may be the same, similar, or different. In one embodiment, crystallization may be performed under conditions the same as or similar to those such that the metal complex when including no test molecule provides a single crystal with a probability of 50% or higher to 100%, preferably of 80% or higher. In one embodiment, crystallization may be performed under conditions the same as or similar to those such that a single crystal is provided with a probability of 50% or higher.

In one embodiment, the volume of the crystallization solution immediately before taking out a crystal generated is almost totally occupied by the crystal, and almost no solvent may be present; in this case, however, it is preferable that the solvent have not completely been evaporated and the crystal be not dried. In one embodiment, solvent, preferably solvent the same as that at initiation of crystallization may be added to the crystallization solution during the step of crystallization.

In the present invention, a seed crystal may be used to raise the probability that a single crystal of a desired crystal system is formed. Those skilled in the art can suitably use such a seed crystal.

In one embodiment, a stimulus to initiate crystallization may be provided by applying any of light, electromagnetic waves, lasers, magnetic fields, electric fields, heat, solvent, sound waves, vibration, and so on. Those skilled in the art can suitably adjust the duration and amount of such a stimulus.

The ratio of amounts of the metal complex and the test molecule, as specified by the metal complex: test molecule mole ratio and the A value, can affect crystallization.

In one embodiment, the A value in the crystallization solution can be 0.01 to 100, and preferably 0.1 to 10. As the A value is larger, the proportion of test molecules not included in the metal complex increases, and crystallization of the metal complex is inhibited in some cases. As the A value is smaller, by contrast, the packing factor of the test molecule in a single crystal decreases, and the quality of diffraction data to be acquired can be lowered.

In one embodiment, the metal complex: test molecule mole ratio in the crystallization solution can be 1:100 to 100:1, and is 1:10 to 10:1 in one embodiment, and 1:5 to 1:1 in a further embodiment. As the number of test molecules included per molecule of the metal complex is larger, it is preferred to increase the mole ratio of the test molecule to the metal complex.

Regarding the dimensions of a crystal to be formed, the length of a side can be 1 to 1000 μm, and preferably 100 to 400 μm.

In one embodiment, the crystal system of a crystal to be formed can be triclinic or monoclinic, but is not limited thereto. In one embodiment, crystals suitable for acquiring X-ray or neutron beam diffraction data in the method of the present invention have a feature, for example, of having a space group of low symmetry.

In one embodiment, a crystal to be formed can provide a spot that can be detected even with a resolution of 0.8 angstroms or smaller.

In one embodiment, the number of crystals formed in one independent crystallization solution in the method of the present invention is preferably one, and if a plurality of crystals is formed, problems can arise such as formation of small-sized crystals and difficulty in screening of the crystals.

In the method of the present invention, the crystal is preferably a single crystal, and twins and polycrystals are likely not to allow satisfactory structural analysis. Determination of the quality of crystals is performed by screening the crystals and determining the quality of the crystals based on the results of screening. In one embodiment, an X-ray irradiation/detection device may be used for screening of crystals. Determination of the quality of crystals may be performed by observing through an optical microscope or based on results of screening of the crystals. In one embodiment, when the quality of crystals is determined based on results of screening of the crystals with X-ray irradiation, crystals with relatively satisfactory diffraction may be selected from a plurality of diffraction data acquired and determined as being of high quality. In one embodiment, examples of criteria to determine whether diffraction is satisfactory include, but are not limited to, that more outer diffraction spots are detectable, that the attenuation of diffraction spot intensity from the inner side to the outer side is less, and that the contrast of each diffraction spot is clearer. In one embodiment, an X-ray screening apparatus can be used for screening of crystals, and examples of such apparatuses include, but are not limited to, a PX-Scanner (Rigaku Oxford diffraction).

In crystallization of protein, generally, conditions that provide a satisfactory crystal are sought by combining conditions including the type of a salt, the salt concentration, and the concentration of protein to be crystallized and optionally inserting a crystallization-promoting domain through modification, or by allowing the protein to form a complex with other protein. The method of the present disclosure has an advantage that a crystal including the test molecule can be obtained without such trials and errors.

NMR is often used to determine the structure of a molecule. To acquire sufficient information by NMR, around 5 to 10 mg of a sample is typically required. Measurement is possible even with 1 mg or less, but time-consuming, for the cumulative time taken for acquiring a spectrum with a half sample concentration is four times that with the original sample concentration. In typical NMR measurement, analysis of an optically active test molecule can determine only the relative three-dimensional configuration, and it is difficult to determine the absolute configuration in the molecule.

(Kit)

The present invention provides, in one aspect, a kit for analyzing the structure of a test molecule with an X-ray or a neutron beam, and this kit includes a metal complex and an instruction to use the kit. In one embodiment, the kit includes a metal molecule, a ligand capable of forming a metal complex with the metal atom, and an instruction to use the kit. In one embodiment, the kit further includes a crystallization solvent. In one embodiment, the kit further includes cells for performing inclusion and/or crystallization. The cells can be used so that conditions are different among the cells, but may be used in such a manner that at least some of the cells are under the same conditions. Examples of conditions that can be changed among the cells include, but are not limited to, the amount and type of the metal complex (e.g., a metal complex with the type of the coordinate molecule being different, a metal complex with the counteranion being different), the presence or absence and type of an insertion molecule, the amount of the test molecule, and the amount and composition of the crystallization solution (such as solvent, additives, and concentrations of components contained). In one embodiment, conditions that are preferably changed are the type of the coordinate molecule, the type of the counteranion, the presence or absence and type of an insertion molecule, and the composition of the crystallization solvent. In one embodiment, the cells in the kit are provided in such a manner that the metal complex and/or crystallization solvent have/has been disposed in advance in the cells.

(Acquisition and Analysis of Diffraction Data)

When crystals generated are collected from the crystallization solution, the volume of the crystallization solution may be increased by adding solvent for easy operation.

X-ray diffraction or neutron beam diffraction is measured for the crystals obtained. Any radiation source to generate an X-ray or a neutron beam can be used in the method of the present invention, and in one embodiment an MoKα ray (wavelength: 0.71 Å) generated at a tube voltage of 24 kV and a tube current of 50 mA can be used as a radiation source. In one embodiment, for example, an APEX II/CCD diffractometer produced by Bruker can be used as a radiation source.

Any detector can be used for detection of the diffraction X-ray or neutron beam, and in one embodiment CCD detectors can be used. Examples of detectors include, but are not limited to, a SuperNova (Rigaku Oxford diffraction) and a Pilatus (DECTRIS AG, Baden-Daettwil, Switzerland).

In one embodiment, setting to low temperature can suppress the molecular motion of the test molecule in measurement of X-ray diffraction or neutron beam diffraction. In one embodiment, criteria for evaluation of the quality of diffraction data acquired are that more outer diffraction spots are detectable, that the attenuation of diffraction spot intensity from the inner side to the outer side is less, and that the contrast of each diffraction spot is clearer, but the criteria are not limited thereto.

The test molecule can be subjected to structural analysis based on the X-ray diffraction or neutron beam diffraction data acquired. In one embodiment, the three-dimensional structure of the test molecule is determined. In one embodiment, the chemical structure of the test molecule is determined. In some embodiments, a partial chemical structure of the test molecule (e.g., chirality of one or more atoms, or cis-trans isomerization) is determined. In one embodiment, an unknown or uncertain part of the test molecule is determined.

Any software may be used to calculate the structure of the molecule from the X-ray or neutron beam diffraction data, and examples of applicable software include, but are not limited to, Mercury (Cambridge Crystallographic Data Centre, U.S.).

In one embodiment, structural analysis is performed based on a portion with high electron density such as a metal atom (heavy atom) as a clue. In one embodiment, structural determination may be performed with additional use of information other than diffraction data (e.g., elemental analysis information, NMR information, properties information). In one embodiment, the structure of the metal complex portion in a crystal of the inclusion compound can be predicted with reference to the structure of the metal complex including no test molecule.

(Automation)

In the method of the present invention, some or all of the steps may be automatically performed. The method of the present invention allows analysis of a very small amount of a sample, and hence use of a system capable of accurately handling a small amount of solvent is advantageous. Since aqueous solvent is used, automation of devices to be handled is easy, and in addition an existing automated system can be readily used. Once crystallization conditions for a metal complex are determined, significant variation of crystallization conditions is not needed and crystallization conditions can be standardized when a plurality of test molecules are subjected to structural analysis by using the metal complex, and hence automation of devices or settings to be used is easy. Automation reduces the need for technical skills.

In one embodiment, one or more of the following steps can be automated as necessary:
- a step of selecting the type of a metal complex to be applied to a test molecule;
- a step of preparing the metal complex;
- a step of dispensing liquid containing the metal complex;
- a step of dispensing liquid containing the test molecule;
- a step of forming an inclusion compound;
- a step of removing test molecules not included from the inclusion solution;
- a step of setting crystallization conditions to be tested;
- a step of dispensing the inclusion solution;
- an optional step of confirming formation of an inclusion compound (or a pair inclusion compound) through change in wavelengths of light (e.g., color);
- a step of preparing a crystallization solution;
- a step of pipetting after dispensing;
- a step of sealing wells;
- a step of exchanging a well plate;
- a step of incubating a well plate;
- a step of controlling crystallization conditions (such as the shaking speed, temperature, air pressure, and vapor pressure);
- a step of screening crystals formed;
- a step of determining screening results;
- a step of determining the quality of crystals formed;
- a step of selecting a crystal to acquire X-ray or neutron beam diffraction data;
- a step of taking out a crystal formed and setting it on a stage for X-ray or neutron beam irradiation;
- a step of acquiring X-ray or neutron beam diffraction data; and
- a step of performing structural analysis through analysis of the X-ray diffraction data acquired.

Even when an inclusion compound is crystallized under the same conditions, a crystal of different quality is obtained in some cases. For this reason, it is advantageous to perform crystallization under a plurality conditions, even if the conditions are the same or similar crystallization conditions, and select a crystal of higher quality therefrom. Crystallization under a plurality of conditions for a plurality of test molecules causes the need for preparation of a huge number of samples, and also requires enormous time for operations and consumption of disposal instruments used for operations. As a result, human errors such as mistake of samples or intercontamination among samples can occur. Particularly when the amount of a sample is very small, variation among samples due to manual operations tends to be relatively large, and the accuracy and precision of experiment can be lowered.

Hence, large advantages can be obtained particularly if the steps of dispensing, which require large volumes of manual operations, can be automated. The present inventors have discovered a method for crystallizing a very small amount of an inclusion compound, and found that the steps of aluquoting liquid, which require the largest volume of operations, can be automated.

Examples of machines applicable for automation in the present invention include, but are not limited to, an autosampler, a crystal screening apparatus, and an incubator. In one embodiment, a device for structural analysis of protein can be used as such a system for automation, and screening of crystals may be performed, for example, by using a JANSi UVEX (AS ONE Corporation, Osaka, Japan).

In the method of the present invention, a liquid-dispensing system capable of handling a very small amount of liquid (e.g., 10 µL or less) may be used, and an automated dispensing system used for crystallization experiment for protein can be used as such an dispensing system. Examples of dispensing systems applicable to the method of the present invention include, but are not limited to, a Gryphon LCP (Art Robbins Instruments, LLC, CA, USA).

In one embodiment, automation of determination of the quality of crystals may be performed by using an X-ray screening apparatus, and examples of such apparatuses include, but are not limited to, a PX-Scanner (Rigaku Oxford diffraction).

(Applications of the Present Invention)

The present disclosure provides, in one embodiment, a library of molecules having common chemical structure, and a method for producing the library. When structural analysis of a molecule having a given basic structure by using the method of the present disclosure has succeeded, the type of the metal complex used in this structural analysis is predicted to be capable of including a structurally similar molecule with the same basic structure as a test molecule. Hence, it is predicted that if the steps of inclusion and crystallization of the test molecule and the type of the metal complex to be used are optimized for any one molecule of a group of molecules being structurally similar but structurally different in detail, then a satisfactory single crystal sample can be obtained for another molecule of the group of molecules under the same or similar conditions.

If structural determination has succeeded for at least one compound of a group of compounds predicted to have a common backbone structure by using the method of the present invention, structural analysis of another compound of the group of compounds can be easily performed by using the method of the present invention. For example, crystallization conditions (e.g., the type of the metal complex, the type of the coordinate molecule, the type of the counteranion, the solvent composition, the type of the insertion molecule) when structural determination succeeded for a compound of a group of compounds predicted to have a common backbone structure are predicted to be crystallization conditions suitable also for another compound of the group of compounds, and crystallization conditions the same as or similar to the crystallization conditions can be applied.

Examples of compounds predicted to have a common backbone structure include compounds extracted from the corresponding sites of related species, metabolites obtained from a genetically modified biological population, reaction products obtained by treating the same starting compound, and decomposed products (e.g., decomposed products formed by light, electric fields, and so on) obtained from the same type of organic material (polymer material such as organic EL material and organic semiconductor material).

As described above, the method of the present disclosure is particularly useful for quick structural determination of structurally similar molecules. Examples of groups of molecules similar in structure to each other include, but are not limited to, a group of molecules obtained by subjecting base molecules to physical, chemical, or enzymatic treatment, a group of molecules in a metabolic pathway of a living organism, and a group of molecules obtained by manipulating a metabolic pathway of a living organism.

Other Embodiments

Hereinbefore, the present invention has been described by showing preferred embodiments for ease in understanding. The present invention will be hereinafter described based on Examples; however, the above description and Examples below are provided only for exemplification, not for limitation of the present invention. Therefore, the scope of the present invention is limited neither to the embodiments specifically described herein nor to Examples, and limited only by the appended claims.

EXAMPLES

Experiments shown below were conducted to demonstrate that the method of the present invention enables crystallization of very small amounts of test molecules. In addition, examination was made on automation of liquid operations in the steps before crystallization.

(Apparatus)

Melting points were measured, without any correction, by using a micro melting point apparatus (produced by ANATEC YANACO CORPORATION). $^1$H NMR and $^{13}$C NMR spectra were recorded (at 500 and 125 MHz, respectively) by using a Bruker DRX-500 spectrometer. FT-IR spectra were recorded by using a SHIMADZU FTIR-8300 spectrometer. Mass spectra were recorded by using a SHIMADZU QP-5050A mass spectrometer. Column chromatography was performed with Silica gel 60 (Merck KGaA, Art. 7734).

Example 1

Figure 26:
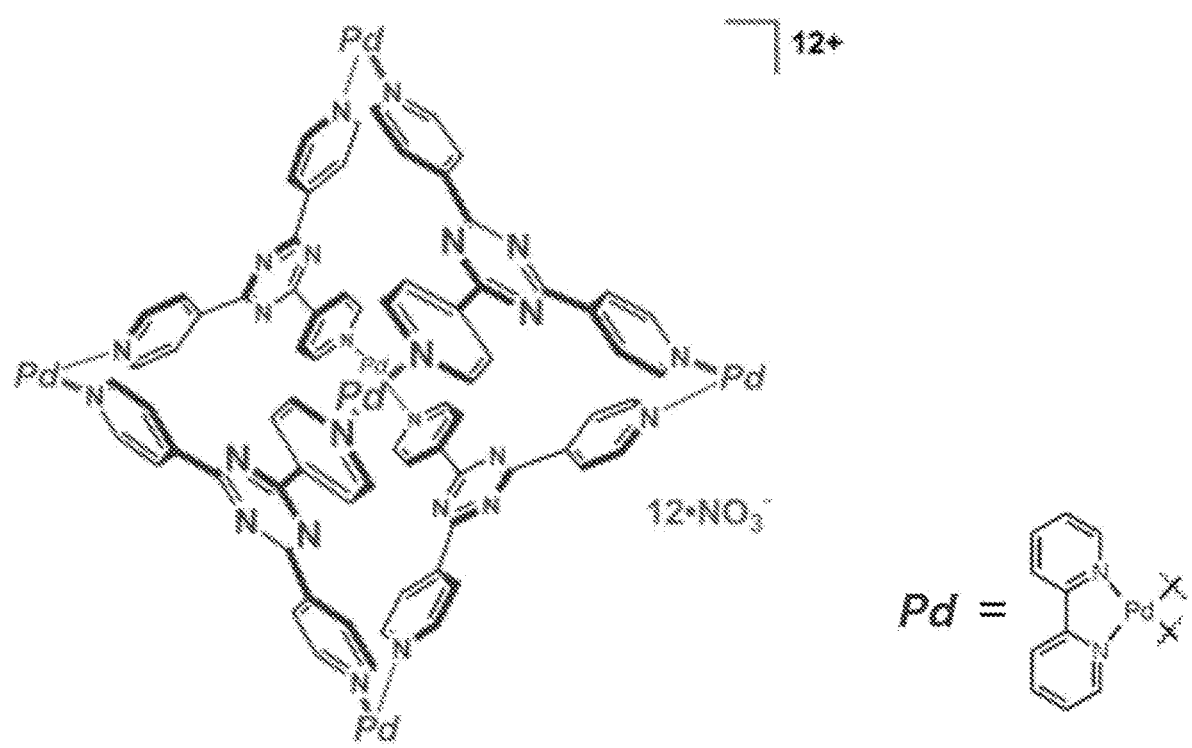
FIG. 26 shows a octahedral metal complex [{(2,2'-bipyridyl)palladium}$_6$(2,4,6-tris(4-pyridyl)-1,3,5-triazine)$_4$].

Synthesis of Octahedral Metal Complex [{(2,2'-bipyridyl)palladium}$_6$(2,4,6-tris(4-pyridyl)-1,3,5-triazine)$_4$] as Shown in FIG. 26

A metal complex was synthesized in the following manner according to a method described in Nature 1995, 378, 469-471, except that the bidentate ligand in the metal molecule was changed. To solution of (2,2'-bipyridyl)palladium dinitrate (1.00 g, 2.59 mmol) in H$_2$O-MeOH mixed solvent (30 mL and 30 mL), 2,4,6-tris(4-pyridyl)-1,3,5-triazine (0.537 g, 1.72 mmol) was added. The resulting suspension was stirred at 80° C. for 0.5 hours. A trace amount of insoluble matter was removed through filtration, and the resulting clear yellow solution was evaporated to obtain the titled metal complex as a pale yellow crystal (1.07 g, 70%). Melting point: >300° C.; $^1$H NMR (500 MHz, D20, TMS (external standard)) δ 9.47 (d, 24H, PyH$^\alpha$), 8.92 (d, 24H, PyH$^\beta$), 8.50 (d, 12H, bipy), 8.39 (t, 12H, bipy), 7.71 (d, 12H, bipy), 7.61 (t, 12H, bipy); $^{13}$C NMR (125 MHz, D20, CDCl$_3$ (external standard)) δ 169.6 (s, triazine), 156.7 (s, bipy), 152.3 (d, PyC$^\alpha$), 150.2 (d, bipy), 146.3 (s, triazine), 142.9 (d, bipy), 128.1 (d, bipy), 126.6 (d, PyC$^\beta$), 124.4 (d, bipy). Anal. C$_{132}$H$_{96}$N$_{48}$O$_{36}$Pd$_6$·9H$_2$O, Calcd: C, 42.49; H, 3.08; N, 18.02. Found: C, 42.61; H, 2.81; N, 18.13.

Example 2

To solution dissolving 0.06 mmol of 2,4,6-tris(4-pyridyl)-1,3,5-triazine as a ligand in 18 mL of heavy water, 0.09 mmol of (2,2'-bipyridyl)palladium dinitrate was added, and reacted at 100° C. for 24 hours to prepare M$_6$L$_4$ metal complex solution. This metal complex solution was then diluted with heavy water to 5 mM.

From the diluted solution, 1 mL (containing 5 µmol of the metal complex) was taken and transferred into a test tube with a lid, and the test molecule drospirenone 2a (2.02 mg, 5.5 µmol) was added thereto to prepare inclusion solution. The test tube was shaken with a vortex mixer for several seconds, and stirring was then performed with a magnetic stirrer at room temperature for 30 minutes. Drospirenone 2a left undissolved was removed through filtration with the filter 13HP045AN (ADVANTEC, Tokyo, Japan), and $^1$H NMR (DRX 500 (Bruker BioSpin, Kanagawa, Japan)) confirmed that a 1:1 inclusion compound of drospirenone 2a and a $M_6L_4$ metal complex 1 was formed. Subsequently, the inclusion solution prepared above was dispensed in a commercially available protein crystallization plate (VIOLAMO protein crystallization plate) (AS ONE Corporation, Osaka, Japan) by using the protein crystallization apparatus Gryphon LCP (Art Robbins Instruments, LLC, CA, USA). In reservoir wells (large-capacity wells), different concentrations of saline (150 to 600 mM) were dispensed into 20 µL portions, and the inclusion solution prepared above was dispensed into 2 µL portions (each containing about 10 nmol of the test molecule) in 96 sample wells (small-capacity wells) to prepare a crystallization solution. After dispensing the inclusion solution, the plate was sealed, and placed in the incubator CN-25C (MITSUBISHI ELECTRIC ENGINEERING COMPANY LIMITED, Tokyo, Japan) set at 20° C. and left to stand there. The difference in osmotic pressure between the crystallization solution and each saline concentrated the crystallization solution to provide crystals.

The thus-obtained crystals were subjected to initial screening with a PX Scanner (Rigaku Oxford diffraction), and crystals having sufficient diffraction intensity up to a resolution of 0.78 angstroms with a space group of low symmetry such as triclinic and monoclinic space groups were further sorted out. For the crystals thus sorted out (10 crystals), X-ray diffraction data were collected by using a SuperNova (Rigaku Oxford Diffraction). Analysis of the X-ray diffraction data successfully determined that the test molecule was drospirenone 2a. Crystallization and structural determination from about 10 nmol of a test molecule was thus achieved.

Example 3

Structural determination was attempted for a combination of a metal complex formed from a metal molecule different from that in Example 2 and a test molecule different from that in Example 2.

Preparation of Inclusion Solution

In the same manner as in Example 1, solution of a $M_6L_4$ cage-type molecule metal complex (5 mM, 1 mL) was prepared in water by using 2,4,6-tris(4-pyridyl)-1,3,5-triazine (6.3 mg) as a ligand and (N,N,N',N'-tetramethylethylenediamine)palladium dinitrate (10.4 mg) as a metal molecule. To the resulting metal complex solution, a test molecule (cortisone acetate, 10.6 mg) in a molar amount equal to that of the metal complex was added, and the resultant was stirred to prepare inclusion solution (1 mL) of metal complex:test molecule=1:1. Thereafter, the inclusion solution was heated at 80° C. for 1 hour to complete inclusion of the test molecule in the metal complex. The temperature was returned to room temperature, and filtration was then performed with the filter unit 13HP045AN (ADVANTEC, Tokyo, Japan) to obtain a clear solution (containing a metal complex-test molecule inclusion compound 1).

Dispensing with Automated Apparatus

By using the protein crystallization/dispensing system Gryphon LCP (Art Robbins Instruments, LLC, CA, USA), the solution obtained was automatically dispensed into 2 µL portions (each containing about 10 nmol of the test molecule) in 96 wells in a VIOLAMO protein crystallization plate (microplate) (AS ONE Corporation, Osaka, Japan) to provide a microplate with the solution (crystallization solution) of the metal complex-test molecule inclusion compound 1 introduced thereinto. At this time, an appropriate concentration (about 100 mM) of saline to induce solvent evaporation in wells through vapor transport was simultaneously dispensed in deep wells (reservoirs) additionally provided.

Crystallization

The microplate produced was placed in the incubator CN-25C (MITSUBISHI ELECTRIC ENGINEERING COMPANY LIMITED, Tokyo, Japan) set at 20° C. and left to stand there for 2 weeks, and as a result concentration of the crystallization solution containing the inclusion compound 1 gradually proceeded, and observation through an optical microscope confirmed that single crystals including the inclusion compound 1 were successfully generated.

Screening of Crystals

To quickly check whether the thus-generated single crystals including the inclusion compound 1 in wells in the microplate were suitable for X-ray structural analysis, screening was performed by using the X-ray screening apparatus PX-Scanner (Rigaku Oxford diffraction) to sort out satisfactory single crystals.

X-Ray Crystal Structure Analysis

X-ray crystal structure analysis with a SuperNova (Rigaku Corporation, Tokyo, Japan) or a Pilatus (DECTRIS AG, Baden-Daettwil, Switzerland) was performed for the single crystals sorted out, and thereby structural analysis of the inclusion compound 1 succeeded (FIG. 1) (Table 1).

TABLE 1

| Crystal system | Monoclinic |
|---|---|
| Space group | P1 |
| a (Å) | 19.2773 |
| b (Å) | 19.6700 |
| c (Å) | 28.8065 |
| α (°) | 102.275 |
| β (°) | 91.296 |
| γ (°) | 112.605 |
| $R_{int}$ (%) | 3.32 |
| $R_1$ (%) | 14.75 |
| GOF | 1.691 |
| Flack | 0.404(7) |

Structural analysis of a combination of a metal complex and test molecule different from those in Example 1 thus succeeded. Crystallization and structural determination of about 5 nmol of a test molecule was achieved.

Example 3A

Similarly the metal complex described in Example 2 or Example 3 was used, and production of single crystals of an inclusion compound and X-ray structural analysis succeeded for the following compounds:

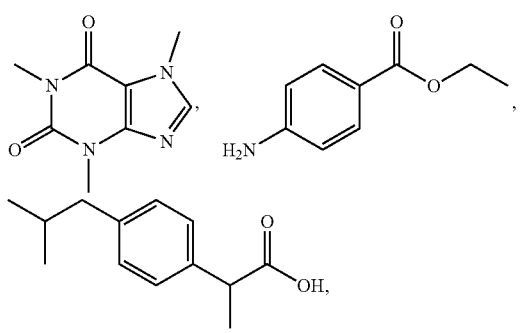

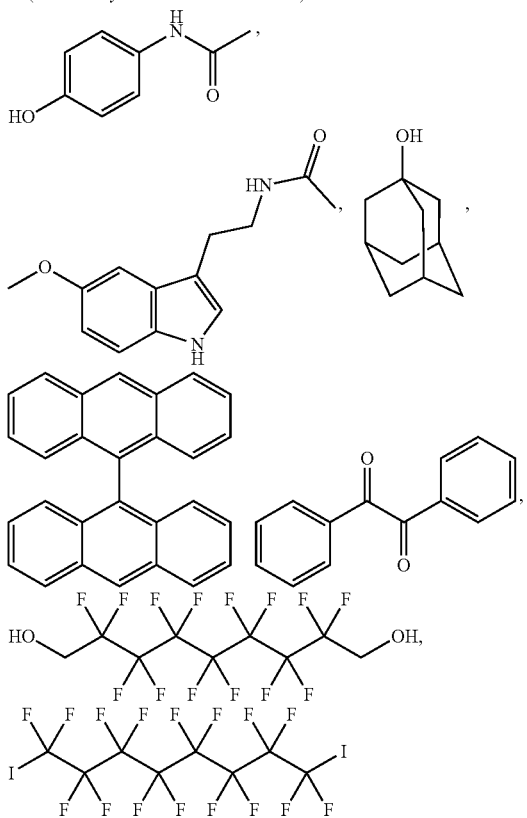

Molecular weights of the compounds ranged from about 130 to about 360 (up to about 660 for highly-fluorinated compounds), and the compounds included, in terms of type, compounds having a benzene ring (structure), compounds having an aromatic heterocycle, a compound having a carbocycle, and aliphatic organic halogen compounds. The results of the present Example demonstrated that use of the method of the present invention enables X-ray structural analysis of compounds having a very wide diversity of structures. For organic halogen compounds among the compounds, it is generally hard to apply the rule of thumb of NMR and to obtain crystals of them, and hence structural determination of them is considered difficult; however, structural determination succeeded with ease through use of the method of the present invention.

Example 4

To demonstrate that structural analysis is possible even when the same metal complex is used and the test molecule is changed, an experiment was conducted under the same procedure/concentration conditions as in Example 3 except that the test molecule was replaced with methyl cholate (10 mg), and production of single crystals of an inclusion compound and X-ray structural analysis succeeded as demonstrated in FIG. 2.

Those experiments demonstrate that even when the type of the metal molecule of a metal complex and the type of a test molecule are changed, the method of the present invention allows structural analysis of a test molecule under the same crystallization conditions as the original crystallization conditions.

Through automation of preparation of a crystallization solution, obtainment of single crystals and structural analysis succeeded with a very small liquid volume of several microliters.

Example 5

Next, the following experiment was conducted to demonstrate that structural determination is possible even when the total amount of a test molecule is very small.

In the same manner as in Example 3, 0.09 mmol of (2,2'-bipyridyl)palladium dinitrate was added to solution dissolving 0.06 mmol of 2,4,6-tris(4-pyridyl)-1,3,5-triazine as a ligand in 18 mL of water, and reacted at 100° C. for 24 hours to prepare $M_6L_4$ metal complex solution. This metal complex solution was then diluted with water to 5 mM.

From the diluted solution, 192 μL was taken, to which the test molecule bisanthracene (9,9'-bianthracene) (68 μg, 0.19 μmol) was added to prepare inclusion solution.

Subsequently, the inclusion solution prepared above was dispensed in a VIOLAMO protein crystallization plate (AS ONE Corporation, Osaka, Japan) by using a Gryphon LCP (Art Robbins Instruments, LLC, CA, USA). Saline was dispensed in the same manner as in Example 3 to prepare wells for vapor transport, and the inclusion solution prepared above was dispensed into 2 μL portions (each containing about 2 nmol of the test molecule) in 96 sample wells to prepare a crystallization solution. After dispensing the inclusion solution, the plate was sealed, and placed in the incubator CN-25C (MITSUBISHI ELECTRIC ENGINEERING COMPANY LIMITED, Tokyo, Japan) set at 20° C. and left to stand there for 5 days to obtain single crystals. The thus-obtained single crystals were screened with the X-ray screening apparatus PX-Scanner (Rigaku Oxford diffraction) to sort out satisfactory single crystals.

For the crystals thus sorted out, X-ray diffraction data were collected by using a SuperNova (Rigaku Oxford Diffraction). Analysis of the X-ray diffraction data successfully determined that the test molecule was bisanthracene. Thus, it was confirmed that structural analysis is possible by using the method of the present invention even when the total amount of a test molecule is a very small amount of 68 μg (0.19 μmol). Structural analysis was achieved with single crystals obtained from about 2 nmol of a test molecule.

Example 6

This Example demonstrates an example of setting of crystallization conditions to obtain crystals suitable for structural analysis.

$M_6L_4$ metal complex aqueous solution (5 mM) was prepared in the same manner as in Example 3. From the metal complex aqueous solution, 192 μL was taken, to which the test molecule diphenylethanedione (59 μg, 0.28 μmol) was added to prepare inclusion solution.

Subsequently, the inclusion solution prepared above was dispensed in a VIOLAMO protein crystallization plate (AS ONE Corporation, Osaka, Japan) by using a Gryphon LCP (Art Robbins Instruments, LLC, CA, USA). Saline was dispensed in the same manner as in Example 3 to prepare wells for vapor transport, and the inclusion solution was dispensed into portions (about 0.5 to 3.9 µL) of the inclusion solution set to each contain 0.013 to 1.2 µg of the test molecule in wells to prepare a crystallization solution. After dispensing the inclusion solution, the plate was sealed, and placed in the incubator CN-25C (MITSUBISHI ELECTRIC ENGINEERING COMPANY LIMITED, Tokyo, Japan) set at 20° C. and left to stand there for 5 days. As a result, single crystals were obtained from the wells with an dispensing of the inclusion solution corresponding to 0.58 µg (about 2.8 nmol) of the test molecule. The thus-obtained single crystals were screened with the X-ray screening apparatus PX-Scanner (Rigaku Oxford diffraction) to sort out satisfactory single crystals. For the crystals thus sorted out, X-ray diffraction data were collected by using a SuperNova (Rigaku Oxford Diffraction), and the structure of the test molecule was successfully analyzed.

Thus, it was confirmed that even when the total amount of a test molecule is very small (59 µg, 0.28 µmol), structural analysis is possible by examining a plurality of crystallization conditions. Structural determination was achieved with single crystals obtained from about 2 nmol of a test molecule.

Example 7

This Example demonstrates that structural determination of a volatile molecule is possible by using the method of the present invention.

$M_6L_4$ metal complex aqueous solution (5 mM) was prepared in the same manner as in Example 3. Subsequently, the metal complex aqueous solution prepared and the test molecule 2-iodoheptafluoropropane (boiling point: 38° C.) were dispensed in a VIOLAMO protein crystallization plate (AS ONE Corporation, Osaka, Japan) by using a Gryphon LCP (Art Robbins Instruments, LLC, CA, USA). Specifically, saline was dispensed in the same manner as in Example 3 to prepare wells for vapor transport, and the metal complex aqueous solution was initially dispensed into 1.8 µL portions in 96 sample wells and 2-iodoheptafluoropropane was then dispensed into 0.5 µL portions in the same wells (total amount: 48 µL, 0.34 µmol). After dispensing, the plate was sealed, and placed in the incubator CN-25C (MITSUBISHI ELECTRIC ENGINEERING COMPANY LIMITED, Tokyo, Japan) set at 20° C. and left to stand there to perform inclusion and crystallization on the wells. As a result, single crystals were obtained, and the thus-obtained single crystals were screened with the X-ray screening apparatus PX-Scanner (Rigaku Oxford diffraction) to sort out satisfactory single crystals. For the crystals thus sorted out, X-ray diffraction data sufficient to confirm the structure of the test molecule were successfully acquired. Thus, it was demonstrated that structural analysis is possible even for a volatile molecule by using single crystals obtained with the method of the present invention.

Example 8

This Example demonstrates that structural determination is possible by using the method of the present invention even with crystals generated in a very small amount of the crystallization solution.

$M_6L_4$ metal complex aqueous solution (5 mM) was prepared in the same manner as in Example 3, and the test molecule ibuprofen was added to this metal complex aqueous solution to a concentration of 5 mM to prepare inclusion solution.

Subsequently, the inclusion solution prepared above was dispensed in a VIOLAMO protein crystallization plate (AS ONE Corporation, Osaka, Japan) by using a Gryphon LCP (Art Robbins Instruments, LLC, CA, USA). Saline was dispensed in the same manner as in Example 3 to prepare wells for vapor transport, and the inclusion solution was dispensed into 1 µL portions in wells to prepare a crystallization solution. After dispensing the inclusion solution, the plate was sealed, and placed in the incubator CN-25C (MITSUBISHI ELECTRIC ENGINEERING COMPANY LIMITED, Tokyo, Japan) set at 26° C. and left to stand there for 4 days. As a result, single crystals were obtained, and the thus-obtained single crystals were screened with the X-ray screening apparatus PX-Scanner (Rigaku Oxford diffraction) to sort out satisfactory single crystals. For the crystals thus sorted out, X-ray diffraction data were collected by using a SuperNova (Rigaku Oxford Diffraction), and the structure of the test molecule was successfully analyzed.

Thus, it was confirmed that structural analysis is possible by using the method of the present invention with single crystals generated in a very small amount, 1 µL (about 5 nmol for both a metal complex and a test molecule), of the crystallization solution.

Example 9

This Example demonstrates an example that structural determination is possible by using the method of the present invention through combining a test molecule with another molecule (insertion molecule).

$M_6L_4$ metal complex aqueous solution was prepared in the same manner as in Example 3. The test molecule caffeine was added to the metal complex aqueous solution to prepare inclusion solution. Saline was dispensed in the same manner as in Example 3 to prepare wells for vapor transport, and the inclusion solution was dispensed in sample wells to prepare a crystallization solution, and crystallization was performed. The thus-obtained crystals were screened with the X-ray screening apparatus PX-Scanner (Rigaku Oxford diffraction) to sort out satisfactory single crystals; however, any single crystal that allowed structure analysis of the test molecule was not obtained.

Next, caffeine and pyrene were added to the above metal complex aqueous solution to prepare inclusion solution. Saline was dispensed in the same manner as in Example 3 to prepare wells for vapor transport, and the inclusion solution was dispensed in sample wells to prepare crystallization solution, and crystallization was performed. As a result, single crystals were obtained, and the thus-obtained crystals were similarly screened with the X-ray screening apparatus PX-Scanner to sort out satisfactory single crystals, and then X-ray structural analysis of the single crystals thus sorted out successfully confirmed the structure of the test molecule.

Further, examination was made on whether pair inclusion occurs for various combinations of a test molecule and an insertion molecule. The same octahedral $M_6L_4$ metal complex as in Example 2 or 3 was used. Pair inclusion was confirmed for combinations listed in the table below. Compound A mostly corresponds to a test molecule, and Compound B mostly corresponds to an insertion molecule, though the table does not exclude the interpretation that Compound A is an insertion molecule.

| Combination No. | Compound A | Compound B | Single inclusion* |
|---|---|---|---|
| 1 | decalin (trans) | perylene | X |
| 2 | decalin (trans) | triphenylene | X |
| 3 | decalin (trans) | coronene | X |
| 4 | pentane | pyrene | B |
| 5 | hexane | pyrene | B |
| 6 | 1,4-naphthoquinone | azulene | ○ |
| 7 | R-substituted 1,4-naphthoquinone (R = H, OMe, or OEt) | acenaphthylene | B |

-continued
| Combination No. | Compound A | Compound B | Single inclusion* |
|---|---|---|---|
| 8 | 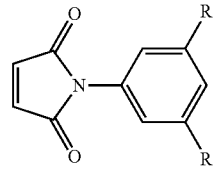<br>R = OMe or Me | 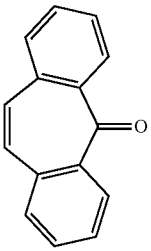 [SMILES: O=c1c2ccccc2ccc2ccccc12] | ○ |
| 9 | 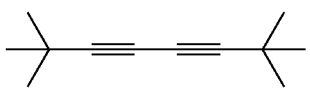 | 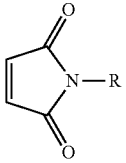 | A |
| 10 | 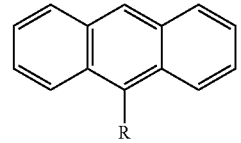<br>R = c-Hex or c-Hep | 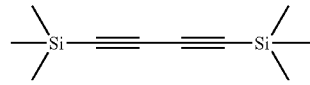<br>R =H, —CH$_2$OH, —CN, —CO$_2$H, —NO$_2$, or —CH=CH$_2$ | ○ |
| 11 | 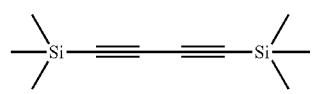 | Et$_3$P—M—PEt$_3$ with Cl, Cl<br>M = Pt | B |
| 12 | 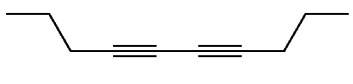 | Et$_3$P—M—PEt$_3$ with Cl, Cl<br>M = Pd | B |
| 13 | 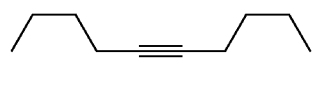 | Et$_3$P—M—PEt$_3$ with Cl, Cl<br>M = Pd or Pt | B |
| 14 | 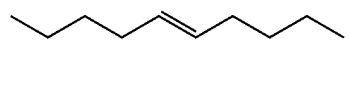 | Et$_3$P—M—PEt$_3$ with Cl, Cl<br>M = Pd or Pt | B |
| 15 | | Et$_3$P—M—PEt$_3$ with Cl, Cl<br>M = Pd or Pt | B |

-continued

| Combination No. | Compound A | Compound B | Single inclusion* |
|---|---|---|---|
| 16 | (n-nonane, straight chain alkane) | Et$_3$P—M(Cl)(Cl)—PEt$_3$; M = Pd or Pt | B |
| 17 | Br—(CH$_2$)$_8$—Br | Et$_3$P—M(Cl)(Cl)—PEt$_3$; M = Pd or Pt | ○ |
| 18 | N-cyclohexylmaleimide | triphenylene | A |
| 19 | N-cyclohexylmaleimide | pyrene | ○ |
| 20 | N-cyclohexylmaleimide | perylene | A |
| 21 | N-cyclohexylmaleimide | phenanthrene | ○ |
| 22 | N-cyclohexylmaleimide | fluoranthene-R; R = H or Me | A |
| 23 | N-cyclohexylmaleimide | benzo[a]acenaphthylene | A |

-continued

| Combination No. | Compound A | Compound B | Single inclusion* |
|---|---|---|---|
| 24 | N-cyclohexyl maleimide | cyclopenta-fused phenanthrene | A |
| 25 | N-cyclohexyl maleimide | naphthalene with R,R substituents; R = H, Me, Et, n-Pr, n-Bu, i-Bu, or nPen | ○ |
| 26 | N-cyclohexyl maleimide | 1,2,3,4-tetrahydroanthracene | ○ |
| 27 | N-cyclohexyl maleimide | naphtho[2,3-b][1,4]dioxine | ○ |
| 28 | (cyclopentadienyl)Mn(CO)₃ with R substituent; R = H or Me | 2,4,6-tri(pyridin-4-yl)-1,3,5-triazine | A |
| 29 | (methylcyclopentadienyl)Ir(cod) | triphenylene | A |
| 30 | (cyclopentadienyl)Rh(cod) | triphenylene | A |

-continued
| Combination No. | Compound A | Compound B | Single inclusion* |
|---|---|---|---|
| 31 |  | 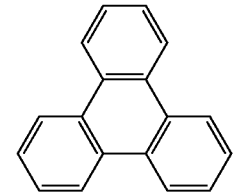 [SMILES: c1ccc2c(c1)c1ccccc1c1ccccc21] | A |
| 32 |  | 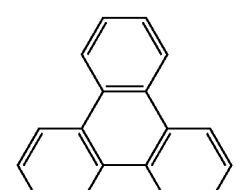 | A |
| 33 |  | 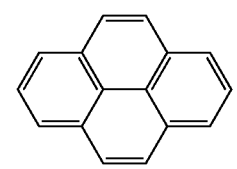 [SMILES: c1cc2ccc3cccc4ccc(c1)c2c34] | ○ |
| 34 |  | 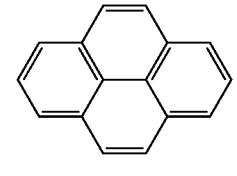 [SMILES: c1cc2ccc3cccc4ccc(c1)c2c34] | ○ |
| 35 |  | 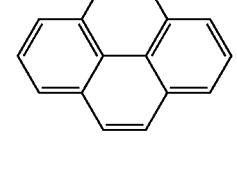 | ○ |
| 36 |  | 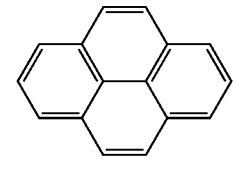 [SMILES: c1cc2ccc3cccc4ccc(c1)c2c34] | ○ |
| 37 | 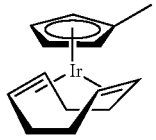 | 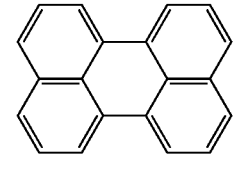 [SMILES: c1cc2cccc3c4cccc5cccc(c(c1)c23)c54] | A |
| 38 | 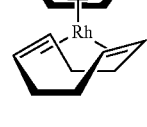 | 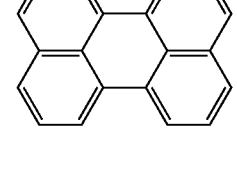 | A |

-continued

| Combination No. | Compound A | Compound B | Single inclusion* |
|---|---|---|---|
| 39 | | | A |
| 40 | | | A |
| 41 | | | X |
| 42 | | | X |
| 43 | | | ○ |
| 44 | | | A |
| 45 | | | A |

| Combination No. | Compound A | Compound B | Single inclusion* |
|---|---|---|---|
| 46 | hydrocortisone steroid structure | t-Bu−C≡C−C≡C−t-Bu | A |
| 47 | 20-hydroxy pregnane steroid structure | t-Bu−C≡C−C≡C−t-Bu | A |
| 48 | methyl cholate steroid structure | t-Bu−C≡C−C≡C−t-Bu | A |
| 49 | estradiol structure | $R_3P$—Au—Cl<br>R = Me, Et | A |
| 50 | hexafluorobenzene | perylene | A |
| 51 | hexafluorobenzene | triphenylene | A |

-continued

| Combination No. | Compound A | Compound B | Single inclusion* |
|---|---|---|---|
| 52 | 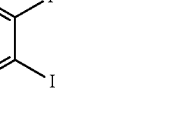 |  | A |
| 53 | 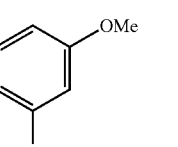 |  | ○ |
| 54 | 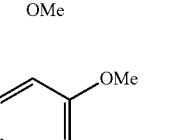 | 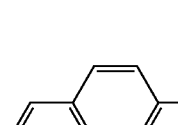 | ○ |
| 55 | 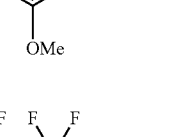 | 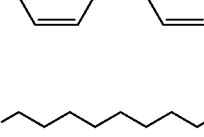 | ○ |
| 56 | 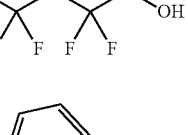 | 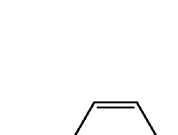 | A |
| 57 | 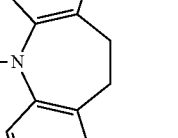 | 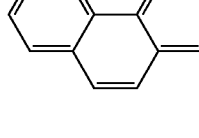 | A |

*Signs in the column Single inclusion have the following meanings.
A: When each of Compound A and Compound B was singly allowed to be included, Compound A was included and Compound B was not included.
B: When each of Compound A and Compound B was singly allowed to be included, Compound A was not included and Compound B was included.
○: When each of Compound A and Compound B was singly allowed to be included, both Compound A and Compound B were included.
X: When each of Compound A and Compound B was singly allowed to be included, neither Compound A nor Compound B was included.
Abbreviations: Me = methyl group,
Et = ethyl group,
n-Pr = n-propyl goup,
n-Bu = n-butyl group,
i-Bu = isobutyl group,
n-Pen = n-pentyl group,
c-Hex = cyclohexyl group,
c-Hep = cycloheptyl group Compounds A of Combination Nos. 44 to 49 belong to a compound group having a common backbone structure, and it is advantageous for any member of the compound group having the common backbone structure to be combined with an insertion molecule (Compound B) having a linear structure, and very similar inclusion conditions were applicable to the compound group.

For example, each of Compound B of Combination No. 1 (perylene) and Compound B of Combination No. 1 (triphenylene) are not included singly, but they were included in the metal complex through pair inclusion to alter the color of the solution (perylene: from pale yellow to orange, triphenylene: from pale yellow (the metal complex solution was pale yellow) to dense yellow), and thus pair inclusion was successfully confirmed in a simple manner. This is probably because the ambient environment of the compounds changed through the migration of the compounds from the solution to the inside of the metal complex, and similarly inclusion can be confirmed by observation of change in color when a compound having a long conjugated structure such as a polycondensed aromatic ring is used as an insertion molecule.

(X-Ray Crystal Structure Analysis)

Among the above examples, X-ray structural analysis was performed for Combination Nos. 12, 25 (using Compound B with R being Et), 26 (using Compound B with R being Me), 29, 41, 56, and 57, and actually the structure of each Compound A was successfully determined.

As described, even if a test molecule is not included singly, X-ray structural analysis can be applicable to such a test molecule through combining with an insertion molecule. If X-ray structural analysis for a test molecule used singly fails (e.g., the test molecule has a plurality of conformations in a metal complex), X-ray structural analysis can provide satisfactory results through combining with an insertion molecule.

It was demonstrated that structural determination is possible for some test molecules through inclusion and crystallization together with another molecule.

Example 10

Figure 27:
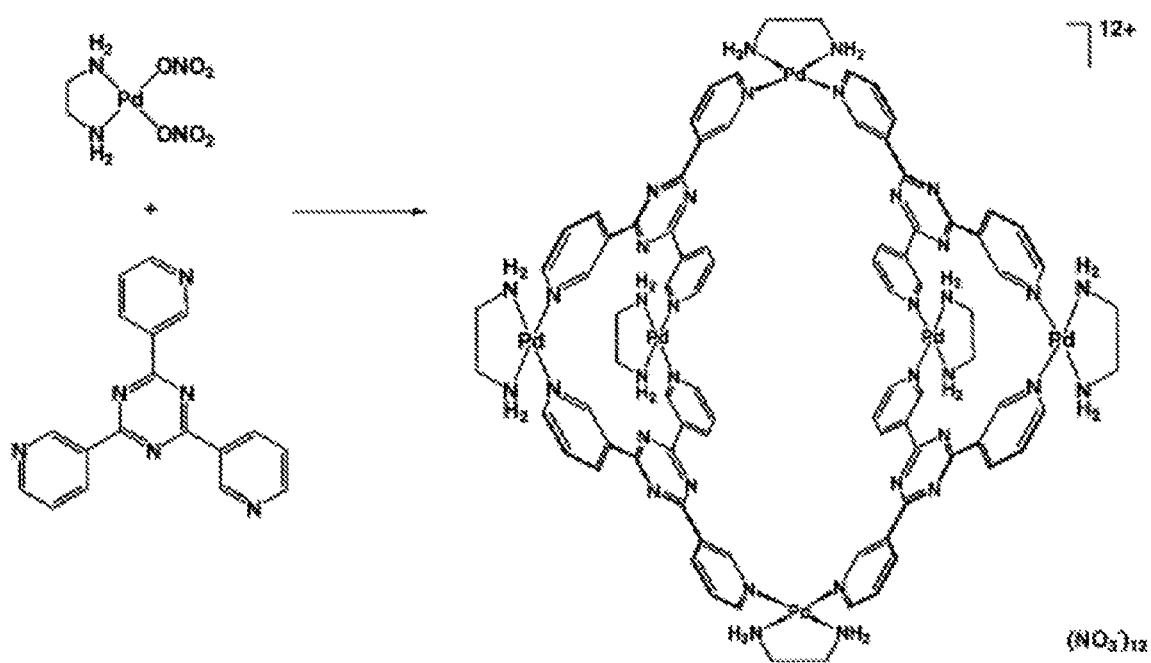
FIG. 27 shows a bowl-type metal complex [{(ethylenediamine)palladium}$_6$(2,4,6-tris(3-pyridyl)-1,3,5-triazine)$_4$].

Synthesis of Bowl-Type Metal Complex [{(ethylenediamine)palladium}$_6$(2,4,6-tris(3-pyridyl)-1,3,5-triazine)$_4$] as Shown in FIG. 27

To aqueous solution of (ethylenediamine)palladium dinitrate (0.15 mmol), 2,4,6-tris(3-pyridyl)-1,3,5-triazine (0.1 mmol) was added. The resulting mixture was heated at 70° C. for 0.5 hours to obtain clear colorless solution. This solution was evaporated to obtain a slightly yellow microcrystalline powder. Recrystallization from water-methanol mixed solvent provided a colorless microcrystal of the titled metal complex (yield: 81%)(see Angew. Chem. Int. Ed. 1998, 37, No. 15, 2082-2085).

Example 11

Synthesis of Triangular Pyramid-Type Metal Complex [{(ethylenediamine)palladium}$_8${1,3-bis(pyridin-3-yl)-5-(2-methylpyrimidin-5-yl)-benzene}$_4$])

To a suspension of (ethylenediamine)palladium dinitrate (6.2 mg, 21.3 μmol) and 1,3-bis(pyridin-3-yl)-5-(2-methylpyrimidin-5-yl)-benzene (2.8 mg, 7.9 μmol) in water (1.0 mL), an excessive amount of carbon tetrabromide (about 27 μmol) was added. The resulting mixture was stirred at ambient temperature for 24 hours. After filtration, the resulting clear solution was concentrated to obtain the titled metal complex (yield: 77%) (see CHEM. COMMUN., 2003, 1808-1809).

Synthesized in the same procedure was the open cone-type metal complex [{(ethylenediamine)palladium}$_8${1,3-bis(1-methoxy-1-methylethan-1-yl)-5-(pyrimidin-5-yl)-benzene}4].

In the same method as in Examples 2 and 3, structural analysis was attempted for the following two compounds with use of the thus-synthesized open cone-type metal complex in place of the octahedral metal complex.

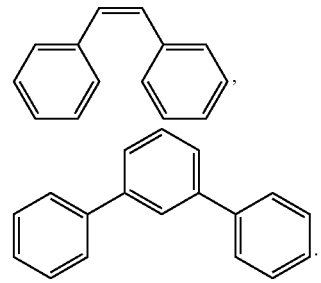

As a result, from each of the compounds, single crystals of an inclusion compound body including the compound were obtained, and X-ray structural analysis succeeded with the single crystals.

The method of the present invention was confirmed to be applicable even when a metal complex other than octahedral metal complexes is used.

Example 12

Figure 28:
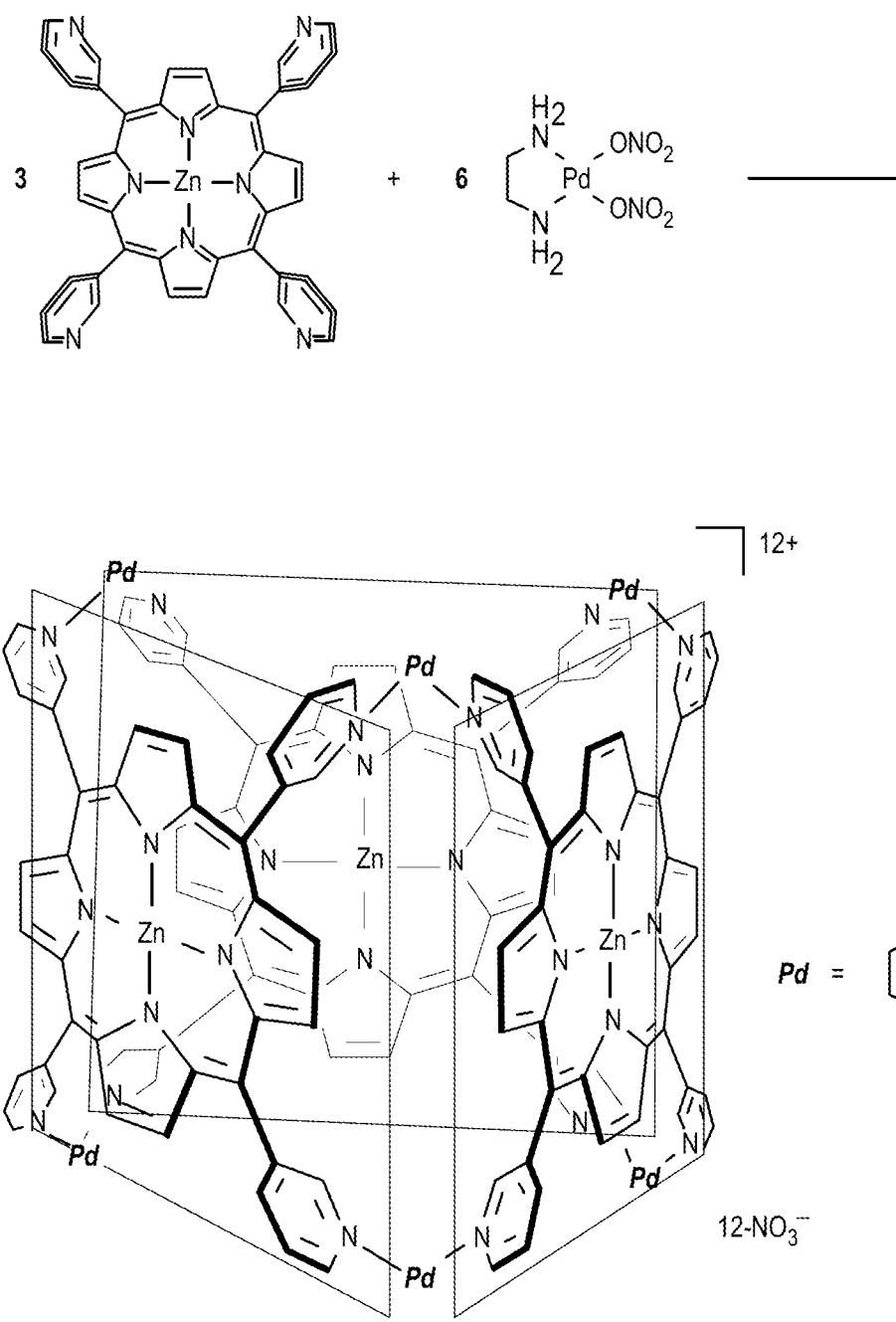
FIG. 28 shows a prism-type metal complex [{(ethylenediamine)palladium}$_6$(zinc 5,10,15,20-tetra(3-pyridyl)-21H, 23H-porphyrin)$_3$].

Synthesis of Prism-Type Metal Complex [{(ethylenediamine)palladium}$_6$(zinc 5,10,15,20-tetra(3-pyridyl)-21H,23H-porphyrin)$_3$] as Shown in FIG. 28

In a mixture of water and acetonitrile (1/1,324 mL), zinc 5,10,15,20-tetra(3-pyridyl)-21H,23H-porphyrin (1.10 g, 1.62 mmol) was treated with (ethylenediamine)palladium dinitrate (0.939 g, 3.23 mmol) at 80° C. for 24 hours. Acetone (2.5 L) was added to this purple solution, generating a precipitate of purple powder. This was separated through centrifugation, and dried under reduced pressure to obtain the titled metal complex ($3^{12+}$-$12NO_3^-$, 1.95 g, 0.515 mmol, 96%) (see Angew. Chem. Int. Ed. 2001, 40, 1718-1721).

When the thus-synthesized prism-type metal complex was applied to a peptide compound having the following structure:

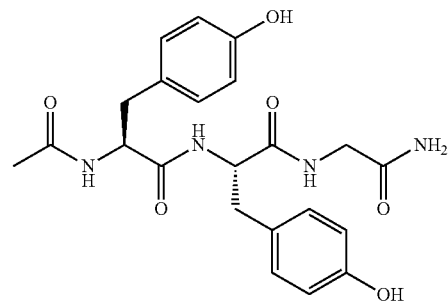 [SMILES: CC(=O)N[C@@H](Cc1ccc(O)cc1)C(=O)N[C@@H](Cc1ccc(O)cc1)C(=O)NCC(N)=O]

inclusion was confirmed, and single crystals were successfully obtained.

Example 13

Synthesis of Pillar-Type Metal Complex [{(ethylenediamine)palladium}₆(2,4,6-tris(4-pyridyl)-1,3,5-triazine)₂(2,2',6,6'-tetramethyl-4,4'-bipyridine)₃])

Added to aqueous solution (1.0 mL) of (ethylenediamine) palladium dinitrate (17.4 mg, 60.0 mmol) were 2,2',6,6'-tetramethyl-4,4'-bipyridine (6.4 mg, 30.0 mmol), 2,4,6-tris(4-pyridyl)-1,3,5-triazine (6.2 mg, 20.0 mmol), and coronene (18.0 mg, 60.0 mmol). This suspension mixture was then stirred at 100° C. for 2 hours. The deep red solution generated was filtered, and the filtrate was evaporated and dried with a freeze dryer under reduced pressure to obtain the titled metal complex (30.0 mg, 8.33 mmol) as a deep red solid with a yield of 83.3% (see Angew. Chem. 2005, 117, 1844-1847).

Example 14

Synthesis of Metal Complex [{(ethylenediamine)palladium}₆(ligand 14)₁] and metal complex [{(ethylenediamine)palladium}₁₂(ligand 14)₂])

The ligand 14 was synthesized in accordance with the following scheme:

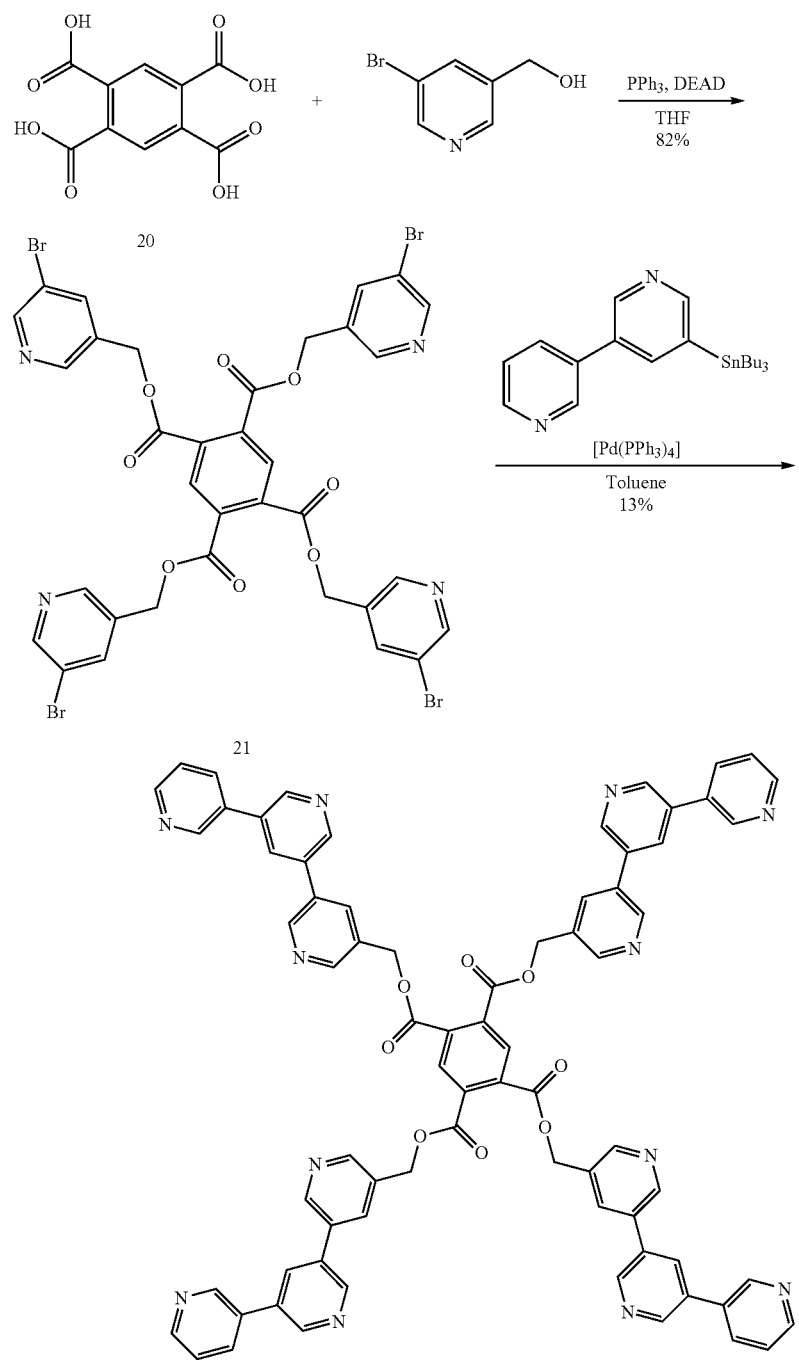

The tetracarboxylic acid 20 and 3-bromo-5-hydroxymethyl-pyridine were subjected to Mitsunobu esterification to obtain the precursor 21 (yield: 82%). Subsequently, this was treated with tributyltin bipyridine under Stille coupling conditions to obtain the ligand 22 (yield: 13%).

The ligand 22 (1.7 µmol) and (ethylenediamine)palladium dinitrate (10.2 µmol) were mixed together in water (0.8 mL). By heating 4,4'-dimethylbiphenyl (1.7 µmol) at 70° C. for 3 hours, the metal complex [{(ethylenediamine)palladium}$_6$ (ligand 14)$_1$] as a main product and the metal complex [{(ethylenediamine)palladium}$_{12}$(ligand 14)$_2$] as a byproduct were obtained (see Angew. Chem. Int. Ed. 2003, 42, 3267-3270).

Example 15

Synthesis of [M$_{12}$L$_4$] (Double Arm Ligand Dimer Nanotube-Type) Metal Complex)

Pd(PPh$_3$)$_4$ in dry toluene for 5 days to obtain the intended ligand 15 (yield 38%). See FIG. 29.

The ligand 15 (4.0 mg, 5.9 µmol) and (ethylenediamine) palladium dinitrate (5.2 mg, 17.7 µmol) were mixed together in H$_2$O—CH$_3$CN (1:1), and stirred at 70° C. for 2 hours. An anthracenecarboxylic acid derivative 30 was then added to the solution, and this mixture was stirred at 70° C. for 6 hours to obtain the titled metal complex (quantitative) (see J. Am. Chem. Soc. 2004, 126, 10818-10819).

Example 16

Synthesis of Nanotube-Type Metal Complex [{(ethylenediamine)palladium}$_{10}$ (3,3':5',3'':5'',3''':5''',3''''-quinquepyridine)$_4$])

In H$_2$O (1.5 mL), 3,3':5',3'':5'',3''':5''',3''''-quinquepyridine (0.04 mmol) and (ethylenediamine)palladium dinitrate (0.1

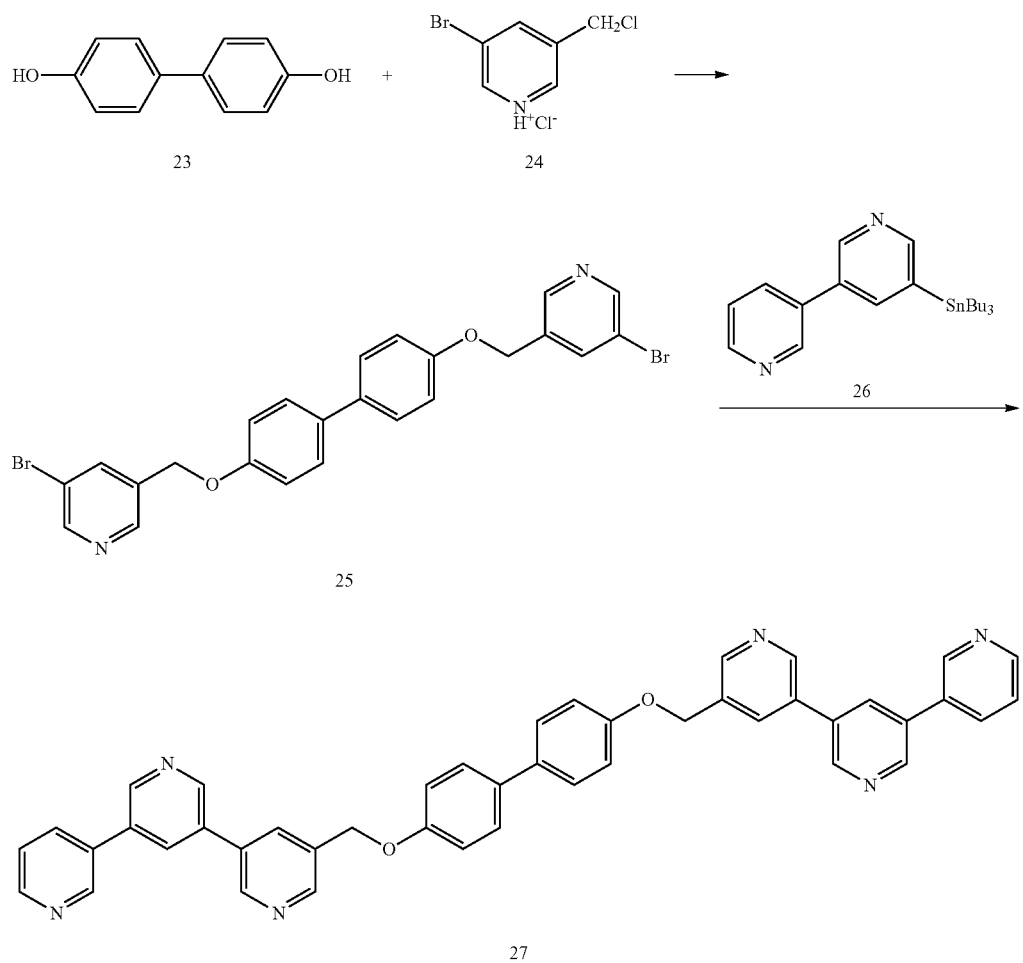

Under an argon atmosphere, 4,4'-biphenol and potassium carbonate were stirred in dry DMF at room temperature, and 3-bromo-5-chloromethylpyridine hydrochloride (Kauffmann, T.; Fischer, H. Chemische Berichte 1973, 106, 220) was then added thereto. The resultant was heated at 70° C. for 5 days to obtain 3,3'-[biphenyl-4,4'-diylbis(oxymethylene)]bis(5-bromopyridine) (yield: 62%). This was refluxed with 3,3'-[biphenyl-4,4'-diylbis(oxymethylene)]bis(5-bromopyridine), 3-tributylstannyl-5,3'-bipyridine and mmol) were mixed together, and stirred at 70° C. for 5 hours. To this solution, aqueous solution (0.5 mL) of sodium 4,4'-biphenyldicarboxylate (0.01 mmol) was added, and the resulting mixture was stirred at 70° C. for 9 hours. After filtration, acetone (10 mL) was added to the filtrate to precipitate a colorless solid. This colorless solid was collected, and dried under reduced pressure to obtain the intended metal complex (yield: 81%) (see J. Am. Chem. Soc. 1999, 121, 7457-7458).

Example 17

Figure 30:
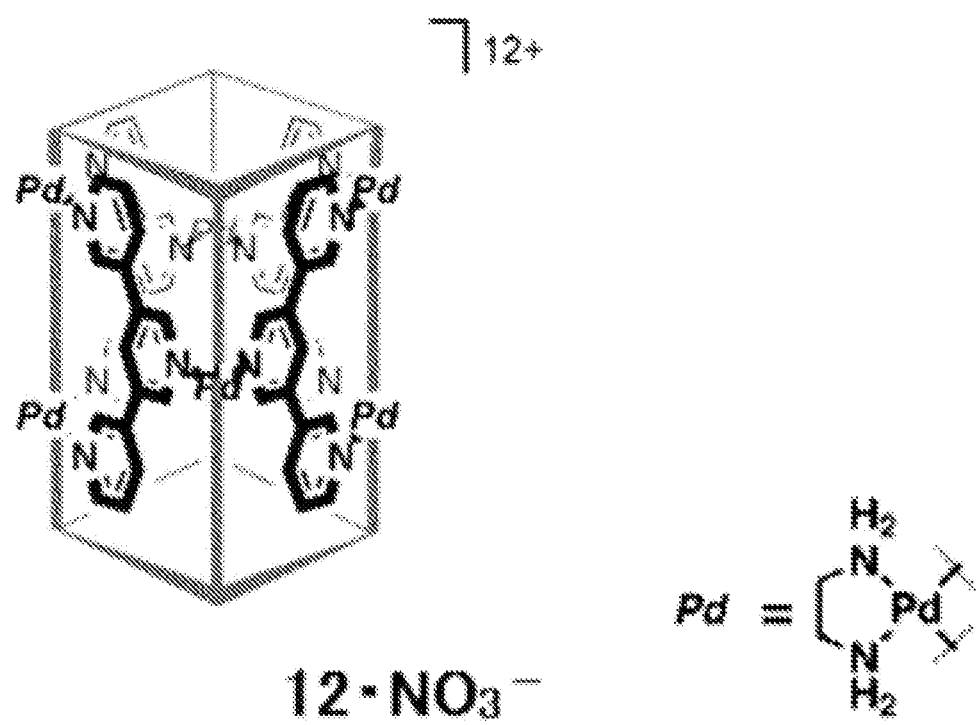
FIG. 30 shows a nanotube-type metal complex [{(ethylenediamine)palladium}$_6$(3,3':5',3''-terpyridine)$_4$].

Synthesis of Nanotube-Type Metal Complex [{(ethylenediamine)palladium}$_6$(3,3':5',3''-terpyridine)$_4$] as Shown in FIG. 30

In water, 3,3':5',3''-terpyridine, (ethylenediamine)palladium dinitrate, and sodium 4,4'-biphenyldicarboxylate were reacted at a mole ratio of 4:6:1 to obtain a 4,4'-biphenyldicarboxylic acid-including metal complex (see J. Am. Chem. Soc., Vol. 121, No. 32, 1999).

Example 18

Figure 31:
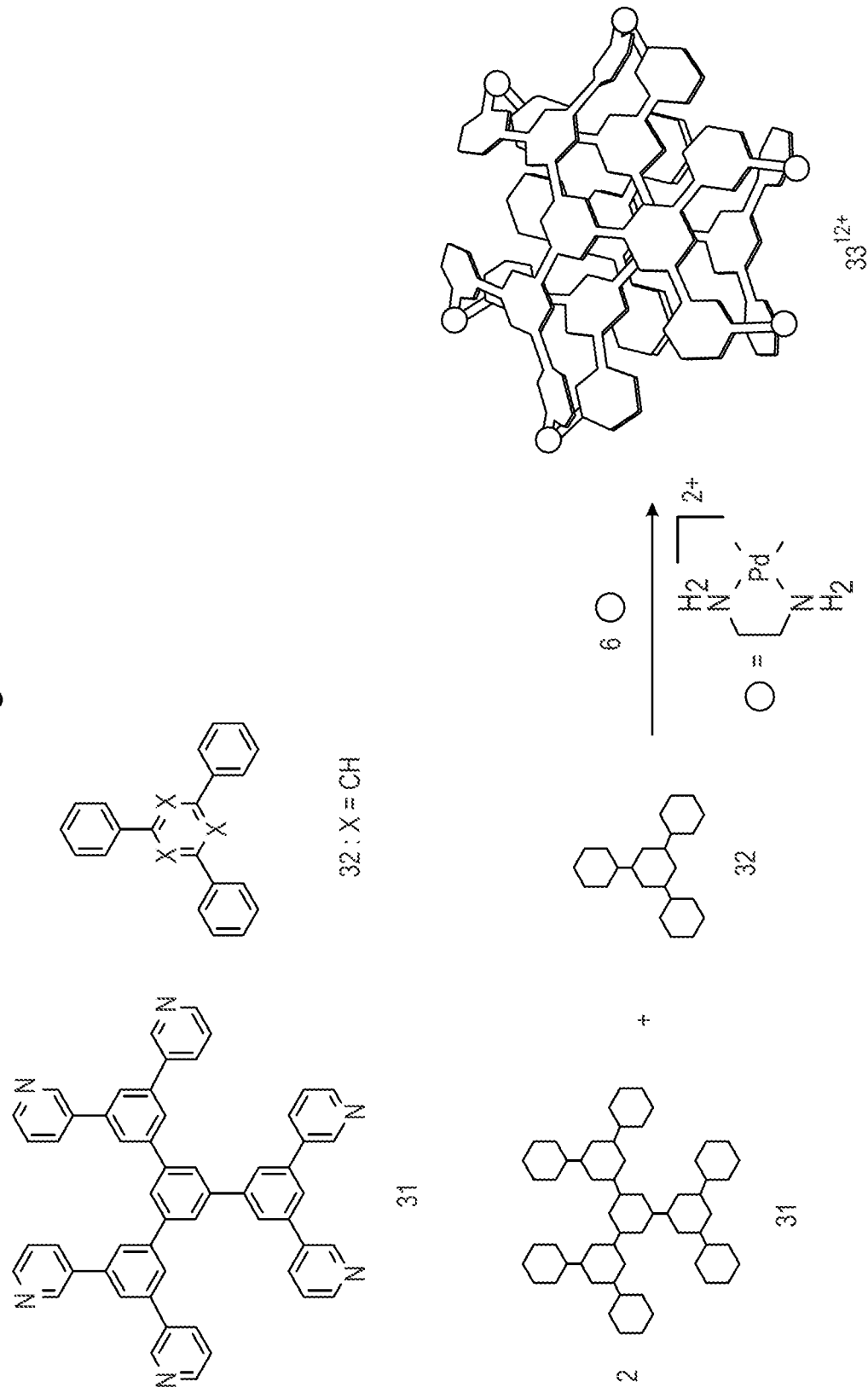
FIG. 31 shows a sandwich-type metal complex [{(ethylenediamine)palladium}$_6$(1,3,5-tris[3,5-di(pyridin-3-yl)phenyl]benzene)$_2$].

Synthesis of Sandwich-Type Metal Complex [{(ethylenediamine)palladium}$_6$(1,3,5-tris[3,5-di(pyridin-3-yl)phenyl]benzene)$_2$] as Shown in FIG. 31

An excessive amount of 1,3,5-triphenylbenzene was treated with 1,3,5-tris[3,5-di(pyridin-3-yl)phenyl]benzene (3.5 μmol) and (ethylenediamine)palladium dinitrate (15 μmol) in water-acetonitrile (2:1, 0.7 mL) at 60° C. for 2 hours. The residual 1,3,5-triphenylbenzene was then removed through filtration to obtain a solution of the titled metal complex (this is including 1,3,5-triphenylbenzene). Into this aqueous solution, tetrahydrofuran was gradually dispersed to obtain a 1,3,5-triphenylbenzene-including metal complex as a single crystal (see Angew. Chem. Int. Ed. 2004, 43, 5936-5940).

Example 19

Figure 32:
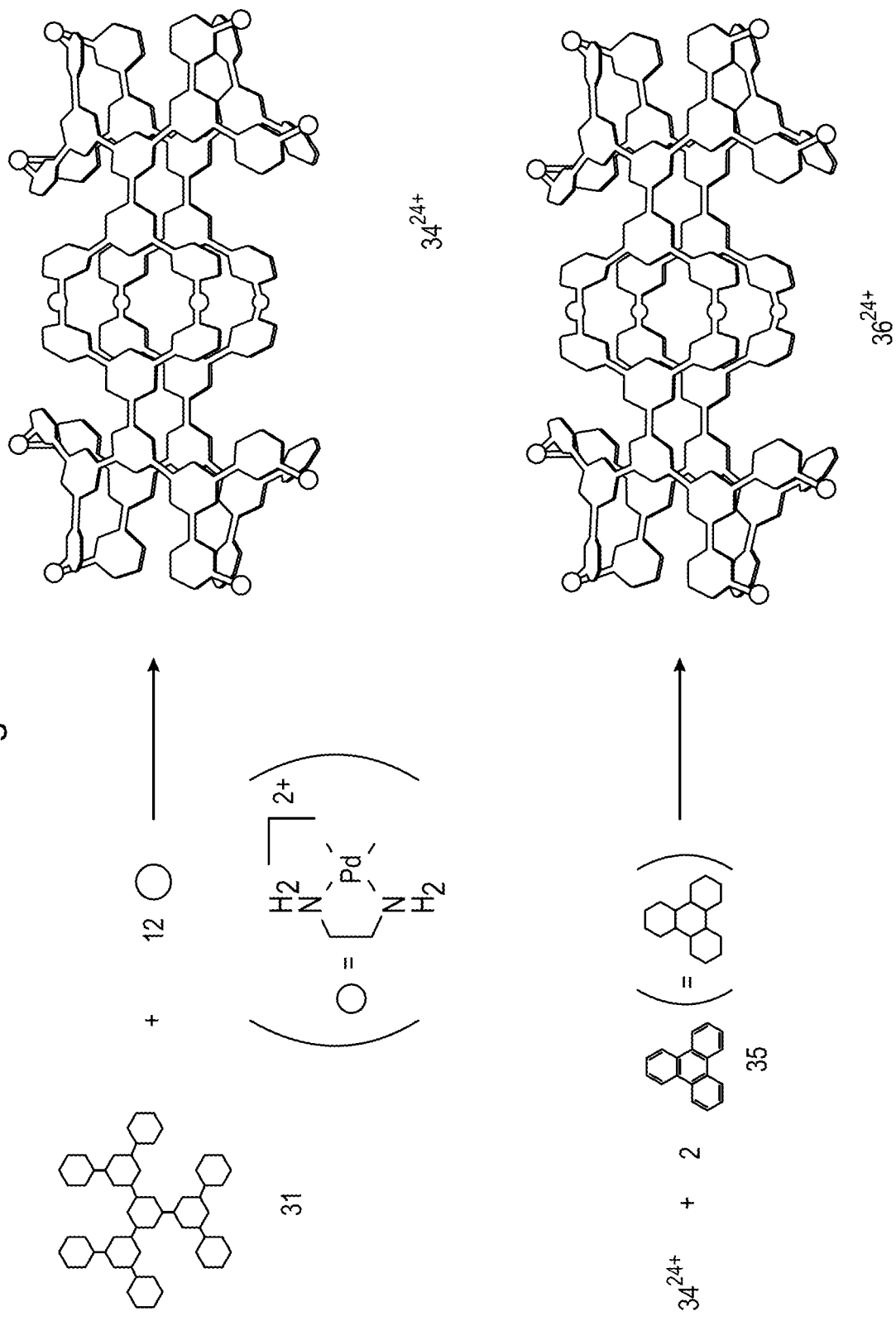
FIG. 32 shows a sandwich dimer-type metal complex [{(ethylenediamine)palladium}$_{12}$(1,3,5-tris[3,5-di(pyridin-3-yl)phenyl]benzene)$_4$].

Synthesis of sandwich dimer-type metal complex [{(ethylenediamine)palladium}$_{12}$(1,3,5-tris[3,5-di(pyridin-3-yl)phenyl]benzene)$_4$] as shown in FIG. 32

Mixed together were 1,3,5-tris[3,5-di(pyridin-3-yl)phenyl]benzene and (ethylenediamine)palladium dinitrate at a mole ratio of 1:3 to obtain a solution of the titled metal complex 4. Triphenylene was then added to this solution and the solution was treated at 60° C. for 2 hours to obtain the titled triphenylene-including metal complex ([(5)$_2$⊂4]$^{24+}$) (this is including two molecules of triphenylene per molecule of the metal complex) (see Angew. Chem. Int. Ed. 2004, 43, 5936-5940).

The invention claimed is:

1. A method for a structural analysis of a test molecule with an X-ray or a neutron beam, the method comprising the steps of:
   (A) mixing together a sample containing the test molecule and a metal complex capable of including the test molecule to generate a test molecule-metal complex inclusion body;
   (B) dispensing an inclusion solution containing the test molecule-metal complex inclusion body to prepare a plurality of independent crystallization solutions at least including a first crystallization solution and a second crystallization solution;
   (C) generating a plurality of crystals of the test molecule-metal complex inclusion body in the plurality of independent crystallization solutions under similar or different crystallization conditions;
   (D) screening the plurality of crystals of the test molecule-metal complex inclusion body generated in the step (C) to select a targeted crystal;
   (E) irradiating the targeted crystal with an X-ray or a neutron beam to acquire diffraction data; and
   (F) analyzing the diffraction data to determine a structure of the test molecule.

2. The method according to claim 1, wherein volumes of the first crystallization solution and the second crystallization solution are each 100 nL to 10 μL.

3. The method according to claim 1, wherein volumes of the first crystallization solution and the second crystallization solution are each 200 nL to 2 μL.

4. The method according to claim 1, wherein a weight of the test molecule contained in the sample in the step (A) is 1 ng to 1 mg.

5. The method according to claim 4, wherein the weight of the test molecule contained in the sample in the step (A) is 5 ng to 1 mg.

6. The method according to claim 1, wherein the step (A) comprises mixing the sample containing the test molecule, an insertion molecule, and a metal complex capable of including the test molecule together to generate a test molecule/insertion molecule-metal complex inclusion body.

7. The method according to claim 6, wherein the step (A) further comprises using a change in a color of a solution containing a mixture of the test molecule, the insertion molecule, and the metal complex as an index of a generation of the test molecule/insertion molecule-metal complex inclusion body.

8. The method according to claim 1, wherein the step (C) is automatically performed.

9. The method according to claim 1, further comprising the step of contacting a metal molecule with a ligand to prepare the metal complex.

10. The method according to claim 1, further comprising adjusting an evaporation rate of the plurality of independent crystallization solutions in the step (B).

11. The method according to claim 10, wherein the adjusting is performed through a vapor transport method.

12. The method according to claim 1, wherein the metal complex has a hydrophilic moiety.

13. The method according to claim 1, wherein the test molecule has a hydrophilic moiety.

14. The method according to claim 1, wherein a solvent of each of the plurality of independent crystallization solutions is an aqueous solvent.

15. The method according to claim 1, wherein at least a partial structure of a structure of the test molecule is unknown or uncertain, and at least a partial structure in the at least partial structure of the structure of the test molecule is determined.

16. A method for using a kit for a structural analysis of a test molecule with an X-ray or a neutron beam, comprising:
   providing the kit comprising:
     a metal complex capable of including the test molecule; and
     a crystallization solvent; and
   carrying out steps for the structural analysis of the test molecule with the X-ray or the neutron beam, the steps for the structural analysis comprising:
   (A) mixing together a sample containing the test molecule, the metal complex capable of including the test molecule, and the crystallization solvent to generate a test molecule-metal complex inclusion body;
   (B) dispensing an inclusion solution containing the test molecule-metal complex inclusion body to prepare a plurality of independent crystallization solutions at least including a first crystallization solution and a second crystallization solution;

(C) generating a plurality of crystals of the test molecule-metal complex inclusion body in the plurality of independent crystallization solutions under similar or different crystallization conditions;

(D) screening the plurality of crystals of the test molecule-metal complex inclusion body generated in the step (C) to select a targeted crystal;

(E) irradiating the targeted crystal with an X-ray or a neutron beam to acquire diffraction data; and (F) analyzing the diffraction data to determine a structure of the test molecule.

17. A kit for a structural analysis of a test molecule with an X-ray or a neutron beam, the kit comprising:
    a metal complex capable of including the test molecule,
    a crystallization solvent used to crystallize the metal complex including the test molecule, and
    at least one insertion molecule.

18. The kit according to claim 17, further comprising at least two insertion molecules.

19. A kit for a structural analysis of a test molecule with an X-ray or a neutron beam, the kit comprising:
    a metal complex capable of including the test molecule, and
    at least two crystallization solvents used to crystallize the metal complex including the test molecule,
    the first crystallization solvent containing the metal complex dissolved therein, and the second crystallization solvent containing the metal complex in concentration different from that in the first crystallization solvent.

20. A kit for a structural analysis of a test molecule with an X-ray or a neutron beam, the kit comprising:
    at least two metal complexes capable of including the test molecule,
    wherein each of the at least two metal complexes has a hydrophilic moiety, and
    a crystallization solvent used to crystallize the at least two metal complexes including the test molecule.

* * * * *